US012245427B2

(12) United States Patent
Lee et al.

(10) Patent No.: US 12,245,427 B2
(45) Date of Patent: Mar. 4, 2025

(54) SEMICONDUCTOR DEVICE AND METHOD FOR FABRICATING THE SAME

(71) Applicant: SK hynix Inc., Gyeonggi-do (KR)

(72) Inventors: Kun Young Lee, Gyeonggi-do (KR); Nam Kuk Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 498 days.

(21) Appl. No.: 17/362,152

(22) Filed: Jun. 29, 2021

(65) Prior Publication Data
US 2022/0216230 A1    Jul. 7, 2022

(30) Foreign Application Priority Data
Jan. 5, 2021  (KR) .................. 10-2021-0000902

(51) Int. Cl.
*H10B 43/27* (2023.01)
*H01L 27/105* (2023.01)
*H10B 12/00* (2023.01)
*H10B 41/10* (2023.01)
*H10B 41/27* (2023.01)
*H10B 41/35* (2023.01)
*H10B 41/40* (2023.01)
*H10B 43/10* (2023.01)
*H10B 43/35* (2023.01)
*H10B 43/40* (2023.01)
*H10B 43/50* (2023.01)

(52) U.S. Cl.
CPC ............ *H10B 43/27* (2023.02); *H10B 12/03* (2023.02); *H10B 12/30* (2023.02); *H10B 12/50* (2023.02); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 43/27; H10B 12/03; H10B 12/30; H10B 12/50; H10B 41/10; H10B 41/27; H10B 41/35; H10B 41/40; H10B 43/10; H10B 43/35; H10B 43/40; H10B 43/50; H10B 12/033; H10B 12/09; H10B 12/02; H01L 27/105; H01L 28/40
See application file for complete search history.

(56) References Cited

U.S. PATENT DOCUMENTS

| 7,737,480 | B2 * | 6/2010 | Nakagawa | ........... H10B 12/485 257/296 |
| 10,629,675 | B1 | 4/2020 | Nishikawa et al. | |
| 2020/0082886 | A1 * | 3/2020 | Huo | ................ H01L 29/42384 |
| 2020/0091185 | A1 * | 3/2020 | Baek | ...................... H10B 43/50 |
| 2022/0149068 | A1 * | 5/2022 | Liu | ........................ H10B 43/35 |
| 2022/0157824 | A1 * | 5/2022 | Lu | ....................... H10B 12/0335 |

* cited by examiner

*Primary Examiner* — Benjamin Tzu-Hung Liu
*Assistant Examiner* — Akhee Sarker-Nag
(74) *Attorney, Agent, or Firm* — IP & T GROUP LLP

(57) ABSTRACT

Embodiments of the present invention provide a hybrid memory and a hybrid memory manufacturing method including both a volatile memory and a nonvolatile memory on a single substrate so as to increase an operation speed of a semiconductor device and reduce manufacturing cost. A hybrid memory includes: a substrate; a non-volatile memory including an alternating stack in which a plurality of insulation layers and a plurality of horizontal word lines are alternately stacked on the substrate; and a volatile memory including a capacitor, the capacitor penetrating through the alternating stack.

27 Claims, 45 Drawing Sheets

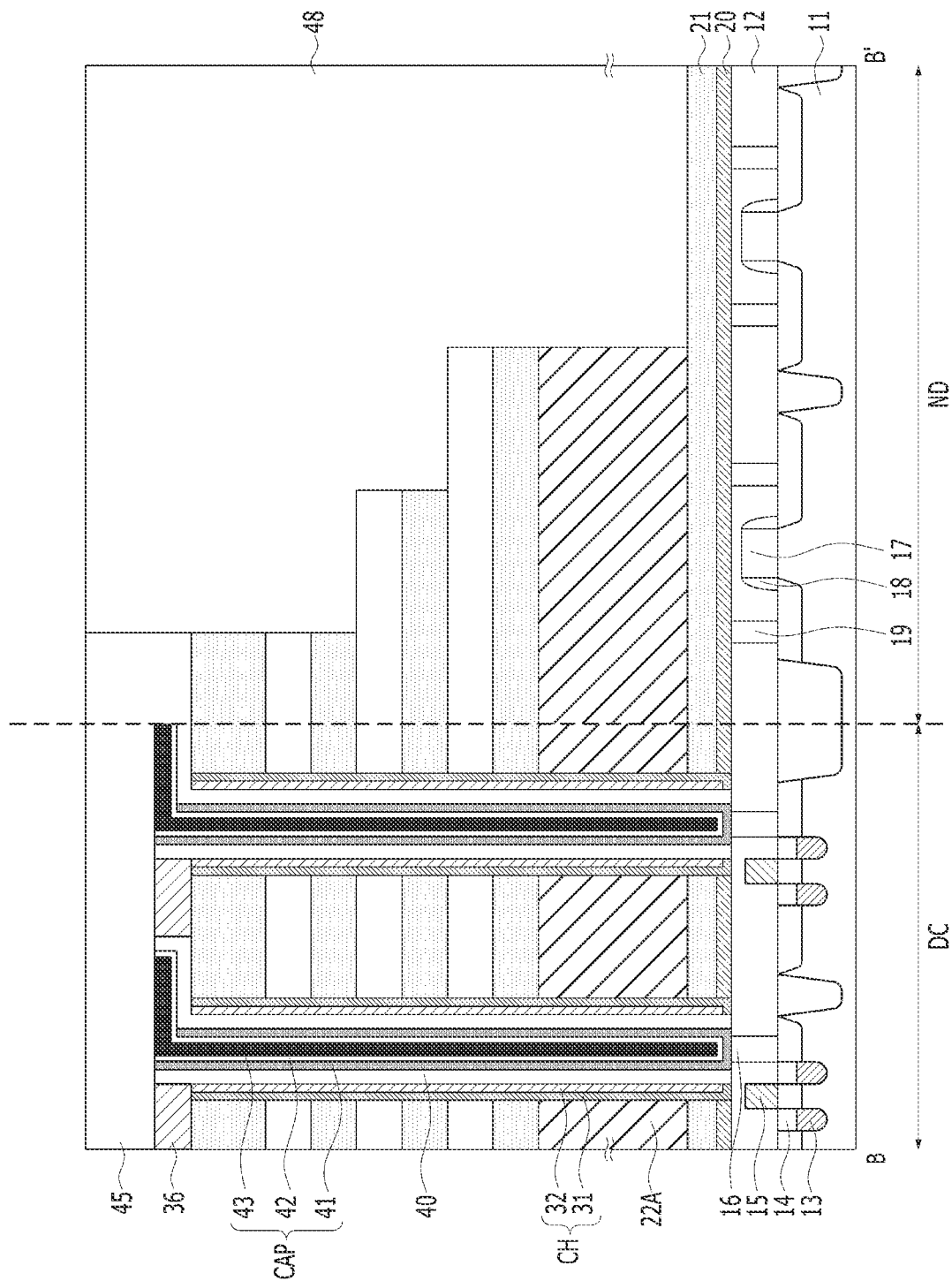

SEMICONDUCTOR DEVICE AND METHOD FOR FABRICATING THE SAME

CROSS-REFERENCE TO RELATED APPLICATIONS

The present application claims priority to Korean Patent Application No. 10-2021-0000902, filed on Jan. 5, 2021, which is incorporated herein by reference in its entirety.

TECHNICAL FIELD

This present disclosure relates to a semiconductor device and methods for fabricating the same and, more particularly, to a semiconductor device including a capacitor and methods for fabricating the same.

BACKGROUND

Generally, a volatile memory and a non-volatile memory have been manufactured separately, however a technique of simultaneously forming a volatile memory and a non-volatile memory on a substrate has been proposed in order to increase an operating speed of a semiconductor device and reduce a manufacturing cost.

SUMMARY

Various embodiments of the present invention provide a hybrid memory including both a volatile memory and a non-volatile memory on a single substrate and methods for fabricating the same so as to increase an operating speed of a semiconductor device and reduce manufacturing cost.

In accordance with an embodiment, a hybrid memory includes a substrate, a non-volatile memory including an alternating stack in which a plurality of insulation layers and a plurality of horizontal word lines are alternately stacked over the substrate, and a volatile memory including a capacitor, the capacitor penetrating through the alternating stack.

In accordance with another embodiment of the present invention, a hybrid memory includes a substrate including a cell region and a peripheral circuit region, a NAND memory cell string including a plurality of horizontal word lines arranged vertically over the substrate in the cell region and a vertical channel structure penetrating through the plurality of horizontal word lines, and a DRAM memory cell including a capacitor penetrating through an inside of the vertical channel structure.

In accordance with embodiment of the present invention, a method for fabricating a hybrid memory includes forming an alternating stack including a plurality of oxide layers and a plurality of nitride layers alternately stacked on a substrate including a lower structure, forming an opening penetrating through the alternating stack to expose the substrate by, forming a channel structure surrounding an inner-sidewall of the opening, and forming a capacitor surrounded by the channel structure.

According to embodiments of the present invention, cost for fabricating a semiconductor device may be reduced by forming a volatile memory device and a non-volatile memory device on a single substrate.

According to embodiments of the present invention, an operating speed of a semiconductor device may be increased by forming a volatile memory device and a non-volatile memory device on a single substrate.

According to embodiments of the present invention, a sensing margin of a semiconductor device may be secured by providing a capacitor having a high aspect ratio.

BRIEF DESCRIPTION OF THE DRAWINGS

FIGS. 4 to 9, FIGS. 10A to 10G, FIGS. 11 to 20, FIGS. 21A to 31A, and FIGS. 21B to 31B are diagrams illustrating a method for fabricating a semiconductor device according to an embodiment of the present invention.

DETAILED DESCRIPTION

Figure 1:
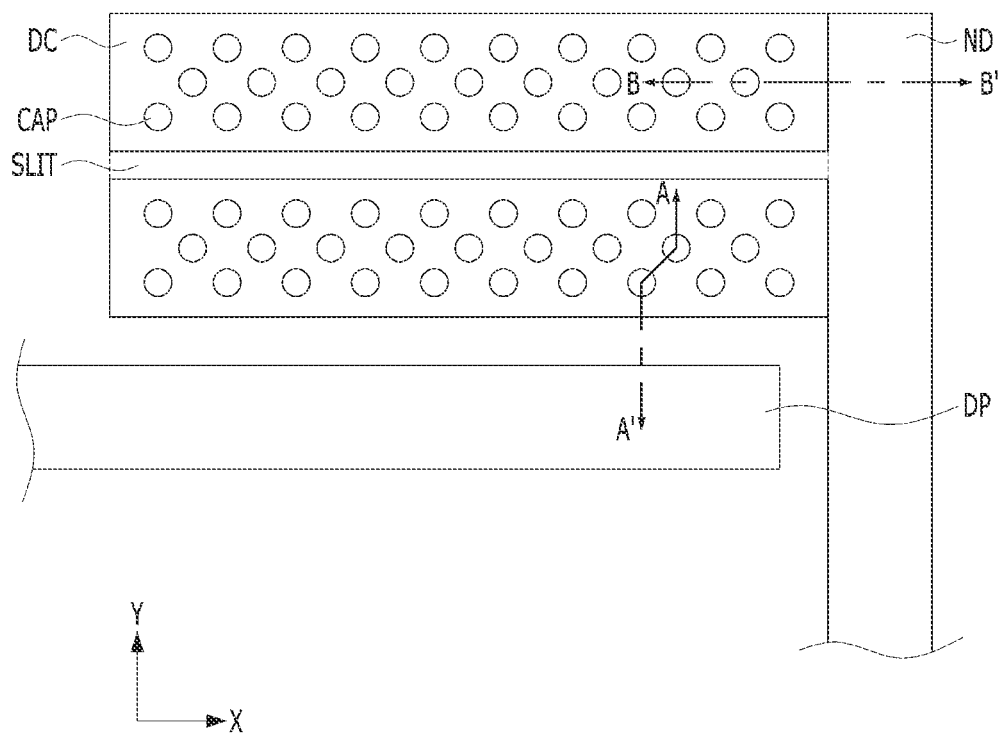
FIG. 1 is a layout illustrating a semiconductor device according to an embodiment of the present invention.

Various embodiments described herein will be described with reference to cross-sectional views, plane views and block diagrams, which are ideal schematic views of the present invention. Thus, the structures of the drawings may be modified by fabricating techniques and/or tolerances. Accordingly, the embodiments of the present invention are not limited to the specific structures shown in the drawings, but include any changes in the structures that may be produced according to the fabricating process. Accordingly, the regions illustrated in the drawings have schematic properties and the regions and the shapes of the regions illustrated in the drawings are intended to illustrate specific structures of regions of the elements, and are not is intended to limit the scope of the invention. The thickness and spacing of the drawings are expressed for convenience of description, and may be exaggerated compared to the actual physical thickness. In the description of the present invention, known configurations may be omitted. Same elements may have the same reference numerals even if they are indicated in different drawings.

Hereinafter, various embodiments of the present invention may be described in detail with reference to drawings. For convenience, description is based on a DRAM, but the present invention is not limited thereto, and may be applicable to other memories or semiconductor devices, Various embodiments described below provide a hybrid memory, i.e., a memory in which a non-volatile memory and a volatile memory are integrated on a single substrate.

Figure 2A:
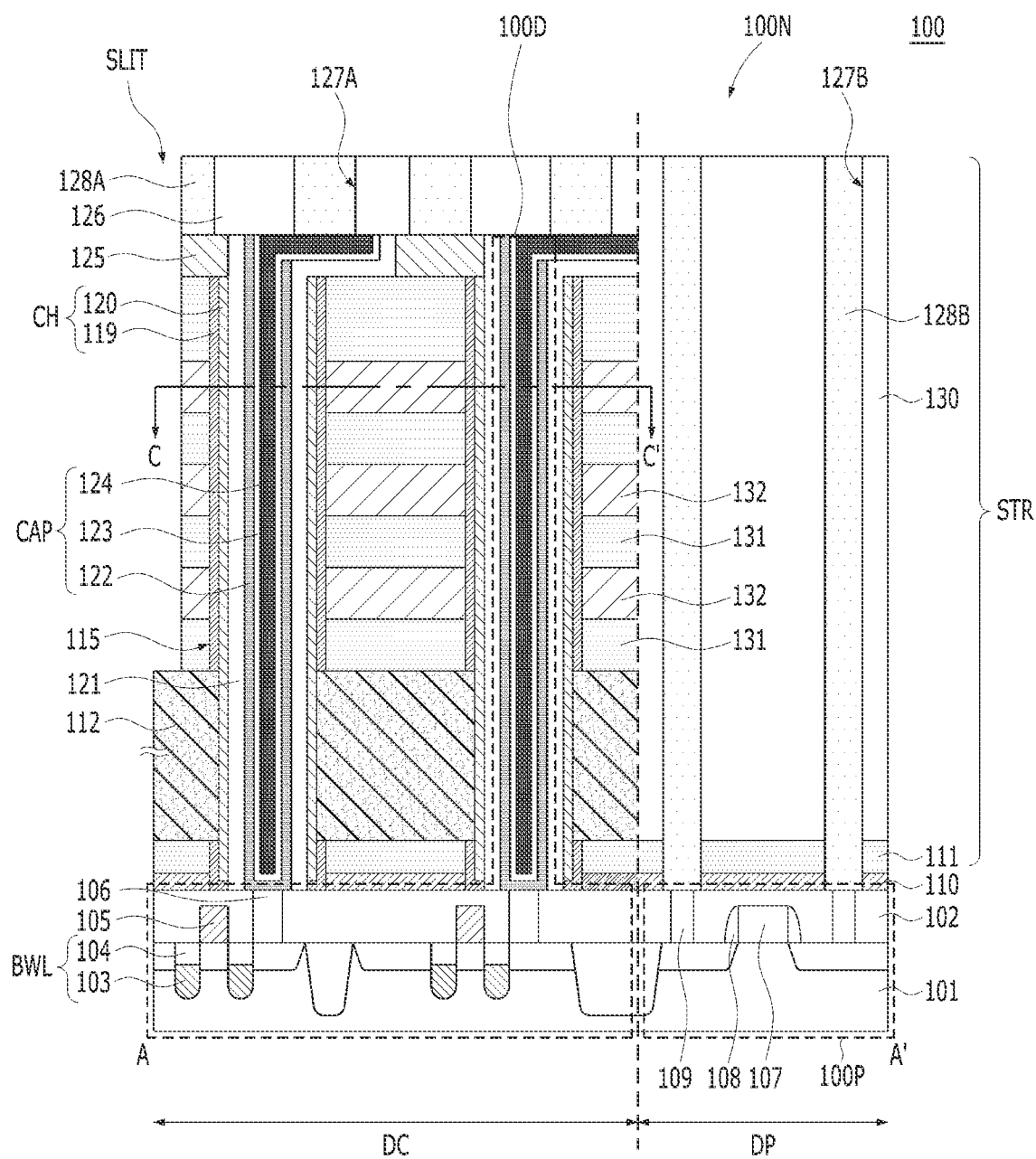
FIGS. 2A and 2B are cross-sectional views illustrating a semiconductor device according to an embodiment of the present invention.
Figure 2B:
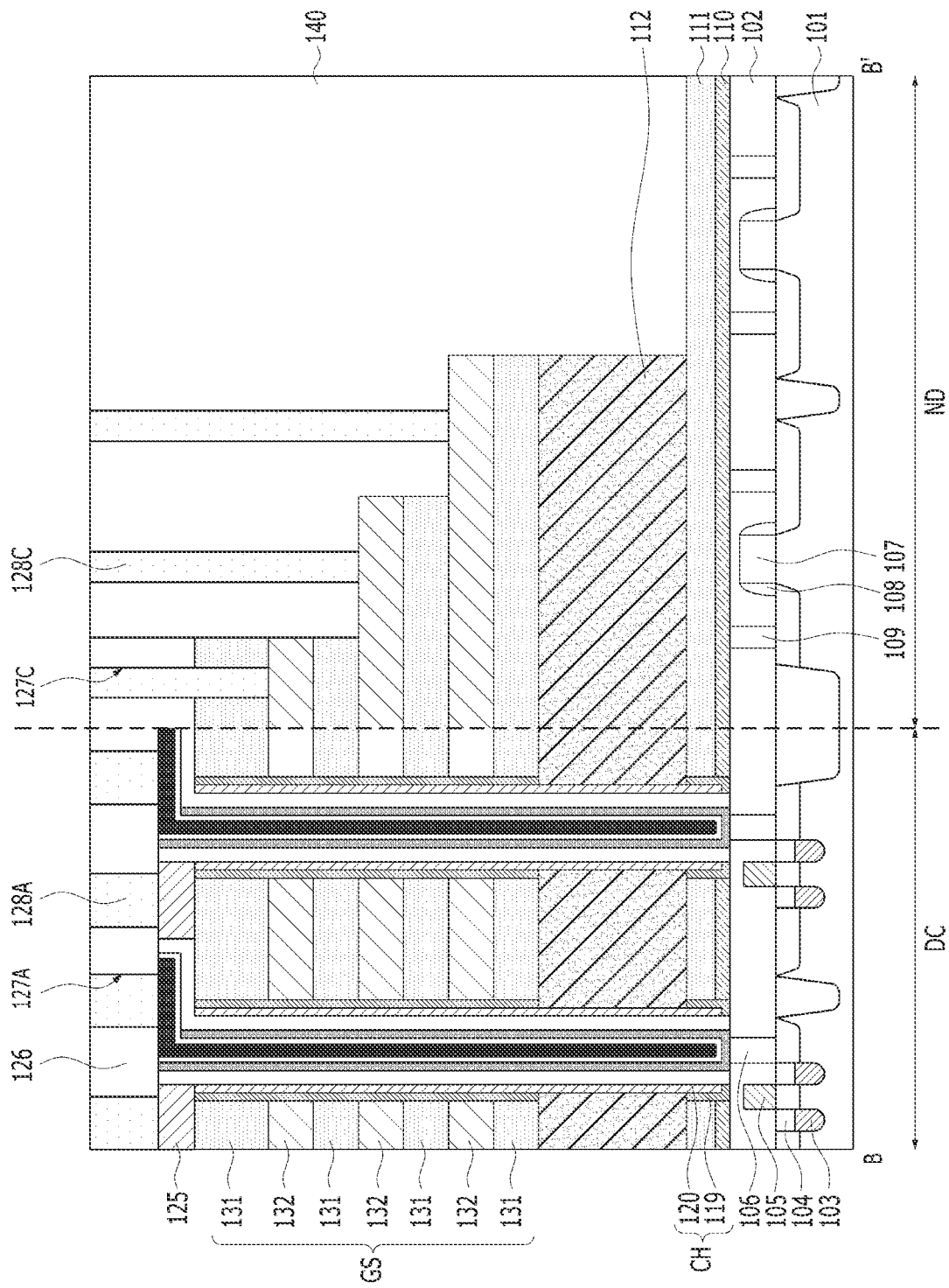
Figure 3:
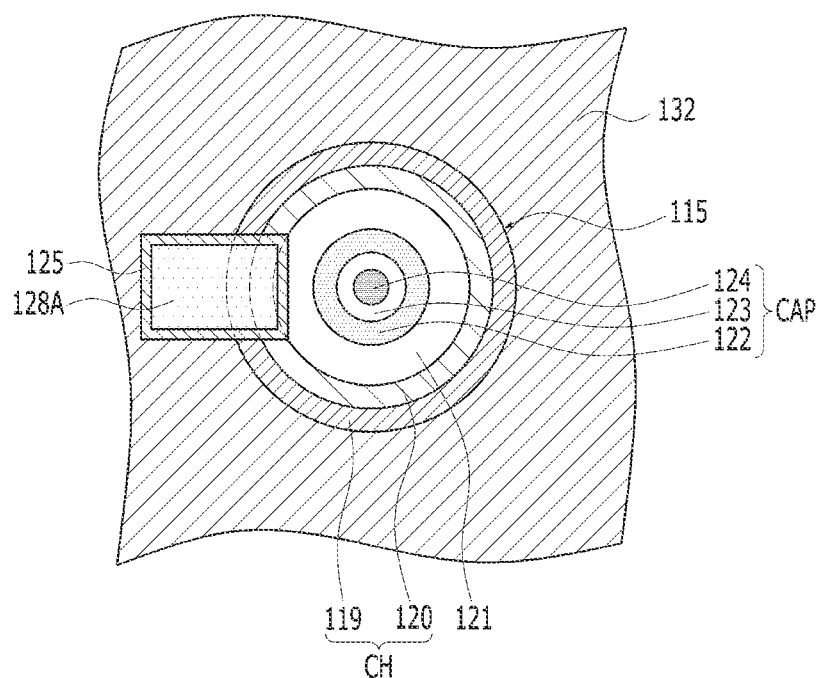
FIG. 3 is a top-view illustrating a semiconductor device according to an embodiment of the present invention.

FIGS. 1 to 3 are diagrams illustrating a semiconductor device 100 according to an embodiment of the present invention. The semiconductor device 100 may be referred as a "hybrid memory."

FIG. 1 is a layout illustrating the semiconductor device 100 according to an embodiment of the present invention. As illustrated in FIG. 1, the semiconductor device 100 may include a cell region DC, a peripheral circuit region DP, and a deck region ND. Although FIG. 1 illustrates only one cell region DC, the present invention is not limited thereto. The present invention may include a plurality of cell regions DC, a plurality of peripheral circuit regions DP, and a plurality of deck regions ND. The cell region DC may include an insulation layer for separating capacitors CAP from each other, and a slit SLIT for electrically/structurally separating each of word lines (not shown) disposed on a lower portion of the capacitor CAP. The cell region DC may further include an alternating stack in which a plurality of slits SLIT and a plurality of insulation layers are alternately arranged.

The peripheral circuit region DP may be formed to be spaced apart from the cell region DC. The peripheral circuit region DP may extend in the X direction while not contacting the cell region DC. The deck region ND may be formed to be continuous with the cell region DC. The deck region ND may extend in the Y direction while directly contacting the cell region DC. The peripheral circuit region DP may include a first control circuit having a decoder and a page buffer for controlling a non-volatile memory 100N shown in FIG. 2A. The peripheral circuit region DP may include a second control circuit having a sense amplifier, a sub word line driver, and a sub hole circuit for controlling the volatile memory 100D and 100P shown in FIG. 2A. The sense amplifier and the sub-hole circuit may be disposed below the slit SLIT and the sub word line driver may disposed below the alternating stack.

FIGS. 2A and 2B are cross-sectional views illustrating the semiconductor device 100 according to an embodiment of the present invention, FIG. 2A is a cross-sectional view taken along line A-A' shown in FIG. 1. FIG. 2B is a cross-sectional view taken along line B-B' shown in FIG. 1.

As illustrated in FIG. 2A, the semiconductor device 100 may include the non-volatile memory 100N and the volatile memories 100D and 100P. The non-volatile memory 100N may include a NAND and the volatile memories 100D and 100P may include a DRAM. The non-volatile memory 100N may include a NAND memory cell string STR. The volatile memories 100D and 100P may include a DRAM memory cell 100D and a DRAM peripheral circuit 100P. The semiconductor device 100 may include a structure in which the NAND memory cell string STR and the DRAM memory cell 100D are integrated on a single substrate. For example, the semiconductor device 100 may include a structure in which the DRAM memory cell 100D is embedded inside the NAND memory cell string STR.

The DRAM memory cell 100D may include a buried word line structure BWL, a bit line structure 105, and a capacitor CAP. The non-volatile memory 100N may include a plurality of horizontal word lines 132, a channel structure CH, and a source layer 112, The NAND memory cell string STR may include the plurality of horizontal word lines 132 vertically arranged over the substrate 101 in the cell region DC and the channel structure CH penetrating through the plurality of horizontal word lines 132.

First, a substrate 101 may be prepared. The substrate 101 may include the cell region DC and the peripheral circuit region DP. The peripheral circuit region DP may include a peripheral circuit of the non-volatile memory 100N and a peripheral circuit of the volatile memories 100D and 100P The peripheral circuit region DP may include at least one or more control circuits for controlling memory cells of the non-volatile memory 100N. The peripheral circuit region DP may include at least one or more control circuits for controlling each of the volatile memory cells 100D and 100P.

The substrate 101 may include a semiconductor substrate. The substrate may be formed of a silicon-containing material. For example, the substrate 101 may include other semiconductor materials such as Germanium. For example, the substrate 101 may include a group III-V semiconductor substrate. For example, the substrate 101 may include a compound semiconductor substrate such as GaAs. For example, the substrate 101 may include a silicon on insulator (SOT) substrate.

An interlayer insulation layer 102 may be formed on the substrate 101. The interlayer insulation layer 102 may include an insulating material. For example, the interlayer insulation layer 102 may include silicon oxide, silicon nitride, a low-k material, or a combination thereof. The interlayer insulation layer 102 may be formed of at least one layer.

The buried word line structure BWL may be formed in the substrate 101 in the cell region DC. The buried word line structure BWL may include a buried word line 103 and a word line capping layer 104 formed on the buried word line 103. A bit line structure 105 and a storage node contact plug 106 may be formed on the substrate 101 and spaced apart from the buried word line 103. The buried word line 103, the word line capping layer 104, the bit line structure 105, and the storage node contact plug 106 may be referred as a 'lower structure'.

The buried word line 103 may be formed in the substrate 101 of the cell region DC. The buried word line 103 may partially fill a trench formed inside the substrate 101. Accordingly, the buried word line 103 may have a form buried in the substrate. In an embodiment, the buried word line 103 may include a metal, metal nitride, or a combination thereof. In an embodiment, the buried word line 103 may include titanium nitride (TiN), tungsten (W), or a combination thereof.

The word line capping layer 104 may fill the rest of the trench and may be formed on the buried word line 103. A top surface of the word line capping layer 104 may be at the same level as a top surface of the substrate 101. The word line capping layer 104 may include silicon nitride, silicon oxide, or a combination thereof.

The word line capping layer 104 may be adjacent to the bit line structure 105. The bit line structure 105 may include a bit line contact plug formed inside the substrate 101 and having one sidewall which is self-aligned to the word line capping layer 104, a bit line barrier layer on the bit line contact plug, a bit line on the bit line barrier layer, and a bit line hard mask on the bit line. The bit line structure 105 may have a constant line width. These elements of the bit line structure 105 are well-known in the art and, are, therefore, omitted in order to avoid obscuring the disclosure of the present invention with unnecessary information. Other well-known features may also be omitted. For example, the bit line structure 105 may further include a bit line spacer.

The storage node contact plug 106 may be formed to be spaced apart from the buried word line 103. The storage node contact plug 106 may penetrate through the interlayer insulation ayer 102 and connect to the substrate 101. In an embodiment, the storage node contact plug 106 may be extended inside the substrate 101. The storage node contact plug 106 may include polysilicon doped with impurities, a metal-containing material, or a combination thereof.

Accordingly, the DRAM memory cell 100D may include the buried word line 103 formed inside the substrate 101, the bit line structure 105 formed on the substrate 101, and the storage node contact plug 106 which is connected to the substrate 101.

A peripheral circuit gate structure 107, a gate spacer 108, and a contact plug 109 may be formed on the substrate 101 in the peripheral circuit region DP. The peripheral circuit gate structure 107, the gate spacer 108, and the contact plug 109 in the peripheral circuit region DP may be referred as a 'peripheral circuit lower structure'. The 'peripheral circuit lower structure' may refer to the DRAM peripheral circuit 100P.

The peripheral circuit gate structure 107 may be formed on the substrate 101 in the peripheral circuit region DP. The peripheral circuit gate structure 107 may include a stack of a gate insulation layer, a lower gate electrode, a barrier layer, an upper gate electrode, and a gate hard mask. The peripheral gate structure 107 may include an insulating material, polysilicon doped with impurities, a metal-material, metal silicide, or a combination thereof.

The gate spacer 108 may be disposed on both sidewalls of the peripheral gate structure 107. The gate spacer 108 may include a low-k material. The gate spacer 108 may include a multilayer spacer. The gate spacer 108 may include an air gap. The gate spacer 108 may have a NON structure which includes an oxide spacer disposed between nitride spacers.

The contact plug 109 may be formed to be spaced apart from the gate spacer 108 and to penetrate through the interlayer insulation layer 102, The contact plug 109 may include a metal-containing material. The contact plug 109 may include tungsten or a tungsten compound.

An etch stop layer 110 may be formed on the interlayer insulation layer 102. The etch stop layer 110 may cover both the cell region DC and the peripheral circuit region DP. The etch stop layer 110 may include silicon nitride. The etch stop layer 110 may be used as an etch ending point. The etch stop layer 110 may be formed through a method such as chemical vapor deposition (CVD), physical vapor deposition (PVD), atomic layer deposition (ALD), plasma enhanced CVD, and plasma enhanced ALD.

A first capping layer 111 may be formed on the etch stop layer 110. A thickness of the first capping layer 111 may be larger than that of the etch stop layer 110. The first capping layer 111 may include a material having an etch selectivity with respect to the etch stop layer 110, The first capping layer 111 may include an insulating material. The first capping layer 111 may include, for example, oxide or nitride. The first capping layer 111 may include silicon oxide.

The source layer 112 may be formed on the first capping layer 111, A thickness of the source layer 112 may be larger than that of the first capping layer 111. A thickness of the source layer 112 may be ten times or more larger than that of the first capping layer 111. The source layer 112 may include a silicon-containing material. The source layer 112 may include a polysilicon. The source layer 112 may include a polysilicon doped with impurities.

An alternating stack in which one or more insulation layers 131 and one or more horizontal word lines 132 are alternately stacked may be formed on the source layer 112, A structure of the alternating stack s not limited to the structure shown in FIG. 2A. The alternating stack may be formed by stacking each of the insulation layers 131 and each of the horizontal word lines 132 multiple times. The insulation layers 131 and the horizontal word lines 132 may be vertically arranged over the substrate 101. In the alternating stack, each of the insulation layers 131 and each of the horizontal word lines 132 may be alternately stacked at least three times. Each of the insulation layers 131 may electrically insulate the horizontal word lines 132, When three of the horizontal word lines 132 are stacked, one of them may be a drain select word line, another one of them may be a source select word line, and still another one of them may be a main word line. The number of the horizontal word lines 132 is not limited thereto, and the horizontal word lines 132 may be stacked as many times as possible for bit growth.

The insulation layer 131 may be formed of an insulating material. The insulation layer 131 may include, for example, oxide or nitride. The horizontal word line 132 may include a metal-containing material. For example, the horizontal word line 132 may include tungsten (W), The horizontal word line 132 may further include a diffusion barrier. The diffusion barrier may include any one of tungsten nitride (WN), tantalum nitride (TaN), or titanium nitride (TiN).

The alternating stack may include the insulation layers 131, the horizontal word lines 132, the source layer 112, the first capping layer 111, and an opening 115 penetrating through the etch stop layer 110. The opening 115 may have a high aspect ratio. The opening 115 may partially expose the interlayer insulation layer 102, The opening 115 may expose an upper surface of the storage node contact plug 106. The opening 115 may be filled with the channel structure CH, a separation layer 121, and the capacitor CAP.

The channel structure CH may be formed that penetrates the insulation layers 131 and the horizontal word lines 132 and surrounds a sidewall of the opening 115. The channel structure CH may be referred to as a 'vertical channel structure'. The channel structure CH may include a memory layer 119 formed on the sidewall of the opening 115 and a channel layer 120 formed on the memory layer 119. The channel structure CH may not cover the storage node contact plug 106.

The memory layer 119 may be conformally formed on the sidewall of the opening 115, The memory layer 119 may partially cover the sidewall of the opening. The memory layer 119 may be discontinuous. The source layer 112 may be disposed between the memory layer 119. The memory layer 119 may partially cover a bottom surface of the opening 115. The memory layer 119 may include a multilayer structure, each layer of the memory layer formed of a different material. The memory layer 119 may include a multilayer structure stacked at least three times or more. The memory layer 119 may include oxide, nitride, a high dielectric material (High-k), or a combination thereof. The memory layer 119 may be formed of an oxide-nitride-oxide (ONO) structure, a nitride-oxide-nitride (NON) structure, an oxide-nitride-alumina (ONA) structure, an oxide-nitride-oxide-alumina (ONOA) structure, and so on. According to an embodiment of the present invention, the memory layer 119 may include an oxide-nitride-oxide (ONO) structure.

The channel layer 120 may be formed on the memory layer 119. The channel layer 120 may be conformally formed over the memory layer 119. Accordingly, the channel layer 120 may not contact the interlayer insulation layer 102. The channel layer 120 may directly contact the source layer 112. A portion of the channel layer 120 may be surrounded by the source layer 112, The channel layer 120 may include a semiconductor material. The channel layer 120 may include a silicon-containing material. The channel layer 120 may include polysilicon. The channel layer 120 may include polysilicon doped with impurities. The channel layer 120 may provide a conductive path for an electric charge. The channel layer 120 may be formed by various methods such as ALD or CVD.

A thickness of the memory layer 119 may be larger than that of the channel layer 120. A thickness of the memory layer 119 may be two to three times larger than that of the channel layer 120, For example, a thickness of the memory layer 119 may be from 170 Å to 200 Å and when a high dielectric material is applied to the memory layer 119 of an ONO structure, a thickness of the memory layer 119 may be further increased by 20 Å to 30 Å. In the case when a high dielectric material is applied to the memory layer 119 of an ONO structure, a thickness of the channel layer 120 may be 70 Å to 90 Å. In the present embodiment, a thickness of the memory layer 119 and a thickness of the channel layer 120 are similarly illustrated, but the invention is not limited in this way. As in the above example, a thickness of the memory layer 119 and a thickness of the channel layer 120 may be adjusted as needed.

The separation layer 121 may be formed on the channel layer 120, The separation layer 121 may cover a sidewall of the channel layer 120. The separation layer 121 may be conformally formed along a sidewall of the channel layer 120. The separation layer 121 may directly contact the interlayer insulation layer 102. The separation layer 121 IS may not cover the storage node contact plug 106. A thickness of the separation layer 121 may be larger than that of the channel layer 120. A height of the separation layer 121 may be higher than or equal to that of the channel layer 120. The separation layer 121 may include an insulating material. The separation layer 121 may include, for example, oxide or nitride. The separation layer 121 may include silicon oxide, silicon nitride, silicon oxynitride, or a combination thereof. Accordingly, the separation layer 121 may electrically insulate the channel structure CH and the capacitor CAP.

The capacitor CAP filling the opening 115 may be formed on the separation layer 121. The capacitor CAP may include the storage node 122 penetrating through the alternating stack and formed on the separation layer 121, a dielectric layer 123 formed on the storage node 122, and a plate node 124 formed on the dielectric layer 123. In an embodiment, the capacitor CAP may have a pillar-shape. In another embodiment, the capacitor CAP may have different shapes, for example, a cylinder-shape. However, the invention is not limited by the shape of the capacitor CAP.

The storage node 122 is formed on the storage node contact plug 106 and may extend vertically to cover a sidewall of the separation layer 121, The capacitor CAP may be electrically connected to the storage node contact plug 106. A width of a bottom surface of the storage node 122 may be wider than a width of an upper surface of the storage node contact plug 106. A height of the storage node 122 may be the same as a height of the separation layer 121. Accordingly, the storage node 122 may cover all sidewalls of the separation layer 121.

The dielectric layer 123 may be formed on the storage node 122. A thickness of the dielectric layer 123 may be smaller than that of the storage node 122. The dielectric layer 123 may cover an exposed surface of the storage node 122, an upper surface of the separation layer 121, and an upper surface of the channel structure CH. The dielectric layer 123 may partially cover an upper surface of the alternating stack AS, The dielectric layer 123 may have a multilayer structure. The dielectric layer 123 may include a high dielectric material (High-k). The dielectric layer 123 may include zirconium oxide, aluminum oxide, hafnium oxide, or a combination thereof. The dielectric layer 123 may include a stacked structure in which a first zirconium oxide, an aluminum oxide, and a second zirconium oxide are stacked (ZAZ structure).

The plate node 124 may be formed on the dielectric layer 123. The plate node 124 may entirely fill the remaining space of the opening 115. The plate node 124 may cover all exposed surfaces of the dielectric layer 123. The plate node 124 may partially cover an upper surface of the alternating stack AS.

The storage node 122 and the plate node 124 may include a metal, metal nitride, or a combination thereof. For example, the storage node 122 and the plate node 124 may include cobalt (Co), titanium (Ti), nickel (Ni), tungsten (W), molybdenum (Mo), platinum (Pt), ruthenium IS (Ru), Iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN), or a combination thereof. The storage node 122 and the plate node 124 may be formed of titanium nitride. The storage node 122 and the plate node 124 may include titanium nitride (ALD-TiN) by various methods such as atomic layer deposition.

A semiconductor layer 125 extending to partially cover an upper surface of the insulation layer 131 at the highest level among the insulation layers 131 may be formed on the channel structure CH. The semiconductor layer 125 may (directly contact the separation layer 121. The semiconductor layer 125 may not overlap with the dielectric layer 123, The semiconductor layer 125 may be in direct contact with the channel layer 120 and thus may be electrically connected to the channel layer 120. An upper surface of the semiconductor layer 125 may be at the same level as an upper surface of the separation layer 121. The semiconductor layer 125 may include a semiconductor material. The semiconductor layer 125 may include polysilicon. The semiconductor layer 125 may include a polysilicon layer doped with impurities.

A second capping layer 126 may be formed on the semiconductor layer 125, the separation layer 121, and an upper surface of the capacitor CAP in the cell region DC. A thickness of the second capping layer 126 may be larger than that of the first capping layer 111. The second capping layer 126 may include an insulating material. The second capping layer 126 may include, for example, oxide or nitride. For example, the second capping layer 126 may include silicon oxide, silicon nitride, silicon oxynitride, or a combination thereof. According to an embodiment of the present invention, the second capping layer 126 may include silicon oxide.

A third capping layer 130 may be formed on the first capping layer 111 in the peripheral circuit region DP. An upper surface of the third capping layer 130 may be at the same level as an upper surface of the second capping layer 126. A thickness of the third capping layer 130 may be larger than that of the first capping layer 111. The third capping layer 130 may include an insulating material. The third capping layer 130 may include, for example, oxide or nitride. For example, the third capping layer 130 may include silicon oxide, silicon nitride, silicon oxynitride, or a combination thereof. According to the embodiment of the present invention, the third capping layer 130 may include silicon oxide.

A first contact hole 127A may be formed in the cell region DC, the first contact hole 127A penetrating through the second capping layer 126 and exposing upper surfaces of the semiconductor layer 125 and the plate node 124. A second contact hole 1276 may be formed in the peripheral circuit region DP, the second contact hoe 127B penetrating through the third capping layer 130, the first capping layer 111 and the etch stop layer 110 and exposing the contact plug 109.

The first contact hole 127A and the second contact hole 1276 may be filled with a metal material. Accordingly, a first metal plug 128A filling the first contact hole 127A may be formed. A second metal plug 128B filling the second contact hole 127B may be formed. An upper of the first metal plug 128A may be at the same level as an upper surface of the second capping layer 126. An upper surface of the second metal plug 128B may be at the same level as an upper surface of the third capping layer 130. The first metal plug 128A and the second metal plug 128B may include tungsten or a tungsten compound. The first metal plug 128A and the second metal plug 128B may be formed by various methods such as chemical vapor deposition (CVD), physical vapor deposition (PVD), atomic layer deposition (ALD), Plasma Enhanced CVD (PECVD) or Plasma Enhanced ALD (PEALD).

Referring to FIG. 26, the cell region DC and the deck region ND may be continuous. Components illustrated with the same reference numerals as in FIG. 2A may refer to the same components, Description of duplicate components with FIG. 2A may be omitted.

The insulation layers 131 and the horizontal word lines 132 in the deck region ND may be alternately stacked. Accordingly, a horizontal gate structure GS may be formed. The horizontal gate structure GS is not limited to the structure shown in FIG. 26. For example, each of the insulation layers 131 and each of the horizontal word lines 132 may be stacked multiple times. The insulation layers 131 and the horizontal word lines 132 may be vertically arranged on the substrate 101. In the alternating stack, each of the insulation layers 131 and each of the horizontal word lines 132 may be alternately stacked at least three times. Each of the insulation layers 131 may electrically insulate the horizontal word lines 132.

The horizontal gate structure GS in the deck region ND may have a step shape. Widths of the horizontal word line 132 at the lowest level and insulation layer 131 at the lowest level in the deck region ND may be the same. The horizontal word line 132 at the highest level and the insulation layer 131 at the highest level in the deck region ND may have the same width. Widths of the horizontal word line 132 at the lowest level and the insulation layer 131 at the lowest level in the deck region ND may be wider than widths of the horizontal word line 132 at a middle level and the insulation layer 131 at a middle level. Widths of the horizontal word line 132 at the highest level and the insulation layer 131 at the highest level in the deck region ND may be narrower than widths of the horizontal word line 132 at a middle level and the insulation layer 131 at a middle level.

A fourth capping layer 140 may be formed on the horizontal gate structure GS in the deck region ND. The fourth capping layer 140 may cover the source layer 112 in the deck region ND. An upper surface of the fourth capping layer 140 may be at the same level as an upper surface of the second capping layer 126, The fourth capping layer 140 may include an insulating material. The fourth capping layer 140 may include, for example, oxide or nitride. The fourth capping layer 140 may include silicon oxide, silicon nitride, silicon oxynitride, or a combination thereof, According to an embodiment of the present invention, the fourth capping layer 140 may include silicon oxide.

Third contact holes 127C may be formed in the deck region ND, the third contact holes 127C penetrating through the fourth capping layer 140 and partially exposing upper surfaces of the horizontal word lines 132 at each level of the step shape gate structure GS. The third contact holes 127C may have different heights depending on levels of the horizontal word lines 132. One of the third contact holes 127C may penetrate through the insulation layers at the highest level and have the shortest height.

The third contact holes 127C may be filled with a metal material. Accordingly, third metal plugs 128C filling the third contact holes 127C may be formed. Upper surfaces of the third metal plugs 128C may be at the same level as an upper surface of the fourth capping layer 140. The third metal plugs 128C and the first metal plug 128A may include the same material. The third metal plugs 128C and the second metal plug 128B may include the same material. The third metal plugs 128C may include tungsten or a tungsten compound. The third metal plug 128C may be formed by various methods such as chemical vapor deposition (CVD), physical vapor deposition (PVD), atomic layer deposition (ALD), plasma enhanced CVD (PECVD), or plasma enhanced ALD (PEALD).

FIG. 3 is a top-view of a cross-section of the semiconductor device 100 taken along line C-C' shown in FIG. 2A.

As shown in FIG. 3, the opening 115 may be filled with the channel structure CH, the separation layer 121, and the capacitor CAP. Accordingly, the capacitor CAP may be surrounded by the channel structure CH.

Specifically, the memory layer 119 may surround a sidewall of the opening 115. The channel layer 120 may surround a sidewall of the memory layer 119. The separation layer 121 may surround a sidewall of the channel layer 120. The storage node 122 may surround a sidewall of the separation layer 121. The dielectric layer 123 may surround a sidewall of the storage node 122. The plate node 124 may fill the remaining space of the opening 115.

Although not shown in the cross-section of the semiconductor device 100 taken along line C-C' of FIG. 2A, for explanation, a semiconductor layer 125 partially covering an upper surface of the channel structure CH and the first metal plug 128A are additionally shown. Referring to FIG. 3, the first metal plug 128A may be formed on the semiconductor layer 125. Accordingly, the semiconductor layer 125 and the first metal plug 128A may be electrically connected. According to the drawing, a size of the first metal plug 128A is shown to be smaller than that of the semiconductor layer 125, but in other embodiments, a size of the first metal plug 128A may be equal to or larger than a size of the semiconductor layer 125. According to the drawing, the first metal plug 128A may completely overlap with the semiconductor layer 125, but in other embodiments, the first metal plug 128A may partially overlap with the semiconductor layer 125.

The semiconductor layer 125 may partially overlap with the channel structure CH. The semiconductor layer 125 may partially be in direct contact with the channel structure CH. Accordingly, the semiconductor layer 125 may be electrically connected to the channel structure CH. The channel structure CH and the first metal plug 128A may be electrically connected through the semiconductor layer 125.

An embodiment of the present invention may include a hybrid memory including both the DRAM memory cell 100D and the non-volatile memory 100N. The hybrid memory cell in which the non-volatile memory 100N and the DRAM memory cell 100D are combined may be formed over the substrate 101. The DRAM memory cell 100D may include the substrate 101 in the cell region DC and the peripheral circuit region DP, the interlayer insulation layer 102, the lower structure 103, 104, 105, and 106, and the peripheral circuit lower structure 107, 108, 109, the first metal plug 128A, the second metal plug 128B, and the capacitor CAP. The non-volatile memory 100N may include the source layer 112, the horizontal gate structure GS, the channel structure CH, the semiconductor layer 125, and the third metal plug 128C. Accordingly, a hybrid memory cell in which the DRAM memory cell 100D is embedded in the non-volatile memory 100N may be formed over a single substrate 101.

In an embodiment of the present invention, a large width and height of the opening 115 may be secured by forming the horizontal gate structure GS on an upper portion of a substrate on which the buried word line 103, the bit line structure 105, and the storage node contact plug 106 are formed and by forming the opening 115 penetrating through the horizontal gate structure GS.

In other words, in the present embodiment, in order to simultaneously form the channel structure CH of the non-volatile memory 100N and the capacitor CAP of the DRAM memory cell 100D in one opening, the width of the opening 115 may be adjusted larger than when one element is formed in one opening. In addition, the height of the opening 115 may be increased by forming the opening 115 to penetrate not only the horizontal gate structure GS but also the source layer 112 for contact between the storage node contact plug 106 and the capacitor CAP to be formed in the opening 115.

As the width of the opening 115 is secured, the channel structure CH surrounding an inner-sidewall of the opening 115 may be formed to provide the non-volatile memory 100N. At the same time, the DRAM memory cell 100D may be provided by forming the capacitor CAP filling the opening 115 on a sidewall of the channel structure CH. As the capacitor CAP that is surrounded by the channel structure CH of the DRAM memory cell 100D is formed, a separate space for forming the capacitor CAP may be omitted. Accordingly, manufacturing cost of the semiconductor device 100 may be reduced and operation speed may be improved as resistance of the semiconductor device 100 is reduced.

In addition, as the height of the opening 115 is secured, a capacitor having a high aspect ratio may be provided. Accordingly, a sensing margin of a non-volatile memory may be secured. Accordingly, characteristics of a semiconductor device may be improved.

FIGS. 4 to 9, 10A to 10G, 11 to 20, 21A to 31A, and 215 to 315 are diagrams illustrating a method for fabricating a semiconductor device according to an embodiment of the present invention. FIGS. 4 to 9, 11 to 20, and 21A to 31A are cross-sectional views taken along line A-A' shown in FIG. 1, FIGS. 213 to 315 are cross-sectional views taken along line B-B' shown in FIG. 1. FIGS. 10A to 10G are diagrams illustrating a method for fabricating the semiconductor device shown in FIG. 9 and are top views of FIG. 9. According to the steps shown in FIGS. 4 to 9 and FIGS. 10 to 20, the deck region ND may be formed in the same manner as the peripheral circuit region DP. Accordingly, a description of the deck region ND in the steps according to FIGS. 4 to 9 and 10 to 20 will be omitted.

Figure 4:
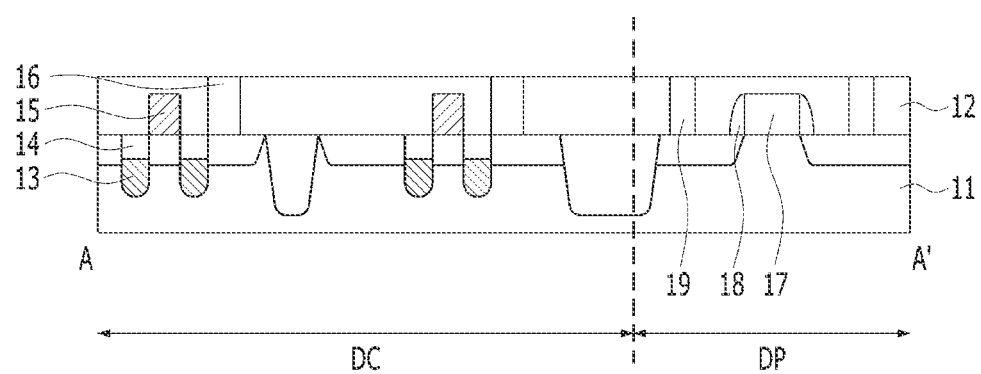

As shown in FIG. 4, a substrate 11 may be prepared. The substrate 11 may include a semiconductor substrate. The substrate 11 may be made of a silicon-containing material. The substrate 11 may include other semiconductor materials such as germanium. The substrate 11 may include a group III-V semiconductor substrate. The substrate 11 may include a compound semiconductor substrate such as GaAs. The substrate 11 may include the cell region DC and the peripheral circuit region DP.

An interlayer insulation layer 12 may be formed on the substrate 11. The interlayer insulation layer 12 may include an insulating material. The interlayer insulation layer 12 may include silicon oxide, silicon nitride, a low-k material, or a combination thereof. The interlayer insulation layer 12 may include one or more layers.

A buried word line 13 may be formed inside the substrate 11 in the cell region DC. The buried word line 13 may partially fill a trench formed inside the substrate 11. The buried word line 13 may be buried in the substrate 11. The buried word line 13 may be referred to as a 'buried word line'. The buried word line 13 may include a metal, metal nitride, or a combination thereof. The buried word line 13 may be formed of titanium nitride (TiN), tungsten (W), or a combination thereof.

A word line capping layer 14 may be formed on the buried word line 13. The word line capping layer 14 may fill the remaining space of the trench. The word line capping layer 14 may cap an upper surface of the buried word line 13. An upper surface of the word line capping layer 14 may be at the same level as an upper surface of the substrate 11. The word line capping layer 14 may include an insulating material. The word line capping layer 14 may include silicon nitride or silicon oxide. In another embodiment of the present invention, the word line capping layer 14 may have a NON (Nitride-Oxide-Nitride) structure.

The word line capping layer 14 may be adjacent to a bit line structure 15. The bit line structure 15 may include a bit line contact plug (not shown) formed inside the substrate 11 and to be self-aligned with the word line capping layer 14, a bit line barrier layer (not shown) on the bit line contact plug, and a bit line (not shown) on the bit line barrier layer, and a bit line hard mask (not shown) on the bit line. A line width of the bit line structure 15 may be constant.

The bit line contact plug may include polysilicon. The bit line barrier layer may include titanium nitride (TiN), tantalum nitride (TaN), tungsten nitride (WN), or a combination thereof. The bit line may include a metal material having a lower resistivity than the bit line contact plug. The bit line hard mask may be formed of an insulating material.

Although not shown, a bit line spacer may be formed on both sidewalls of the bit line structure 15. The bit line spacer may include a low dielectric material. The bit line spacer may include, for example, oxide or nitride. The bit line spacer may include a multilayer spacer. The bit line spacer may include an air gap.

The contact plug 16 may be formed spaced apart from the buried word line 13. The contact plug 16 may penetrate through the interlayer insulation layer 12 and connect to the substrate 11, The contact plug 16 may be extended to the substrate 11. The contact plug 16 may include a lower plug adjacent to the bit line structure 15, an ohmic contact layer on the lower plug, and an upper plug on the ohmic contact layer. The lower plug may be extended to the substrate 11. The lower plug may include polysilicon doped with impurities. The ohmic contact layer may include cobalt silicide ($CoSi_x$). The upper plug may include a metal-containing material.

The buried word line 13, the word line capping layer 14, the bit line structure 15, and the contact plug 16 may be referred to as a 'lower structure'.

A gate structure 17 may be formed on the substrate 11 in the peripheral circuit region DP. The gate structure 17 may include a gate insulation layer on the substrate 11, a lower gate electrode on the gate insulation layer, a barrier layer on the lower gate electrode, and an upper gate electrode on the barrier layer, and a gate hard mask on the upper gate electrode. In other words, the gate structure 17 may include a stack of the gate insulation layer, the lower gate electrode, the barrier layer, the upper gate electrode, and the gate hard mask. The gate structure 17 may be at least one of a planar gate, a recess gate, a buried gate, an omega gate, or a FIN gate.

The gate insulation layer may include a high-k material, oxide, nitride, oxynitride, or a combination thereof. The lower gate electrode may include polysilicon doped with impurities, a metal-containing material, or a combination thereof. The barrier layer may include titanium (Ti), titanium nitride (TIN), titanium silicon nitride (TiSiN), tantalum (Ta), tantalum nitride (TaN), tungsten nitride (WN), or a combination thereof. The upper gate electrode may include a metal, a metal nitride, a metal silicide, or a combination thereof. The gate hard mask may be formed of an insulating material having an etch selectivity with respect to the upper gate electrode.

A gate spacer 18 may be disposed on both sidewalls of the gate structure 17. The gate spacer 18 may have the same structure as the bit line spacer described above. The gate spacer 18 may include a low dielectric material. The gate spacer 18 may include a multilayer spacer. The gate spacer 18 may include an aft gap. The gate spacer 18 may include an NON structure in which an oxide spacer is disposed between nitride spacers.

A contact plug 19 may be formed spaced apart from the gate spacer 18 and may penetrate through the interlayer insulation layer 12. The contact plug 19 may include a metal-containing material. The contact plug 19 may include tungsten or a tungsten compound.

Figure 5:
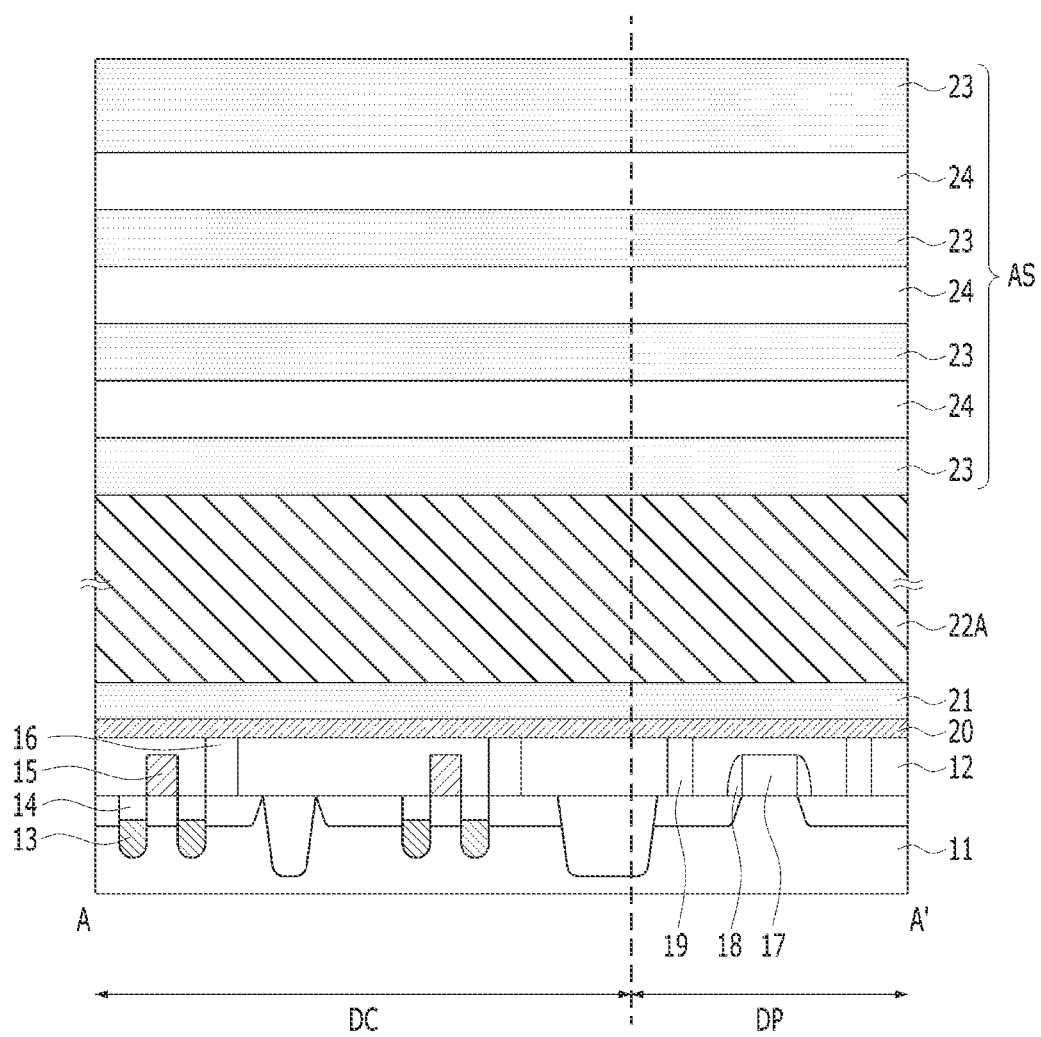

As shown in FIG. 5, an etch stop layer 20 may be formed on the interlayer insulation layer 12.

The etch stop layer 20 may cover both the cell region DC and the peripheral circuit region DP. The etch stop layer 20 may be used as an etch endpoint, The etch stop layer 20 may include silicon nitride. The etch stop layer 20 may be formed by various methods such as chemical vapor deposition (CVD), physical vapor deposition (PVD), atomic layer deposition (ALD), plasma enhanced CVD (PECVD), and plasma enhanced ALD (PEALD).

A first capping layer 21 may be formed on the etch stop layer 20. A thickness of the first capping layer 21 may be larger than that of the etch stop layer 20. The first capping layer 21 may include a material having an etch selectivity with respect to the etch stop layer 20. The first capping layer 21 may include an insulating material. The first capping layer 21 may include, for example, oxide or nitride. The first capping layer 21 may include silicon oxide.

A preliminary source layer 22A may be formed on the first capping layer 21. A thickness of the preliminary source layer 22A may be larger than that of the first capping layer 21. Although not shown in drawings, a thickness of the preliminary source layer 22A may be ten times or more larger than that of the first capping layer 21, The preliminary source layer 22A may include a silicon-containing material. The preliminary source layer 22A may include polysilicon. The preliminary source layer 22A may include polysilicon which is not doped with impurities.

An alternating stack AS in which insulation layers 23 and sacrificial layers 24 are alternately stacked may be formed on the preliminary source layer 22A. The alternating stack AS is not limited to the embodiment shown in FIG. 5 and may be formed by stacking each of the insulation layers 23 and each of the sacrificial layers 24 multiple times. In the alternating stack AS, each of the insulation layers 23 and each of the sacrificial layers 24 may be alternately stacked at least three times or more, The insulation layers 23 may include an oxide and the sacrificial layers 24 may include a nitride. The insulation layer 23 at the highest level may be formed on the sacrificial layer 24 at the highest level. Accordingly, the alternating stack AS may have the insulation IS layer 23 both at the highest and lowest levels, The insulation layer 23 at the highest level may have a thickness larger than that of the insulation layer 23 and the sacrificial layer 24 at a lower level.

Figure 6:
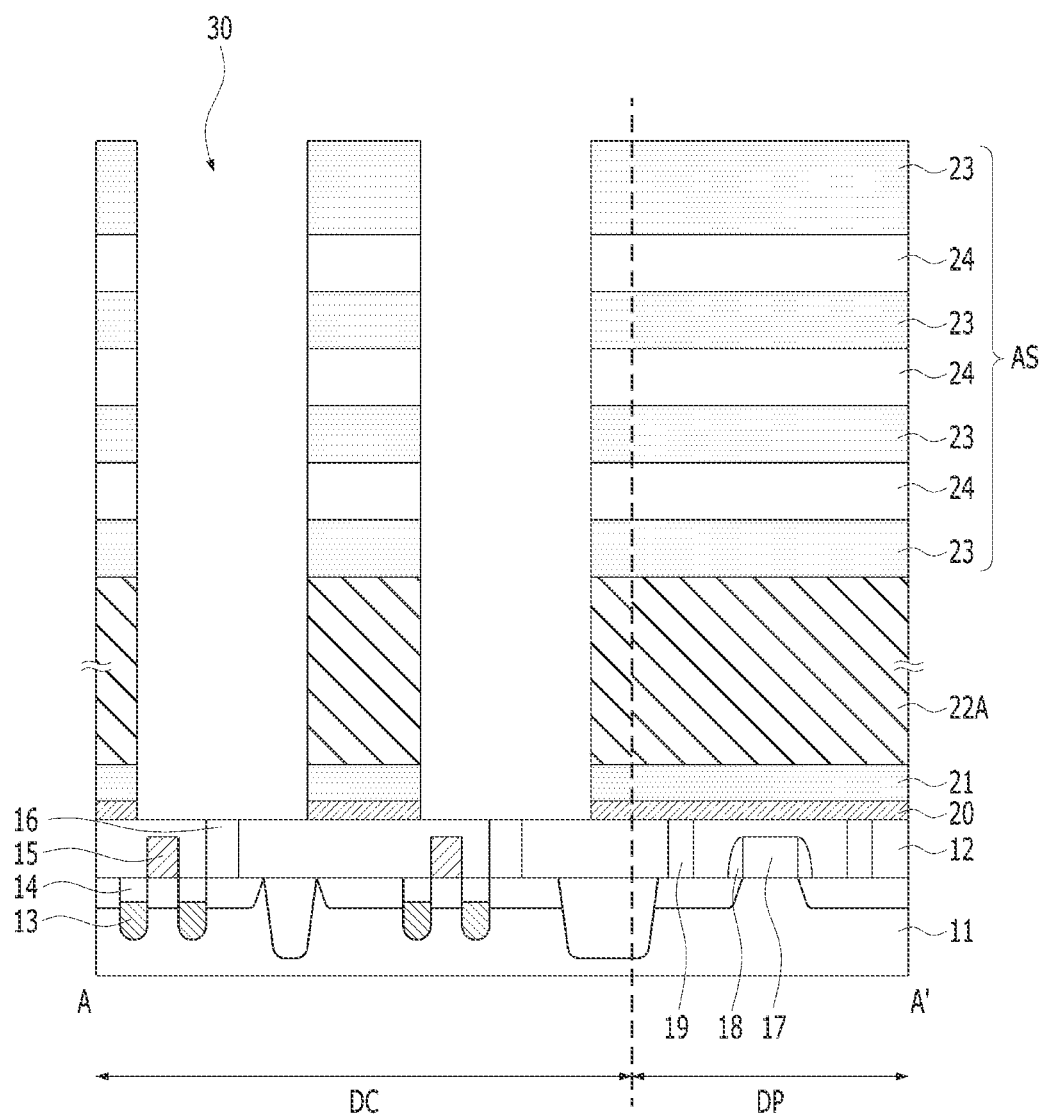

Referring to FIG. 6, a first opening 30 penetrating through the alternating stack AS, the preliminary source layer 22A, the first capping layer 21, and the etch stop layer 20 may be formed. The peripheral circuit region DP and the deck region may be protected by a protection mask. Accordingly, the first opening 30 may be formed only in the cell region DC.

The first opening 30 may partially expose the interlayer insulation layer 12 in the cell region DC. The first opening 30 may expose an upper surface of the contact plug 16. The first opening 30 may expose sidewalls of the alternating stack AS and the preliminary source layer 22A. The first opening 30 may have a high aspect ratio. Aspect ratio refers to the ratio of height to width.

Figure 7:
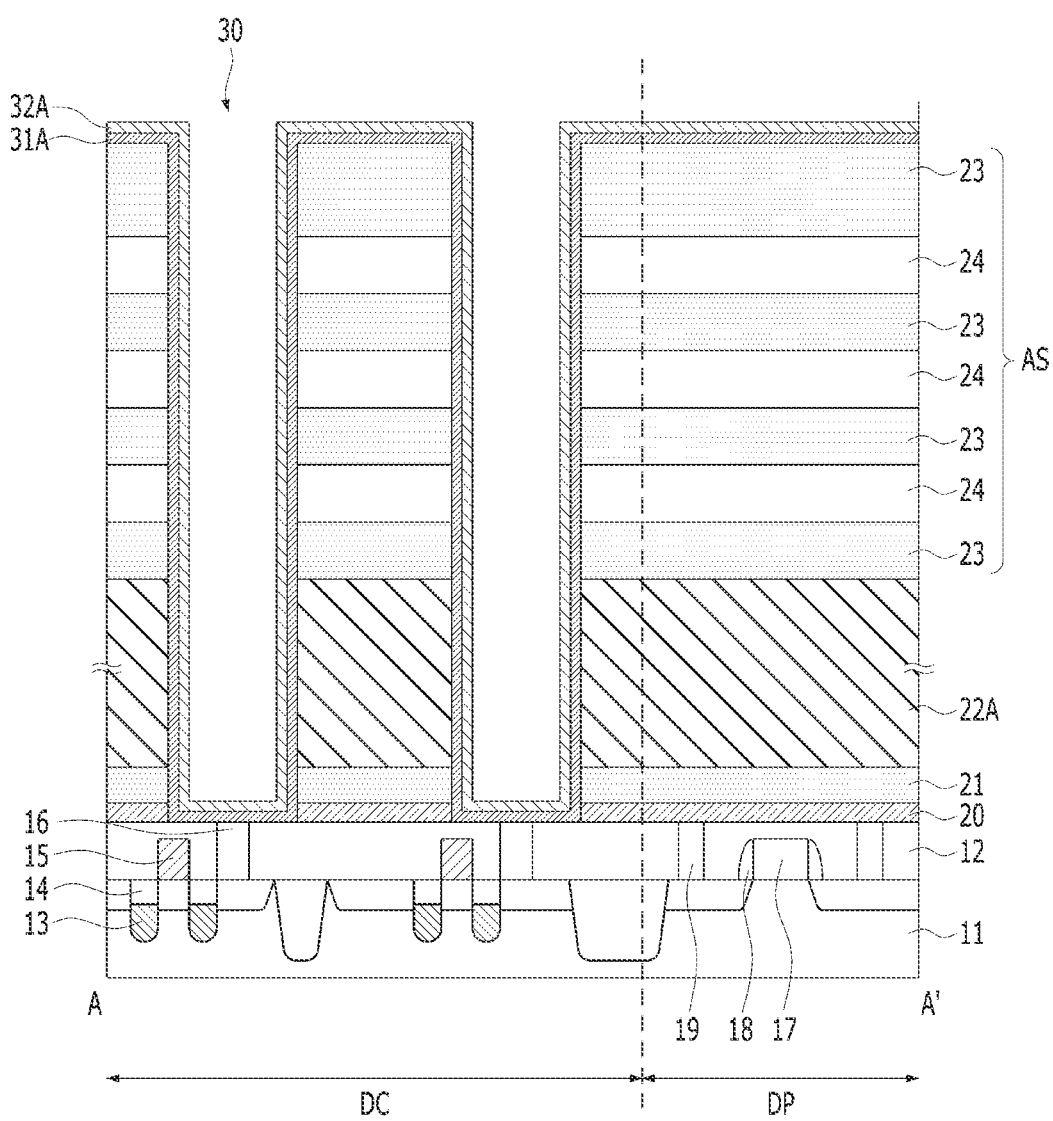

Referring to FIG. 7, a memory material 31A may be formed on a sidewall and a bottom surface of the first opening 30.

The memory material 31A may be extended from a bottom surface of the first opening 30 to an upper surface of the alternating stack AS. The memory material 31A may cover exposed surfaces of the interlayer insulation layer 12 and the contact plug 16, The memory material 31A may be conformally formed along exposed surfaces of the interlayer insulation layer 12 and the contact plug 16. The memory material 31A may be conformally formed along a sidewall of the first opening 30, The memory material 31A may cover a bottom surface of the first opening 30.

The memory material 31A may have a multilayer structure, each layer of the memory material 31A having a different material. The memory material 31A may include a multilayer structure stacked at least three times or more. The memory material 31A may include an insulating material, The memory material 31A may include oxide, nitride, a high dielectric material (High-K), or a combination thereof. According to an embodiment of the present invention, the memory material 31A may include oxide, The memory material 31A may include oxide, nitride, a high dielectric material, or a combination thereof, The memory material 31A may be formed of an oxide-nitride-oxide (ONO) structure, a nitride-oxide-nitride (NON) structure, an oxide-nitride-alumina (ONA) structure, and an oxide-nitride-oxide-alumina (ONA) structure, According to an embodiment of the present invention, the memory material 31A may include an oxide-nitride-oxide (ONO) structure.

A channel material 32A may be formed on the memory material 31A. The channel material 32A may cover the memory material 31A. The channel material 32A may be conformally formed along a surface of the memory material 31A. The channel material 32A may include a semiconductor material. The channel material 32A may include a silicon-containing material, The channel material 32A may include polysilicon. The channel material 32A may include polysilicon doped with impurities. The channel material 32A may be deposited by various methods such as ALD or CVD.

Figure 8:
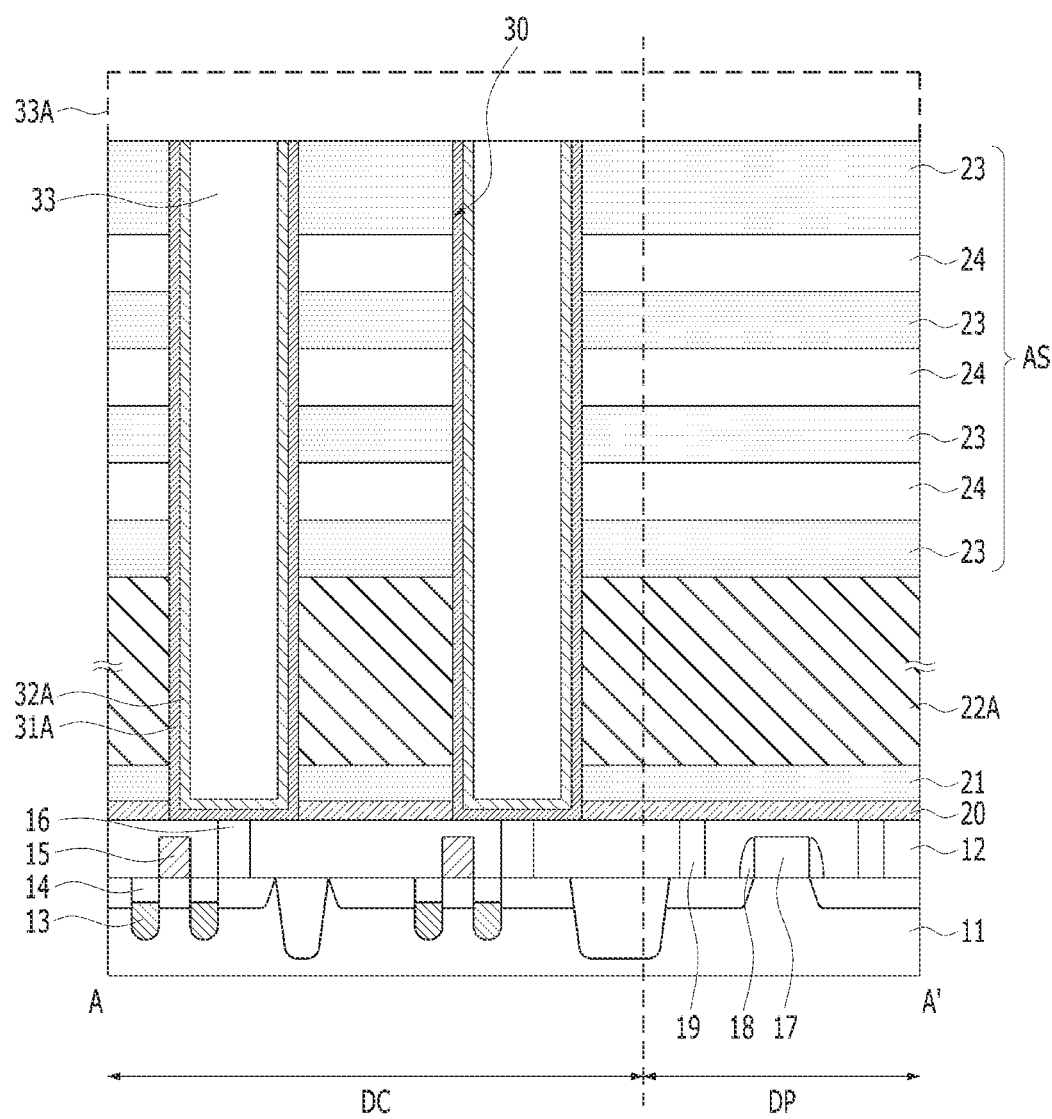

As shown in FIG. 8, a first channel protection layer 33 filling the first opening 30 may be formed.

The first channel protection layer 33 may protect the channel material 32A in a subsequent process. After forming a channel protection material 33A covering all exposed surfaces of the channel material 32A to form the first channel protection layer 33, a chemical-mechanical polishing (CMP) process or an etchback process may be performed until an upper surface of the alternating stack AS is exposed.

Accordingly, portions of the memory material 31A and the channel material 32A may be removed. Accordingly, the memory material 31A and the channel material 32A may be disposed only in the opening 115. An upper surface of the first channel protection layer 33 may be at the same level as an upper surface of the alternating stack AS. The first channel protection layer 33 may include an insulating material. The first channel protection layer 33 may include oxide, nitride, or a combination thereof.

Figure 9:
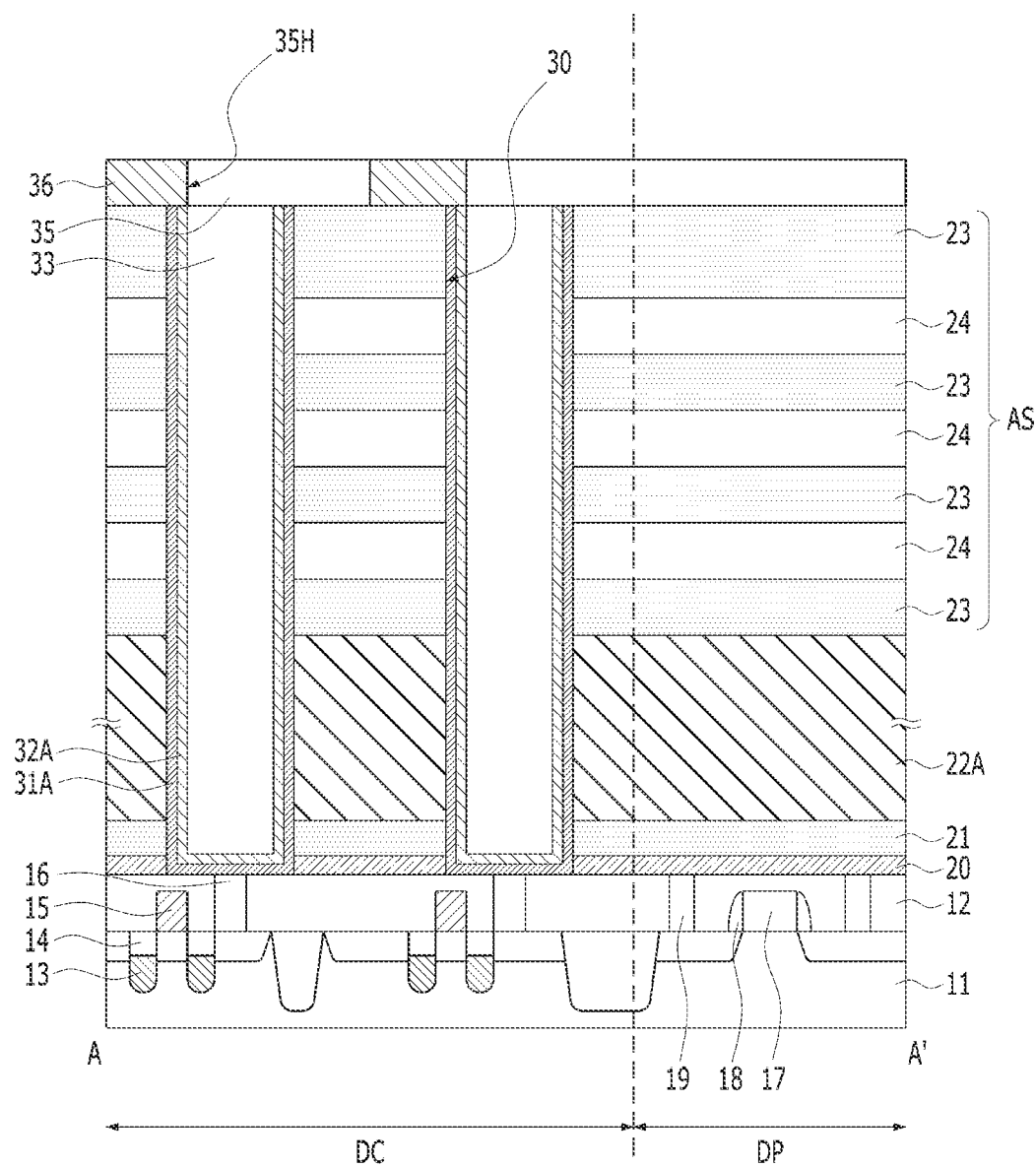

Referring to FIG. 9, a pattern sacrificial layer 35 may be formed on the alternating stack AS and the first channel protection layer 33. The pattern sacrificial layer 35 may be formed by a Damascene method. The pattern sacrificial layer 35 may include a plurality of pattern openings 35H penetrating through the pattern sacrificial layer 35. The pattern sacrificial layer 35 may include oxide, nitride, or a combination thereof, According to an embodiment of the present invention, the pattern sacrificial layer 35 may include nitride.

The plurality of pattern openings 35H may be filled with a semiconductor layer 36. The semiconductor layer 36 may be formed by forming a semiconductor material and then performing a planarization process on the semiconductor material. The planarization process may include a polishing process (CMP) or an etchback process. Accordingly, an upper surface of the semiconductor layer 36 may be at the same level as an upper surface of the pattern sacrificial layer 35. The semiconductor layer 36 may partially cover upper surfaces of the memory material 31A, the channel material 32A, and the alternating stack AS. The semiconductor layer 36 may not overlap with the pattern sacrificial layer 35. The semiconductor layer 36 may include a semiconductor material. The semiconductor layer 36 may include polysilicon. The semiconductor layer 36 may include polysilicon doped with impurities.

FIGS. 10A to 10G are views specifically showing a method for forming the pattern sacrificial layer 35 and the semiconductor layer 36 of FIG. 9, FIGS. 10A to 10G are perspective views of FIG. 9, and components disposed at lower levels than the insulation layer 23 at the highest level are omitted for clarity.

Figure 10A:
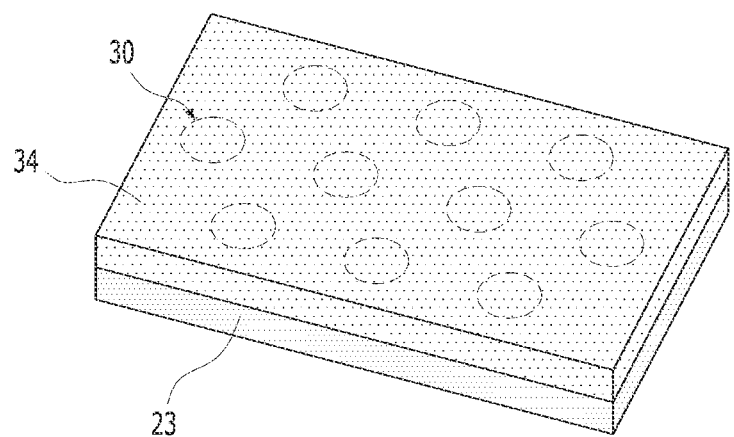

Referring to FIG. 10A, a sacrificial insulation layer 34 covering the insulation layer 23 at the highest level and the first opening 30 may be formed after the semiconductor device of FIG. 8 is formed. The sacrificial insulation layer 34 may include oxide, nitride, or a combination thereof. According to an embodiment of the present invention, the sacrificial insulation layer 34 may include oxide.

Figure 10B:
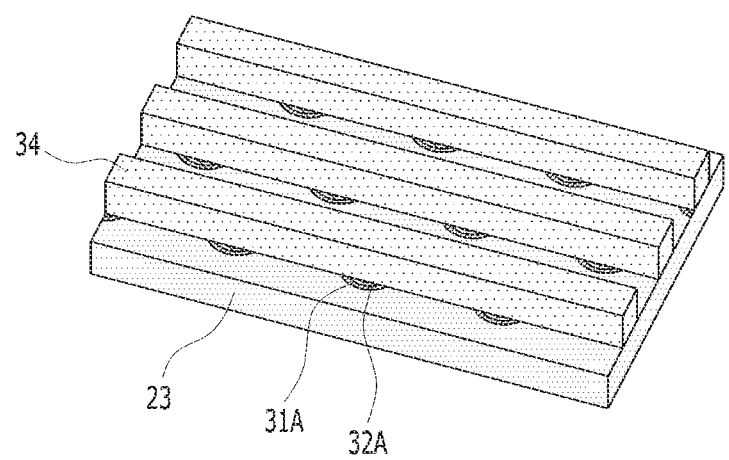

Referring to FIG. 10B, a plurality of parallel lines may be formed by etching the sacrificial insulation layer 34. Although not shown, an etching mask may be used to etch the sacrificial insulation layer 34. Accordingly, the insulation layer 23 at the highest level may be partially exposed. The memory material 31A and the channel material 32A may be partially exposed.

Figure 10C:
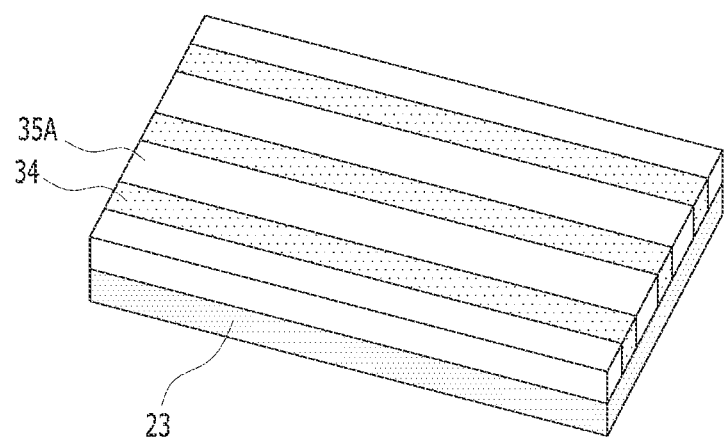

Referring to FIG. 10C, a first pattern sacrificial layer 35A may be filled in the exposed regions between the parallel lines where the sacrificial insulation layer 34 is etched. As the first pattern sacrificial layer 35A is formed, the insulation layer 23 at the highest level, the memory material 31A, and the channel material 32A which are partially exposed may be covered again. Although not shown, a planarization process may be performed to form the first pattern sacrificial layer 35A. Accordingly, upper surfaces of the sacrificial insulation layer 34 and the first pattern sacrificial layer 35A may be at the same level. The sacrificial insulation layer 34 and the first pattern sacrificial layer 35A may have a shape in which a plurality of parallel lines alternate. The first pattern sacrificial layer 35A may include oxide, nitride, or a combination thereof. According to an embodiment of the present invention, the first pattern sacrificial layer 35A may include a nitride.

Figure 10D:
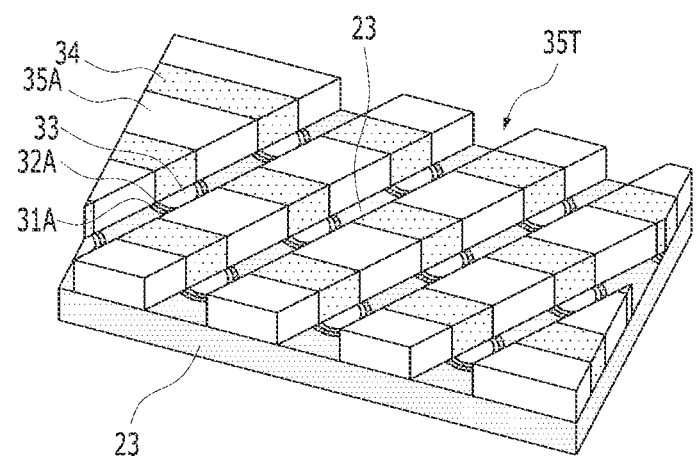

Referring to FIG. 10D, a trench 35T may be formed by etching the sacrificial insulation layer 34 and the first pattern sacrificial layer 35A. Although not shown, an etching mask may be used to form the trench 35T. The trench 35T may cross the sacrificial insulation layer 34 and the first pattern sacrificial layer 35A. The trench 35T may not be parallel to the sacrificial insulation layer 34, The trench 35T may not be parallel with the first pattern sacrificial layer 35A. As the trench 35T is formed, the insulation layer 23 at the highest level may be partially exposed. As the trench 35T is formed, the memory material 31A, the channel material 32A, and the first channel protection layer 33 may be partially exposed, As shown in FIG. 10D, a plurality of spaced apart parallel trenches 35T may be formed.

Figure 10E:
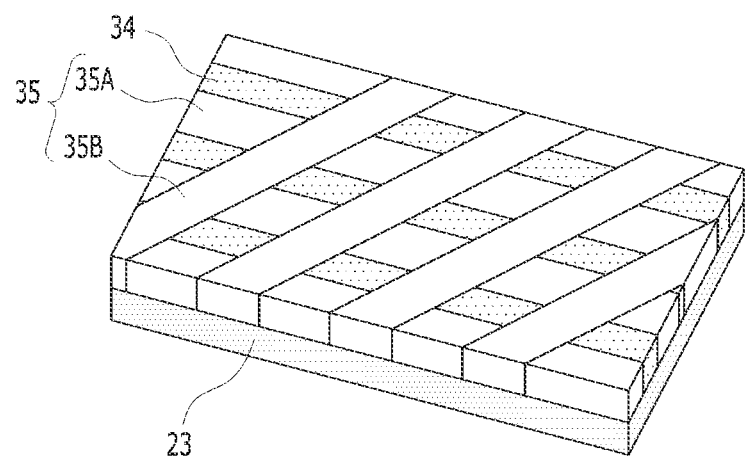

Referring to FIG. 10E, a second pattern sacrificial layer 35B filling the trench 35T may be formed. A planarization process may be performed to form the second pattern sacrificial layer 35B. Accordingly, an upper surface of the second pattern sacrificial layer 35B may be at the same level as an upper surface of the first pattern sacrificial layer 35A. As the second pattern sacrificial layer 35B is formed, the sacrificial insulation layer 34 may be surrounded by the first pattern sacrificial layer 35A and the second pattern sacrificial layer 35B. The first pattern sacrificial layer 35A and the second pattern sacrificial layer 35B may constitute the pattern sacrificial layer 35. The first pattern sacrificial layer 35A and the second pattern sacrificial layer 35B may be of the same material. The second pattern sacrificial layer 35B may include oxide, nitride, or a combination thereof. According to an embodiment of the present invention, the second pattern sacrificial layer 35B may include nitride.

Figure 10F:
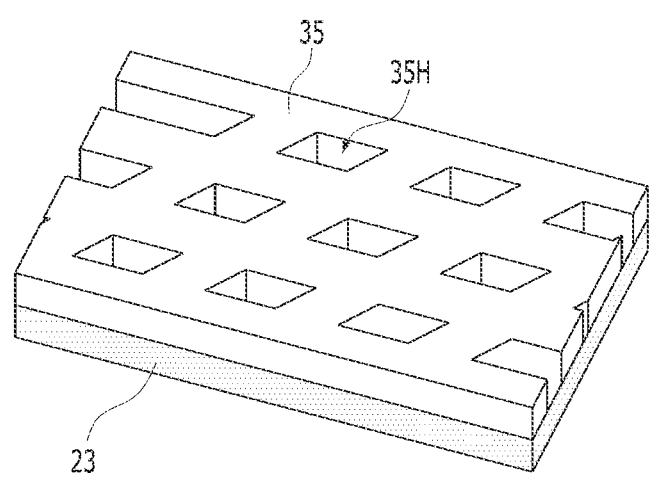

Referring to FIG. 10F, the sacrificial insulation layer 34 may be removed. Accordingly, pattern openings 35H may be formed. Accordingly, the insulation layer 23 at the highest level, the memory material 31A, the channel material 32A, and the first channel protection layer 33 may be partially exposed. The pattern openings 35H may have a shape surrounded by the pattern sacrificial layer 35.

Figure 10G:
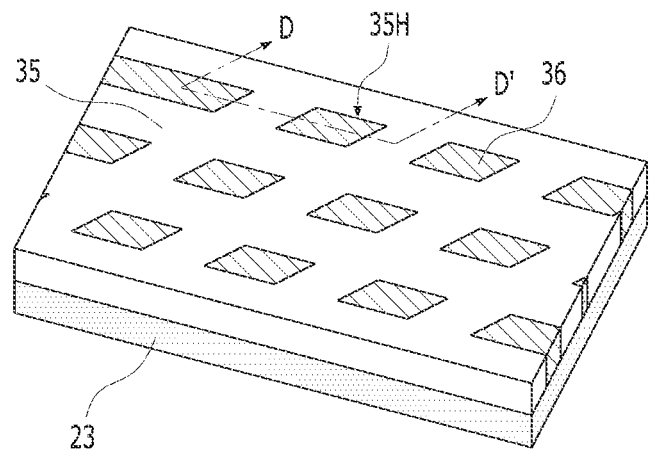

Referring to FIG. 10G, the pattern openings 35H may be filled with the semiconductor layer 36. A planarization process may be performed to form the semiconductor layer 36. An upper surface of the semiconductor layer 36 may be at the same level as an upper surface of the pattern sacrificial layer 35. The semiconductor layer 36 may include a semiconductor material. The semiconductor layer 36 may include polysilicon. The semiconductor layer 36 may include polysilicon doped with impurities. A cross-sectional view taken along line D-D' of FIG. 10G may be same as the cell region DC of FIG. 9.

Figure 11:
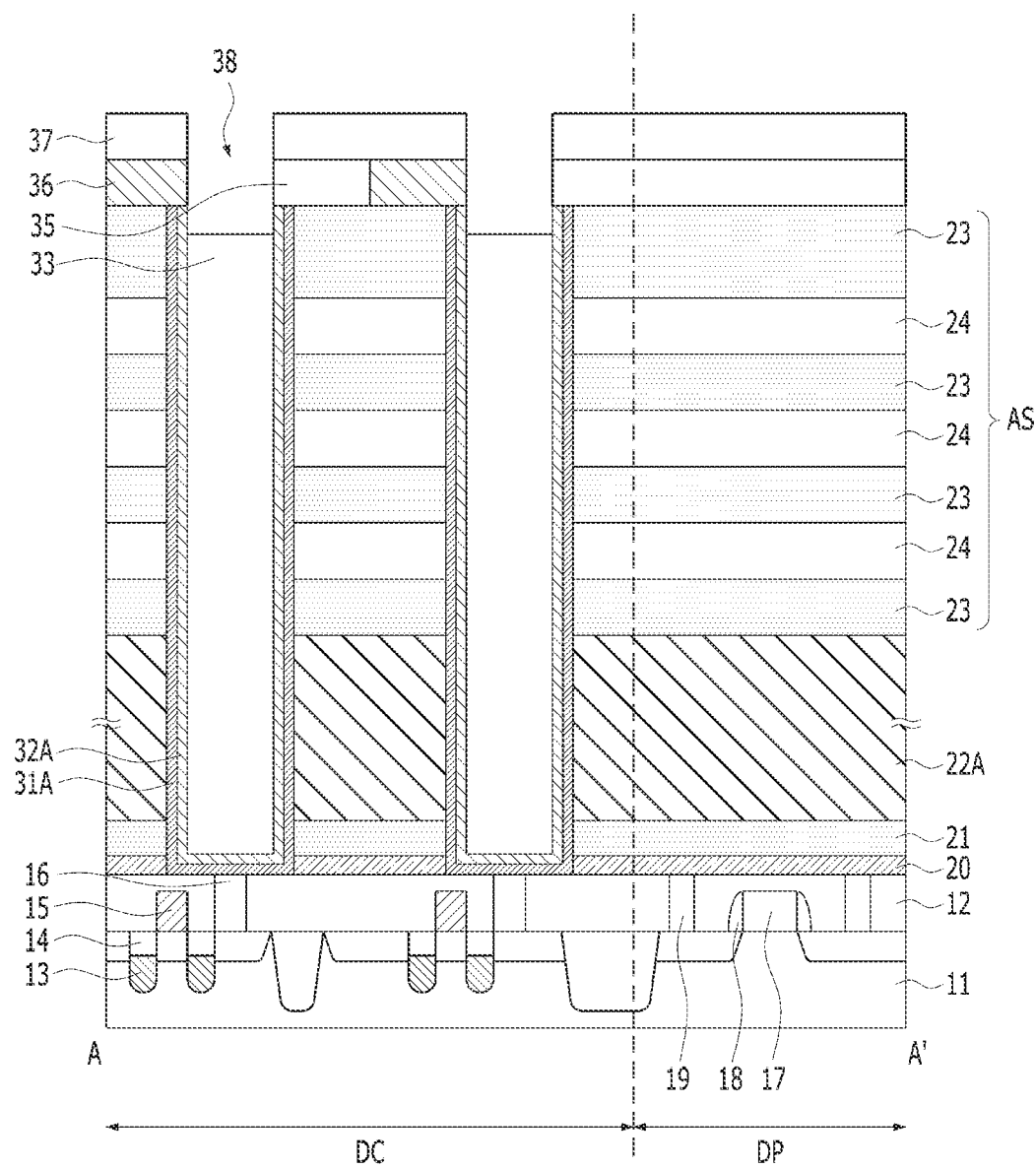

Subsequently, referring to FIG. 11, a first mask 37 may be formed on the semiconductor layer 36 and the pattern sacrificial layer 35. The first mask 37 may include a photoresist. An upper surface of the first channel protection layer 33 may be partially etched using the first mask 37 as an etching mask. Accordingly, a second opening 38 may be formed, As the second opening 38 is formed, an upper sidewall of the channel material 32A may be partially exposed. As the second opening 38 is formed, upper sidewalls of the semiconductor layer 36 and the pattern sacrificial layer 35 may be partially exposed. The first mask 37 may be removed after forming the second opening 38.

Figure 12:
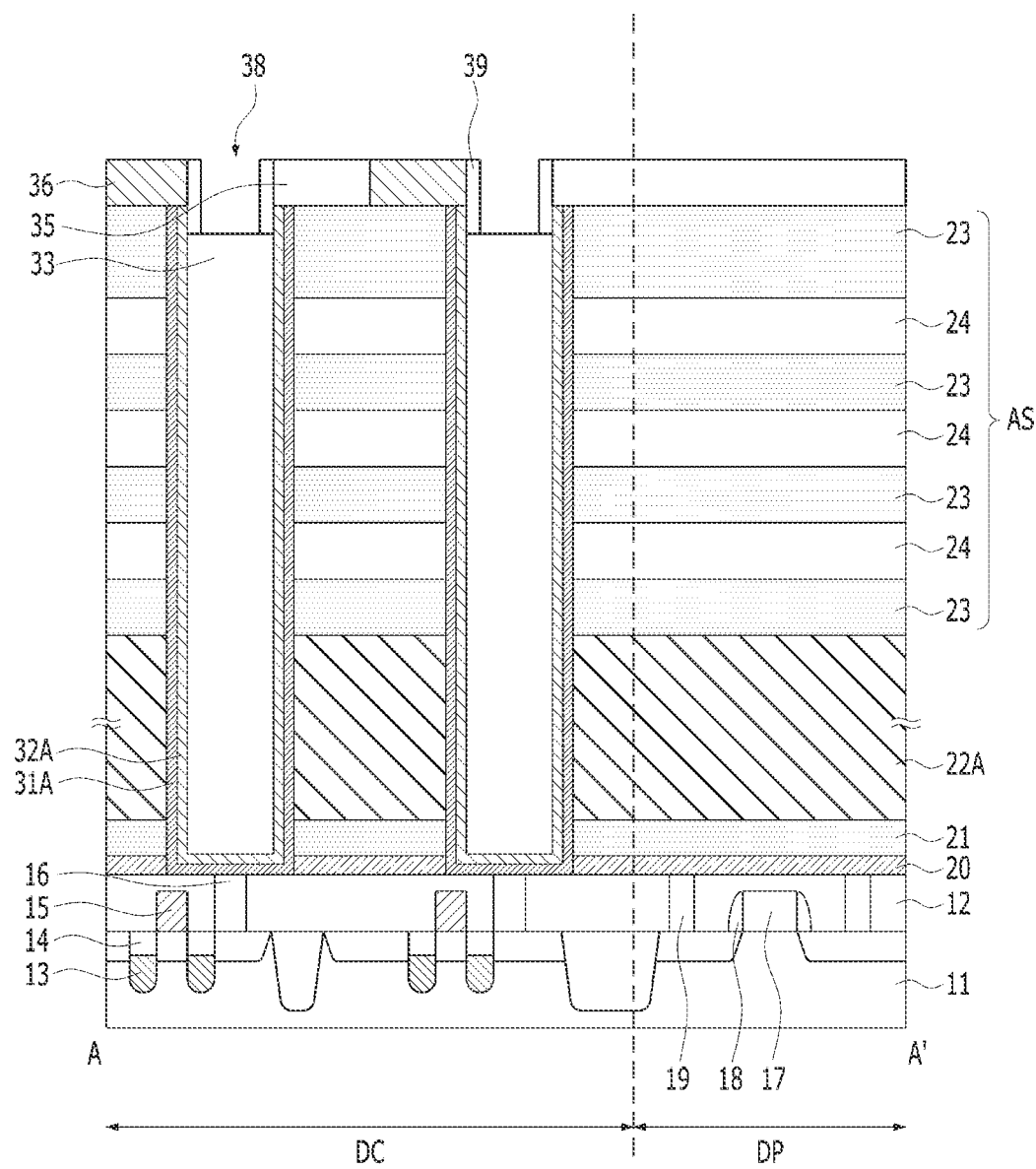

Referring to FIG. 12, a second channel protection layer 39 covering a sidewall of the second opening 38 may be formed. The second channel protection layer 39 may be formed on the first channel protection layer 33. The second channel protection layer 39 may cover an upper sidewall of the channel material 32A exposed by the second opening 38. The second channel protection layer 39 may cover sidewalls of the semiconductor layer 36 and the pattern sacrificial layer 35. The second channel protection layer 39 may prevent a damage to the channel material 32A.

The second channel protection layer 39 may be formed through an oxidation process. The second channel protection layer 39 may be formed through a dry oxidation process, In another embodiment of the present invention, the second channel protection layer 39 may be formed by various method, for example, chemical vapor deposition (CVD) or atomic layer deposition (ALD). The second channel protection layer 39 may include oxide.

Figure 13:
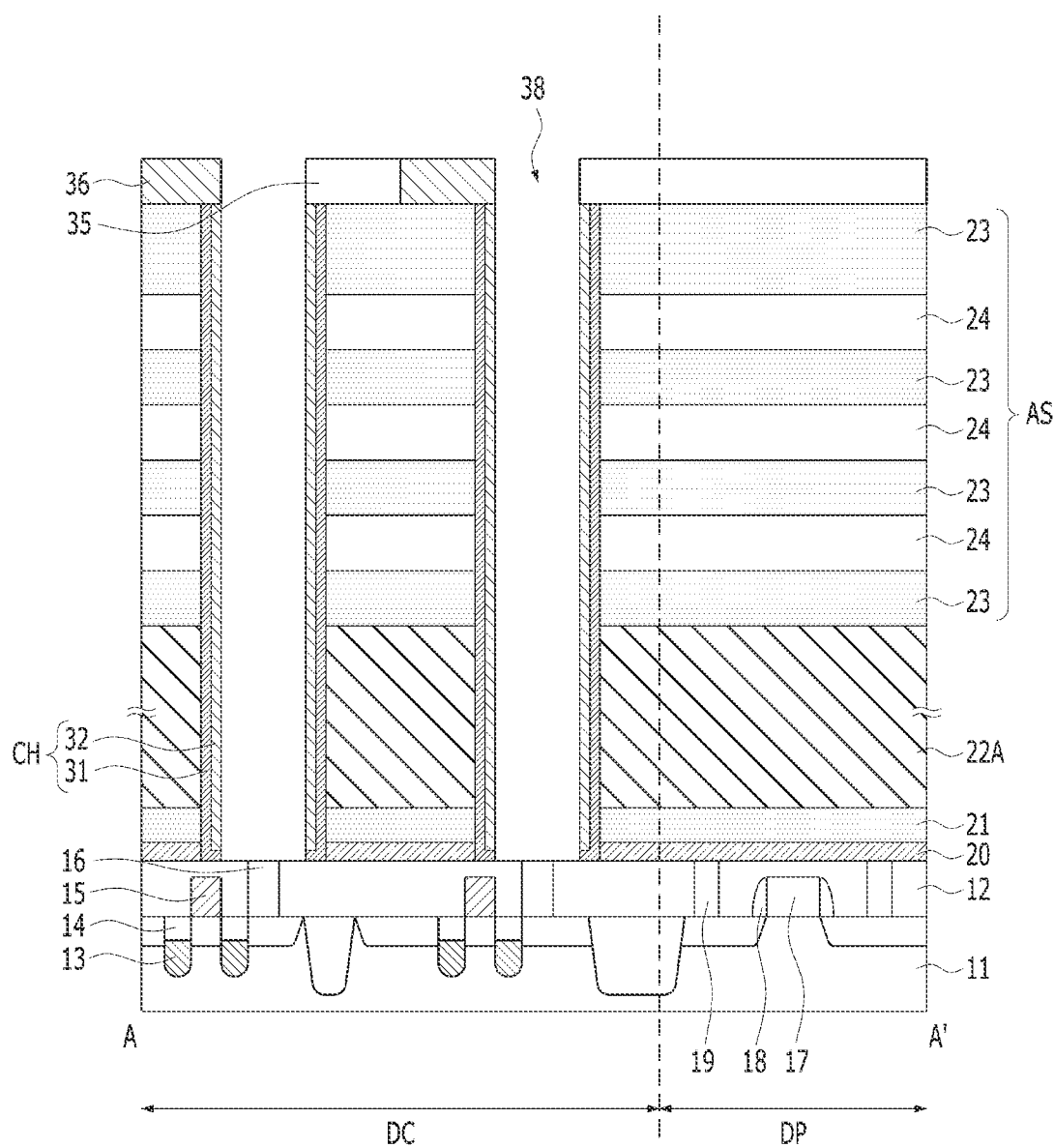

Referring to FIG. 13, the first channel protection layer 33 and the second channel protection layer 39 may be removed, A dip-out process may be performed to remove the first channel protection layer 33 and the second channel protection layer 39. The first channel protection layer 33 and the second channel protection layer 39 may be removed without loss of the channel material 32A through a deep-out process.

Subsequently, the second opening 38 may be expanded to expose the contact plug 16 by removing bottom surfaces of the channel material 32A, the channel protection material 33A, the channel material 32A, and the memory material 31A. A width of the second opening 38 may decrease along an upper level to a lower level. A width of the second opening 38 may be the same at an upper level and at a lower level. Accordingly, bottom surfaces of the memory material 31A and the channel material 32A may partially remain. As the second opening 38 is expanded, an upper surface of the interlayer insulation layer 12 may be partially exposed again. A wet-widening process may be performed to expand the second opening 38.

As bottom surfaces of the channel material 32A and the memory material 31A are removed, a channel layer 32 and a memory layer 31 may be formed. The channel layer 32 and the memory layer 31 may constitute the channel structure CH. The channel structure CH may be referred to as a 'vertical channel structure'.

The memory layer 31 may include a multilayer structure, each layer of the memory layer 31 including a different material. The memory layer 31 may include a multilayer structure stacked at least three times or more. According to an embodiment of the present invention, the memory layer 31 may include an oxide-nitride-oxide (ONO) structure. A channel layer 32 may be formed on the memory layer 31. The channel layer 32 may cover a sidewall of the memory layer 31. The channel layer 32 may not contact the interlayer insulation layer 12. A thickness of the channel layer 32 may be smaller than that of the memory layer 31. The channel layer 32 may provide a conductive path for an electric charge.

Figure 14:
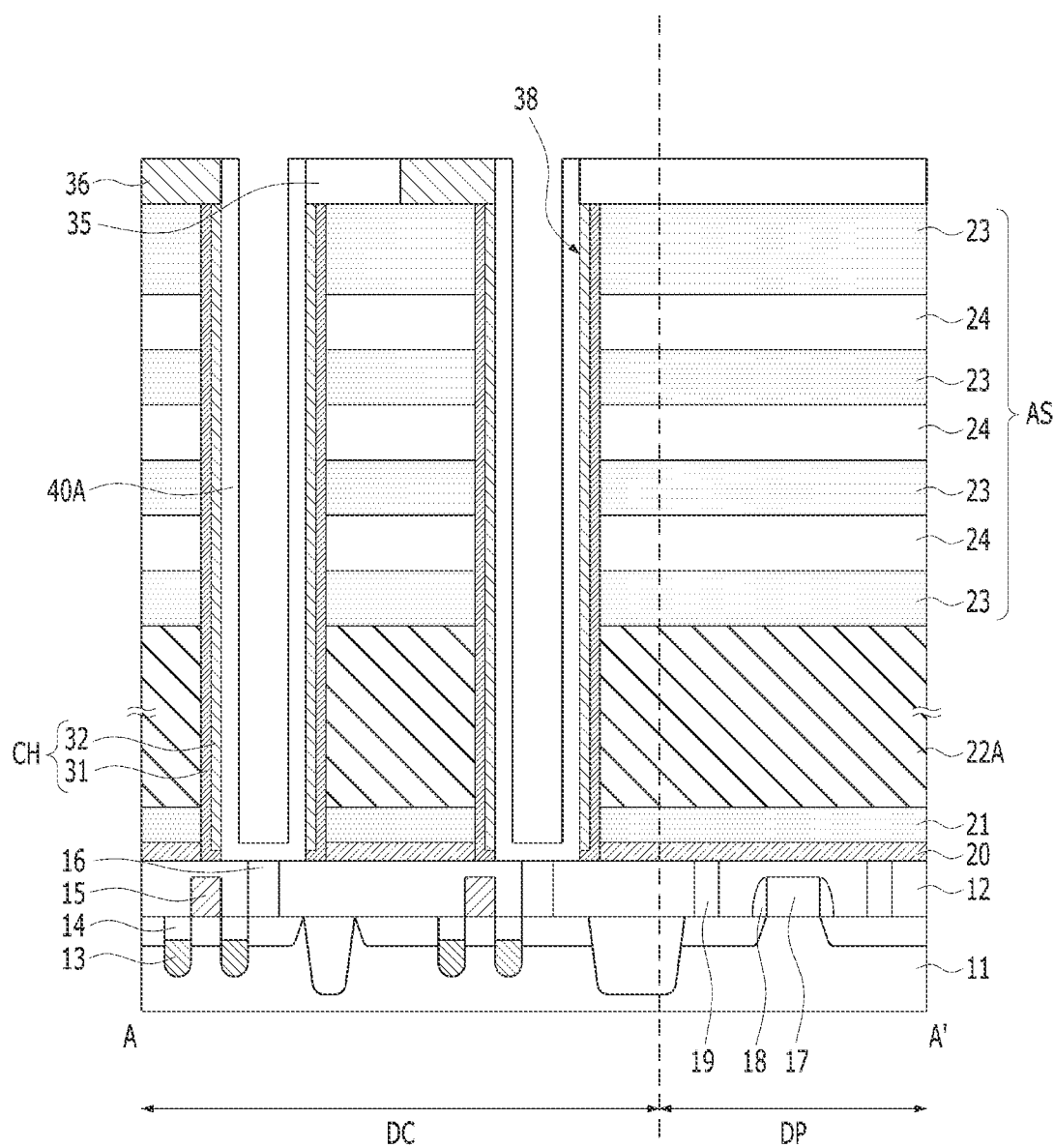

As shown in FIG. 14, a first separation material 40A may be formed on the channel layer 32.

The first separation material 40A may cover a sidewall and a bottom surface of the second opening 38. The first separation material 40A may cover exposed surfaces of the interlayer insulation layer 12 and the contact plug 16. The height of the first separation material 40A may be equal to or higher than the height of the channel layer 32. A thickness of the first separation material 40A may be larger than that of the channel layer 32. A thickness of the first separation material 40A may be larger than that of the memory layer 31, The first separation material 40A may be formed by a CVD or an ALD process. A planarization process may be performed to form the first separation material 40A. The planarization process may include a polishing process (CMP) or an etch-back process. As the planarization process is performed, the first separation material 40A may be disposed only in the second opening 38.

The first separation material 40A may include an insulating material. The first separation material 40A may include oxide, nitride, or a combination thereof. The first separation material 40A may include silicon oxide, silicon nitride, silicon oxynitride, or a combination thereof.

Figure 15:
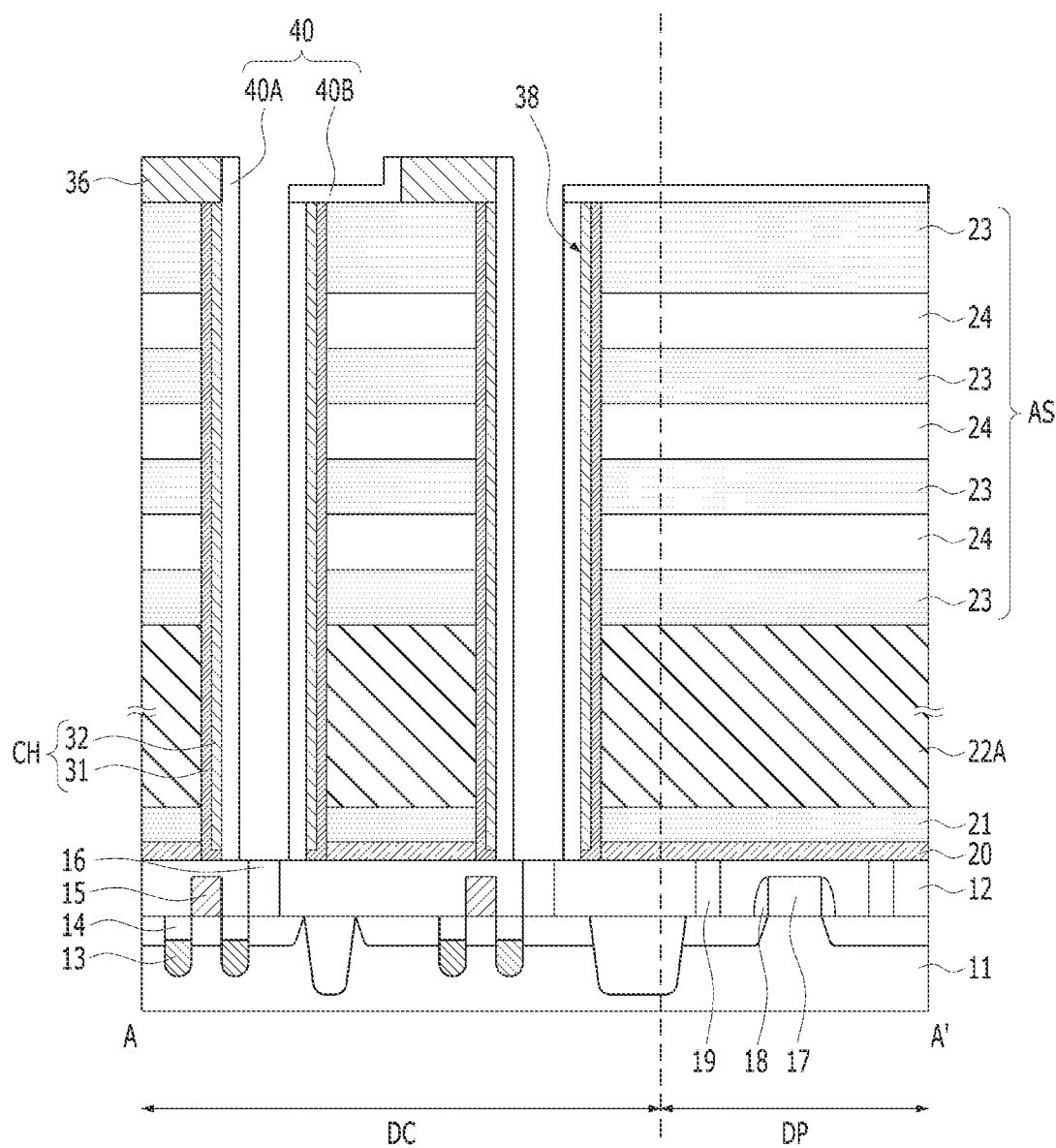

As shown in FIG. 15, the pattern sacrificial layer 35 and the first separation material 40A may be partially removed, A deep-out process may be performed to remove the pattern sacrificial layer 35 and the first separating material 40A in contact with the pattern sacrificial layer 35. As the pattern sacrificial layer 35 and the first separating material 40A in contact with the pattern sacrificial layer 35 are removed, an upper surface of the alternating stack AS may be partially exposed.

A second separation material 40B may be formed to cover an exposed upper surface of the alternating stack AS which resulted from removing the pattern sacrificial layer 35 and an exposed sidewall of the semiconductor layer 36. The second separation material 403 may be formed conformally along exposed surfaces. The second separation material 403 may be connected to the first separation material 40A. The first separation material 40A and the second separation material 40B may include the same material. The first separation material 40A may include an insulating material. The second separation material 40B may include oxide, nitride, or a combination thereof. The second separation material 40B may include silicon oxide, silicon nitride, silicon oxynitride, or a combination thereof.

Subsequently, a bottom surface of the first separation material 40A may be removed. Accordingly, an upper surface of the contact plug 16 may be exposed again, The first separation material 40A and the second separation material 403 may constitute a separation layer 40. The separation layer 40 may cover a sidewall of the second opening 38, a sidewall of the semiconductor layer 36, an upper surface of the channel structure CH, and the insulation layer 23 at the highest level, but may not cover an upper portion of the contact plug 16. A height of the separation layer 40 may be same as a height of the semiconductor layer 36, The separation layer 40 may electrically insulate the channel structure CH.

Figure 16:
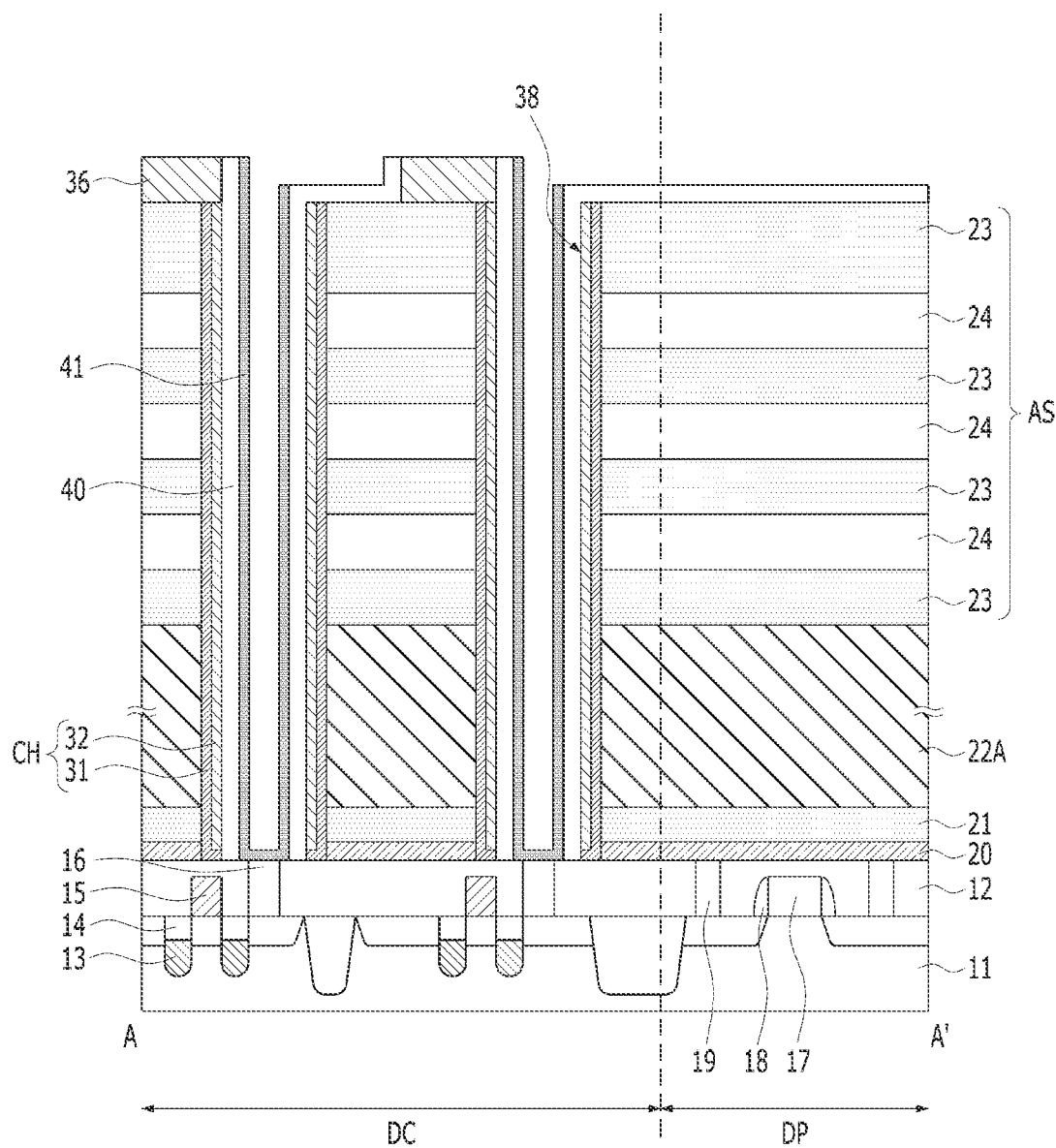

As shown in FIG. 16, a storage node 41 covering a sidewall of the separation layer 40 and a bottom surface of the second opening 38 may be formed, The storage node 41 may cover an upper surface of the contact plug 16, The storage node 41 may extend from an upper surface of the contact plug 16 to cover exposed surfaces of the separation layer 40. Accordingly, the storage node 41 may cover all exposed surfaces of the separation layer 40. The storage node 41 may be partially removed to expose an upper surface of the semiconductor layer 36. In another embodiment of the present invention, steps for removing the storage node 41 may be performed after the second opening 38 is entirely filled.

The storage node 41 may include a metal layer, metal nitride, or a combination thereof. For example, the storage node 41 may include cobalt (Go), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN), or a combination thereof. The storage node 41 may be formed of titanium nitride. The storage node 41 may include titanium nitride (ALD-TiN) formed through atomic layer deposition.

Figure 17:
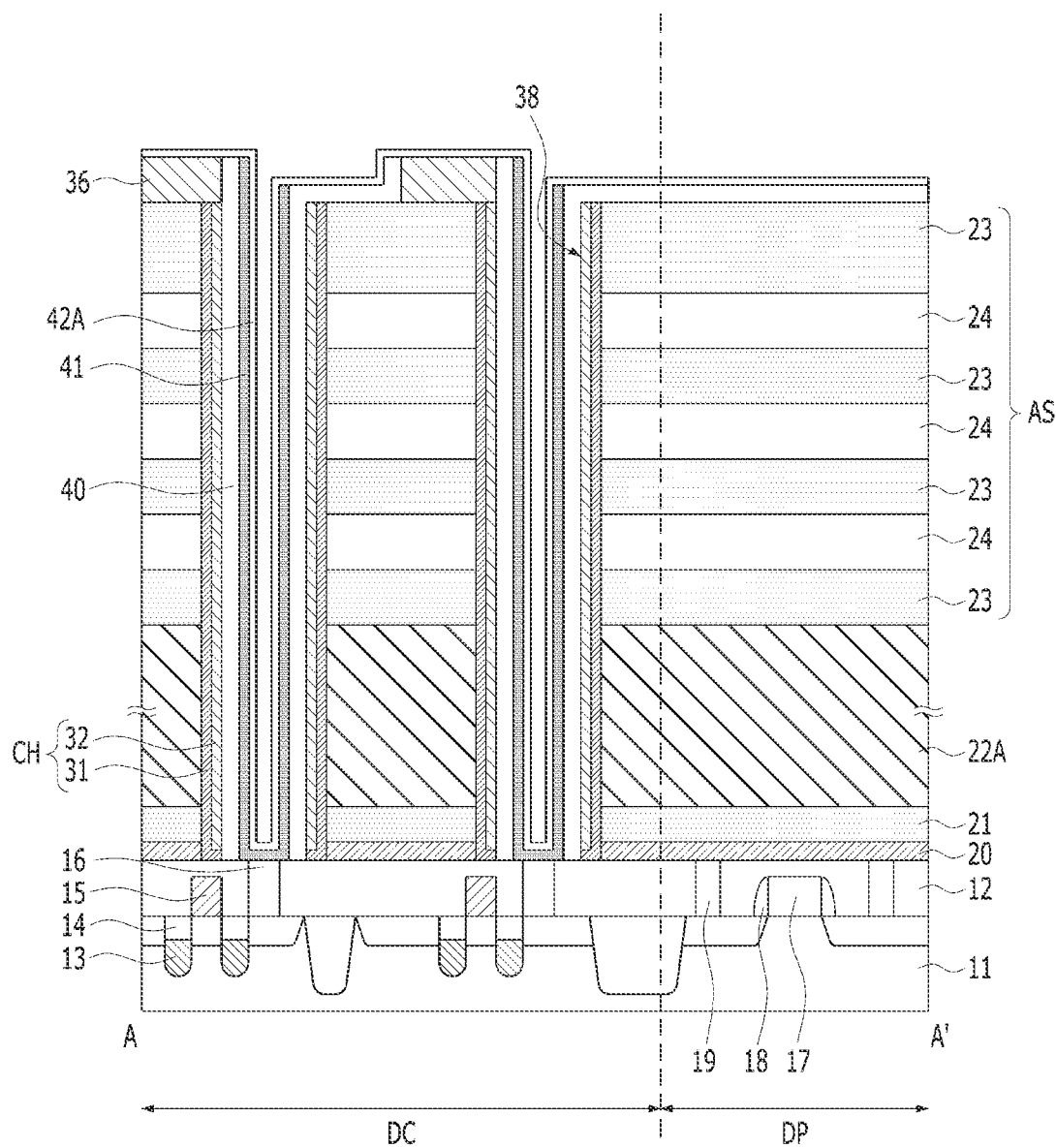

As shown in FIG. 17, a preliminary dielectric layer 42A may be formed on the storage node 41.

A thickness of the preliminary dielectric layer 42A may be smaller than that of the storage node 41. The preliminary dielectric layer 42A may cover an exposed surface of the storage node 41, an upper surface of the separation layer 40, and an upper surface of the semiconductor layer 36. A thickness of the preliminary dielectric layer 42A may be smaller than that of the storage node 41. The preliminary dielectric layer 42A may have a multilayer structure.

The preliminary dielectric layer 42A may include a high dielectric material (High-K). The preliminary dielectric layer 42A may include zirconium oxide, aluminum oxide, hafnium oxide, or a combination thereof, The preliminary dielectric layer 42A may include a ZAZ structure in which a first zirconium oxide, an aluminum oxide, and a second zirconium oxide are stacked.

Figure 18:
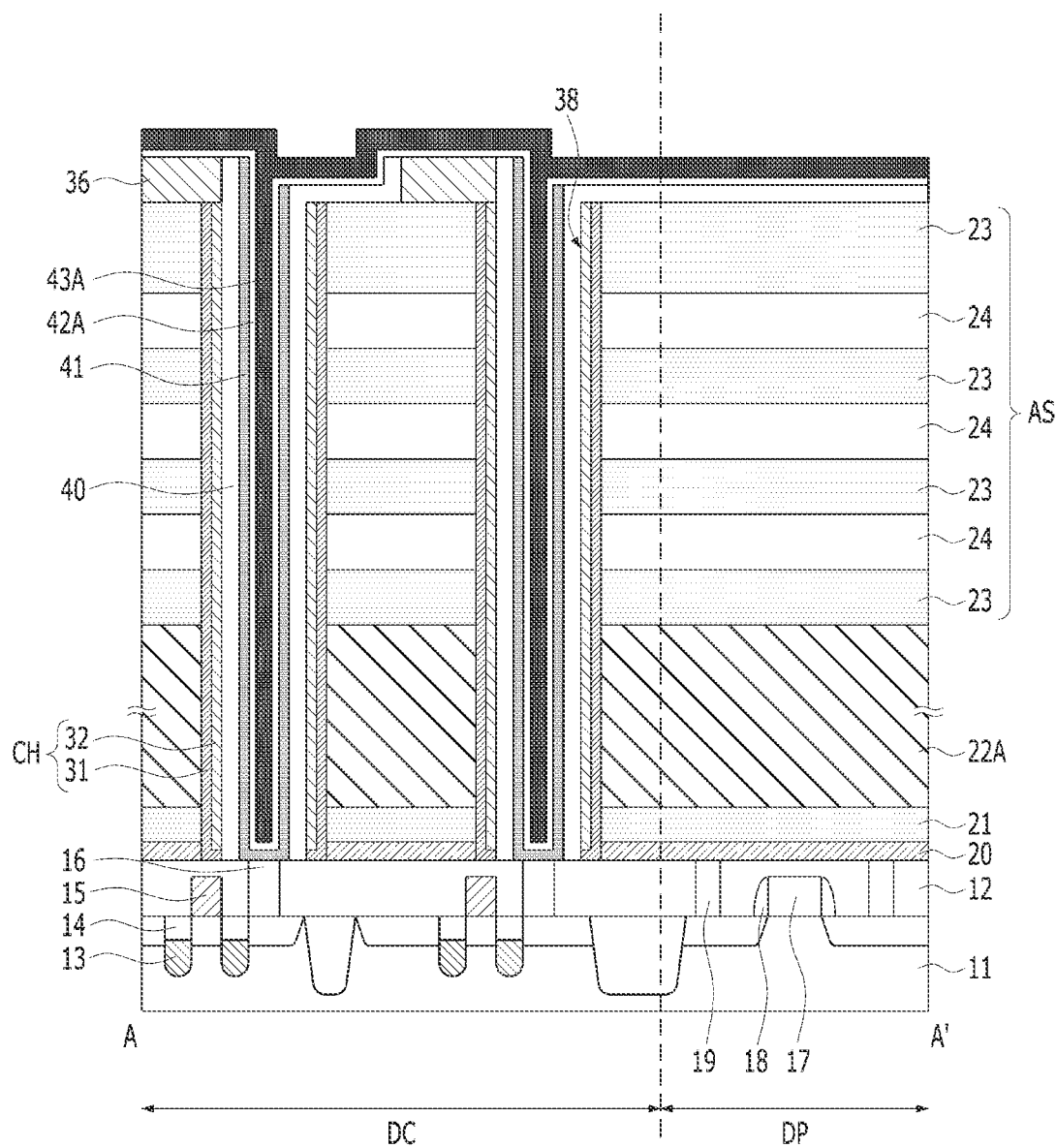

As shown in FIG. 18, a preliminary plate node 43A may be formed on the preliminary dielectric layer 42A. The preliminary plate node 43A may cover an exposed surface of the preliminary dielectric layer 42A. The preliminary plate node 43A relay fill the remaining space of the second opening 38.

The preliminary plate node 43A may include a metal layer, metal nitride, or a combination thereof. The preliminary plate node 43A may include cobalt (Co), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN), or a combination thereof. The preliminary plate node 43A may be formed of titanium nitride. The preliminary plate node 43A may include titanium nitride (ALD-TiN) formed through atomic layer deposition.

Figure 19:
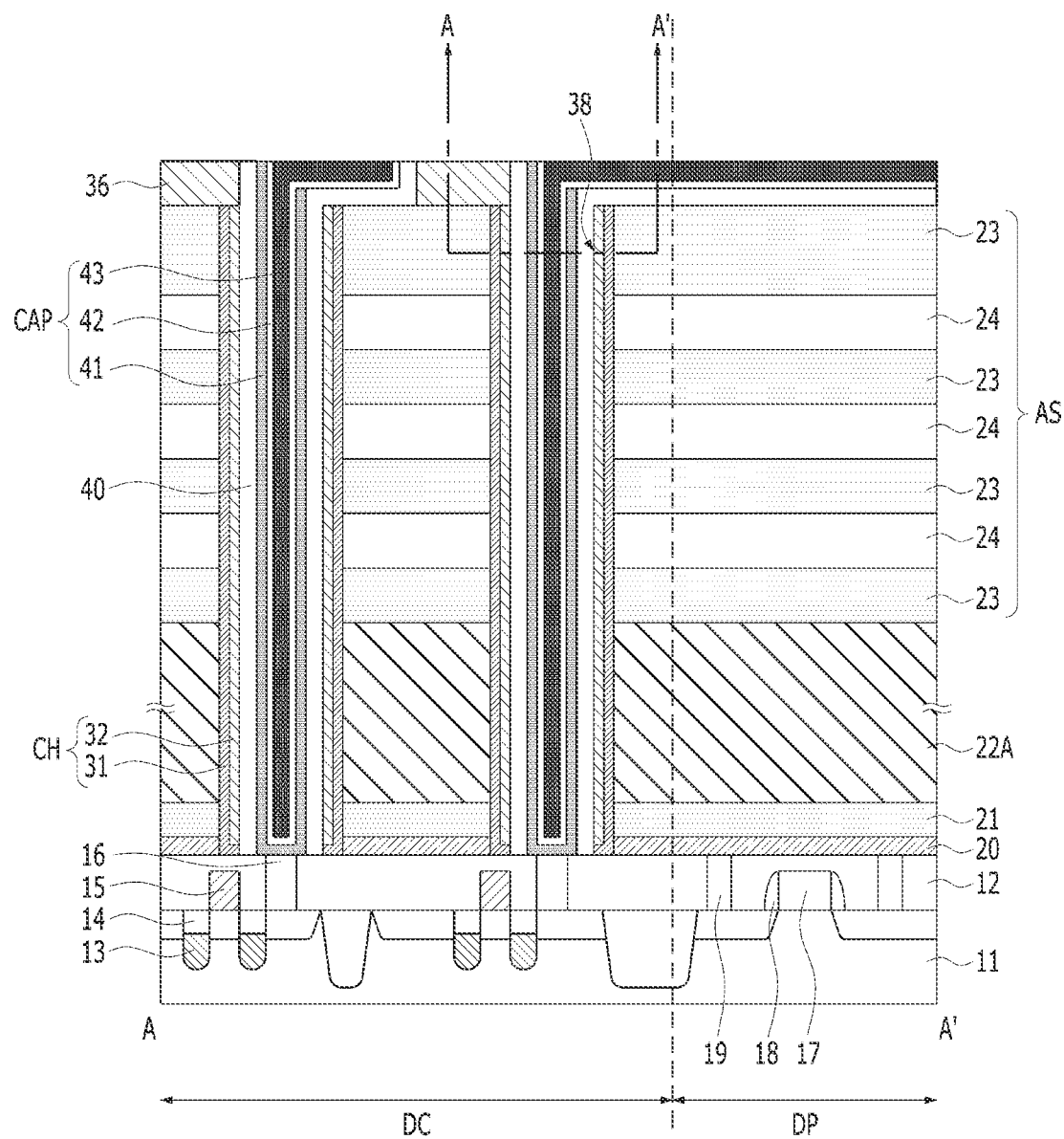

As shown in FIG. 19, portions of the preliminary plate node 43A and the preliminary dielectric layer 42A may be removed. Thus, a plate node 43 and a dielectric layer 42 may be formed. As the plate node 43 and the dielectric layer 42 are formed, upper surfaces of the semiconductor layer 36 and the separation layer 40 may be exposed again.

The plate node 43, the dielectric layer 42, and the storage node 41 may constitute the capacitor CAP. A top view taken along line A-A' of FIG. 19 may be same as FIG. 3. Accordingly, the channel structure CH, the separation layer 40, and the capacitor CAP may be formed in an opening, The capacitor CAP may be surrounded by the channel structure CH. The separation layer 40 may electrically insulate a region between the capacitor CAP and the channel structure CH.

Figure 20:
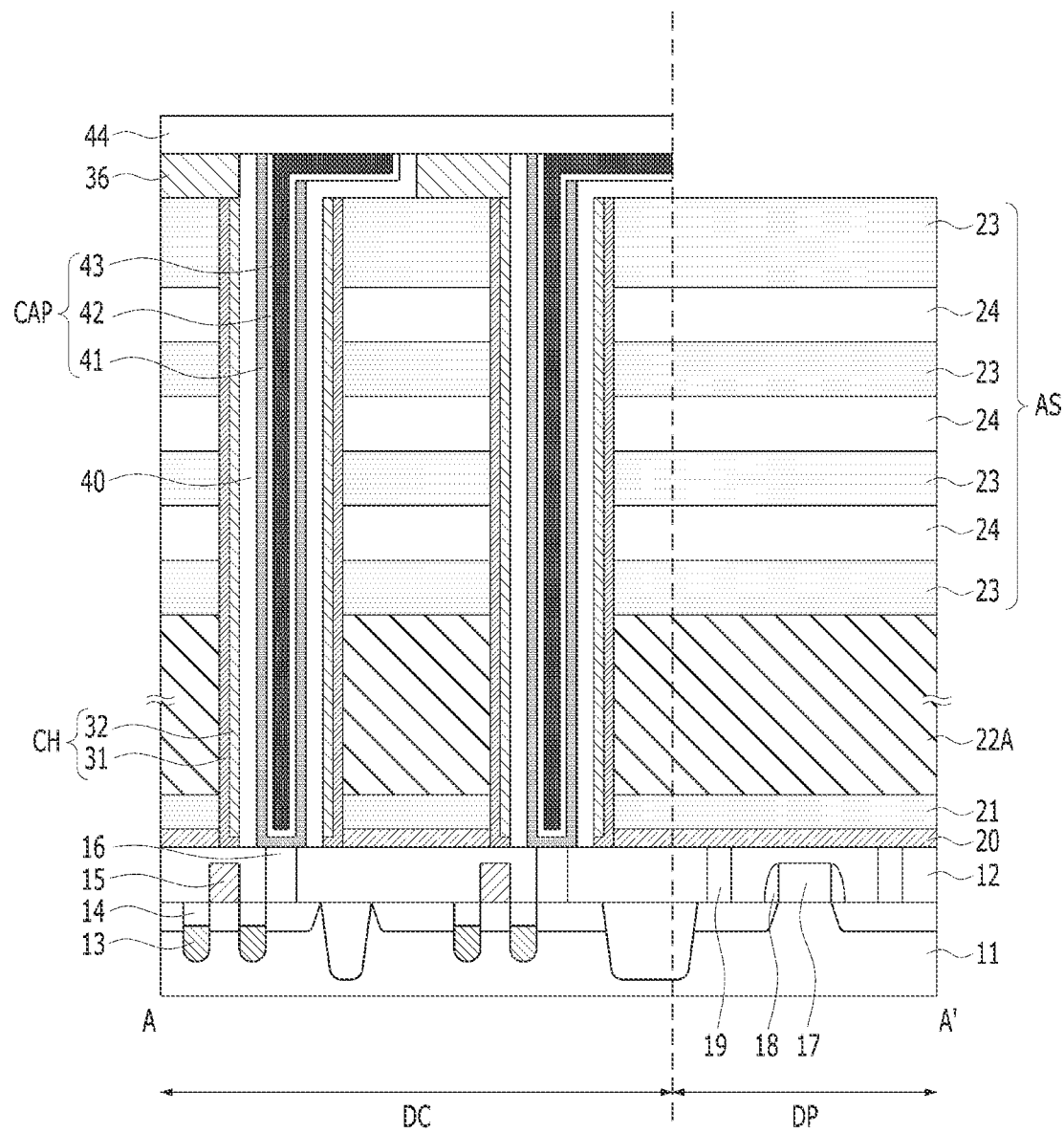

As shown in FIG. 20, a second mask 44 covering only the cell region DC may be formed, The second mask 44 may entirely cover the cell region DC. The plate node 43, the dielectric layer 42, and the isolation layer 40 formed in the peripheral circuit region DP may be removed using the second mask 44 as an etching mask. Accordingly, an upper surface of the alternating stack AS may be exposed in the peripheral circuit region DP. After removing the plate node 43 and the dielectric layer 42 formed in the peripheral circuit region DP, the second mask 44 may be removed.

Figure 21A:
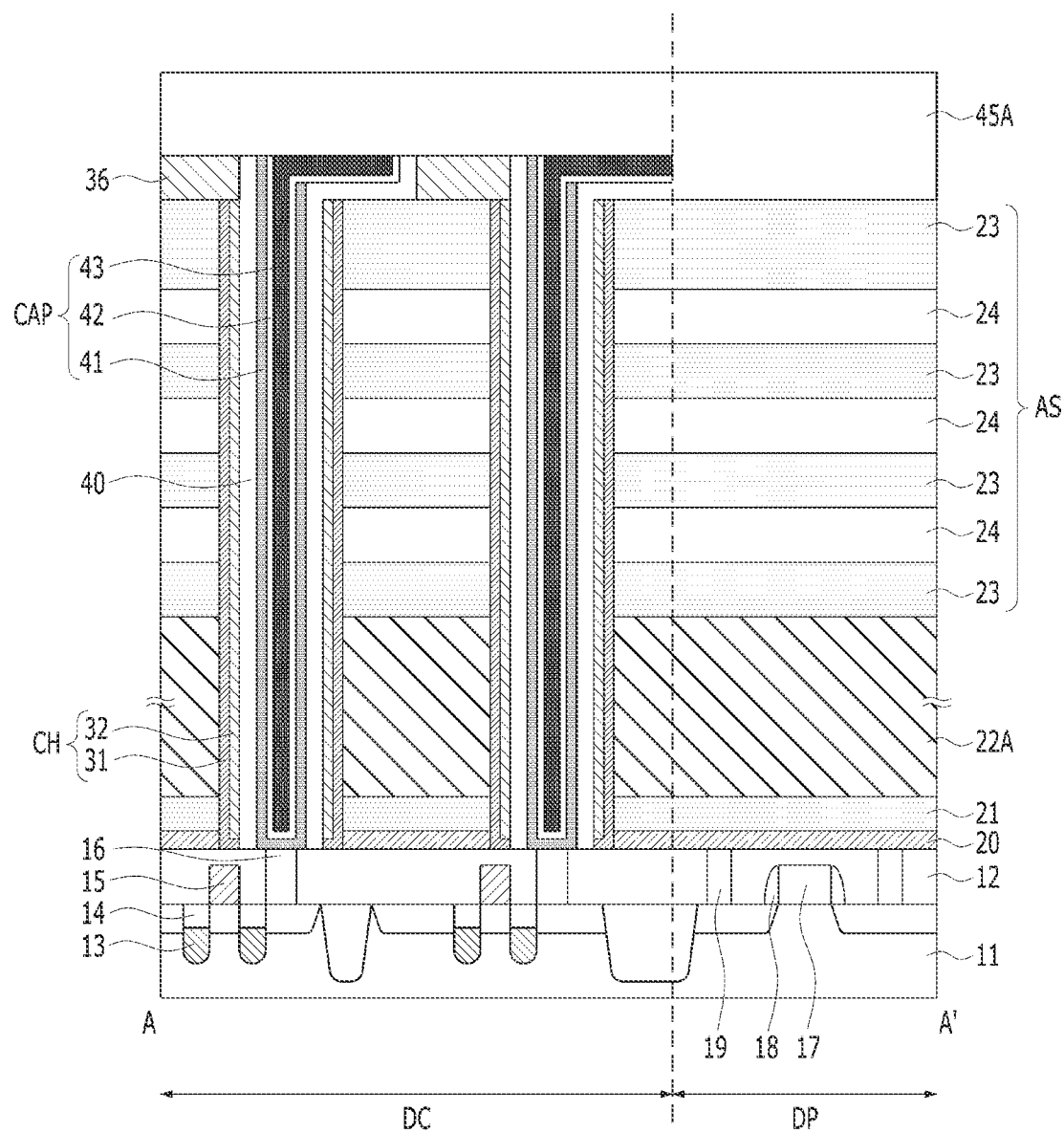
Figure 21B:
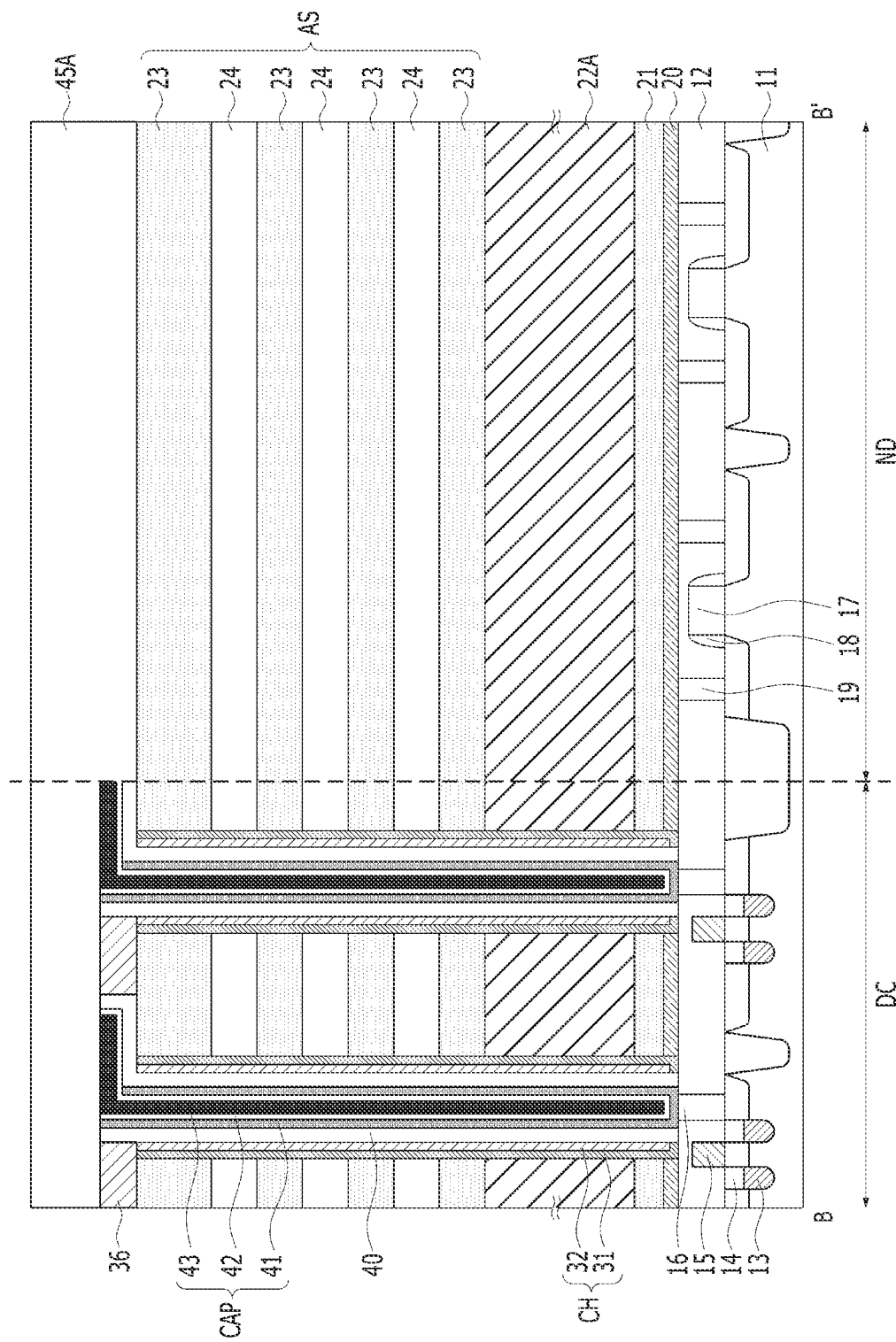

As shown in FIGS. 21A and 21B, a stack such as the peripheral circuit region DP may be formed in the deck region ND. A second capping material 45A covering all of the cell region DC, the peripheral circuit region DP, and the deck region ND may be formed. A thickness of the second capping material 45A may be larger than that of the first capping layer 21. The second capping material 45A may include an insulating material, The second capping material 45A may include oxide, nitride, or a combination thereof. The second capping material 45A may include silicon oxide, silicon nitride, silicon oxynitride, or a combination thereof.

In this embodiment of the present invention, the second capping material 45A may include silicon oxide.

Figure 22A:
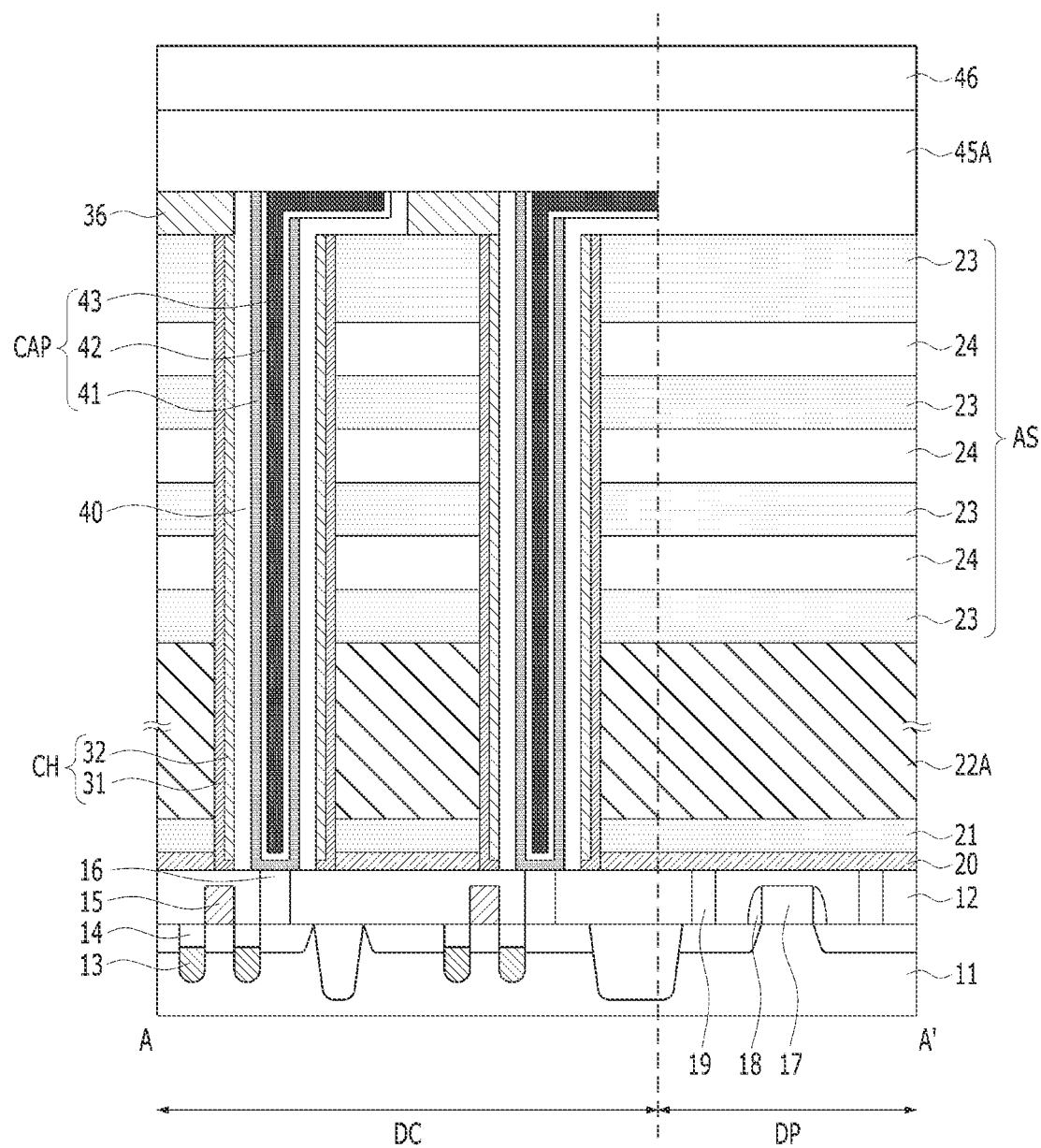
Figure 22B:
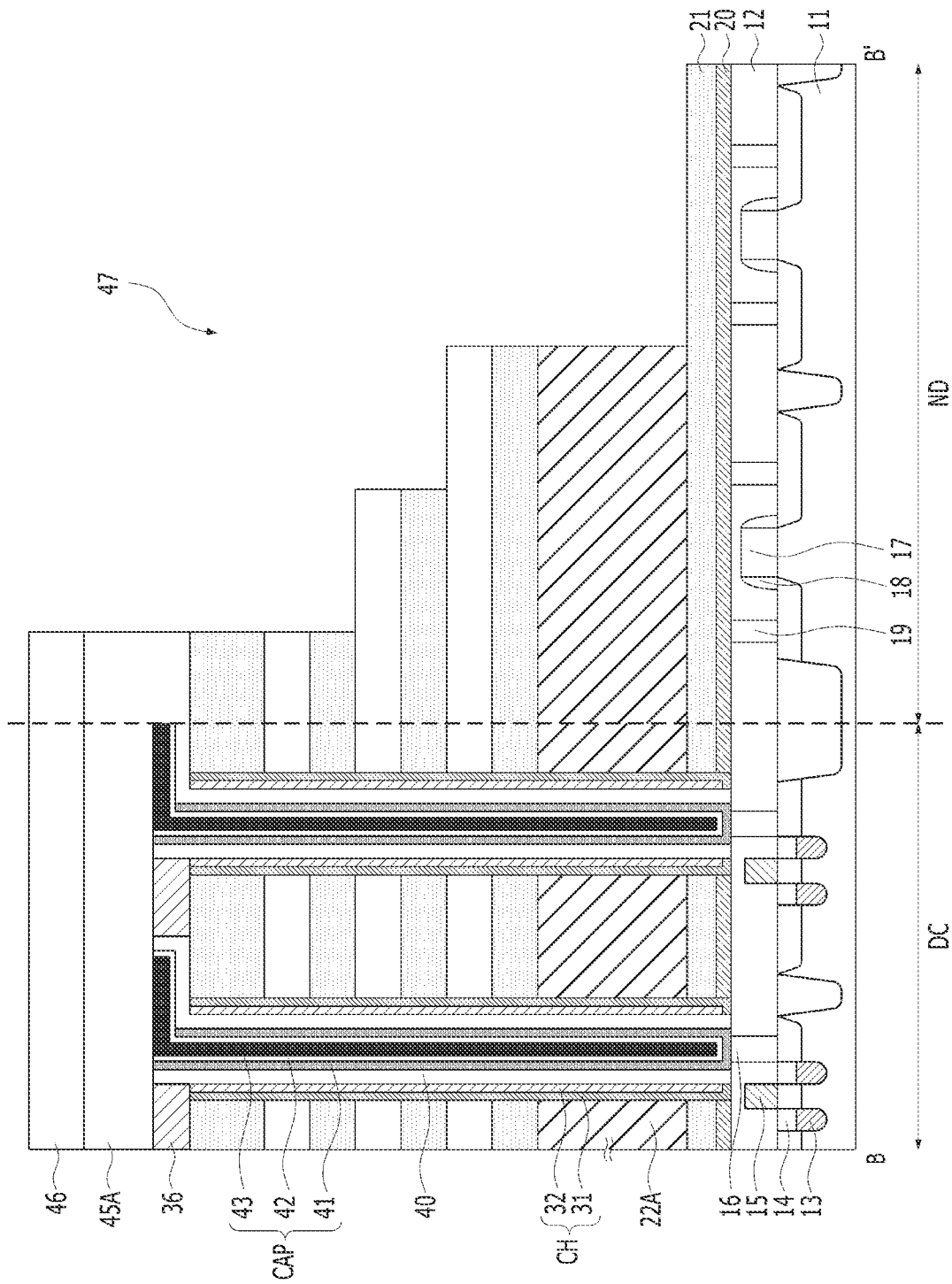

As shown in FIGS. 22A and 22B, a third mask 46 covering both the cell region and the peripheral circuit region DP may be formed. The third mask 46 may partially cover the deck region ND. The third mask 46 may include a photoresist.

The alternating stack AS may be sequentially etched using the third mask 46 as an etching mask. The third mask 46 may include a plurality of masks. The third mask 46 may be used to increase an area exposing the deck region ND. In another embodiment of the present invention, the third mask 46 may be used multiple times while being partially removed through aching using oxygen. That is, the third mask 46 may be trimmed.

Specifically, the insulation layers 23 and the sacrificial layers 24 exposed by the third mask 46 may be etched. The first etching process may be performed from the preliminary source layer 22A to the sacrificial layer 24 at the lowest level, When the first etching process is completed, a trimming process for the third mask 46 may be performed. Accordingly, the third mask 46 may cover the deck region ND having a narrower area than before the trimming. The insulation layers 23 at the second level and the sacrificial layers 24 at the second level may be etched using the trimmed third mask 46, By repeating a process of trimming and etching as described above, the alternating stack AS of a step-shape may be formed as shown in FIG. 22B. The insulation layers 23 and the sacrificial layers 24 may form a plurality of steps as shown in FIG. 22B. An upper surface of the sacrificial layers 24 may be partially exposed as the alternating stack AS of a step-shape is formed in the deck region ND. A third opening 47 may be formed to partially expose an upper surface of the sacrificial layers 24. The number of steps may vary depending on how many times alternating stacks AS are stacked. The third mask 46 may be removed after IS forming the third opening 47.

Figure 23A:
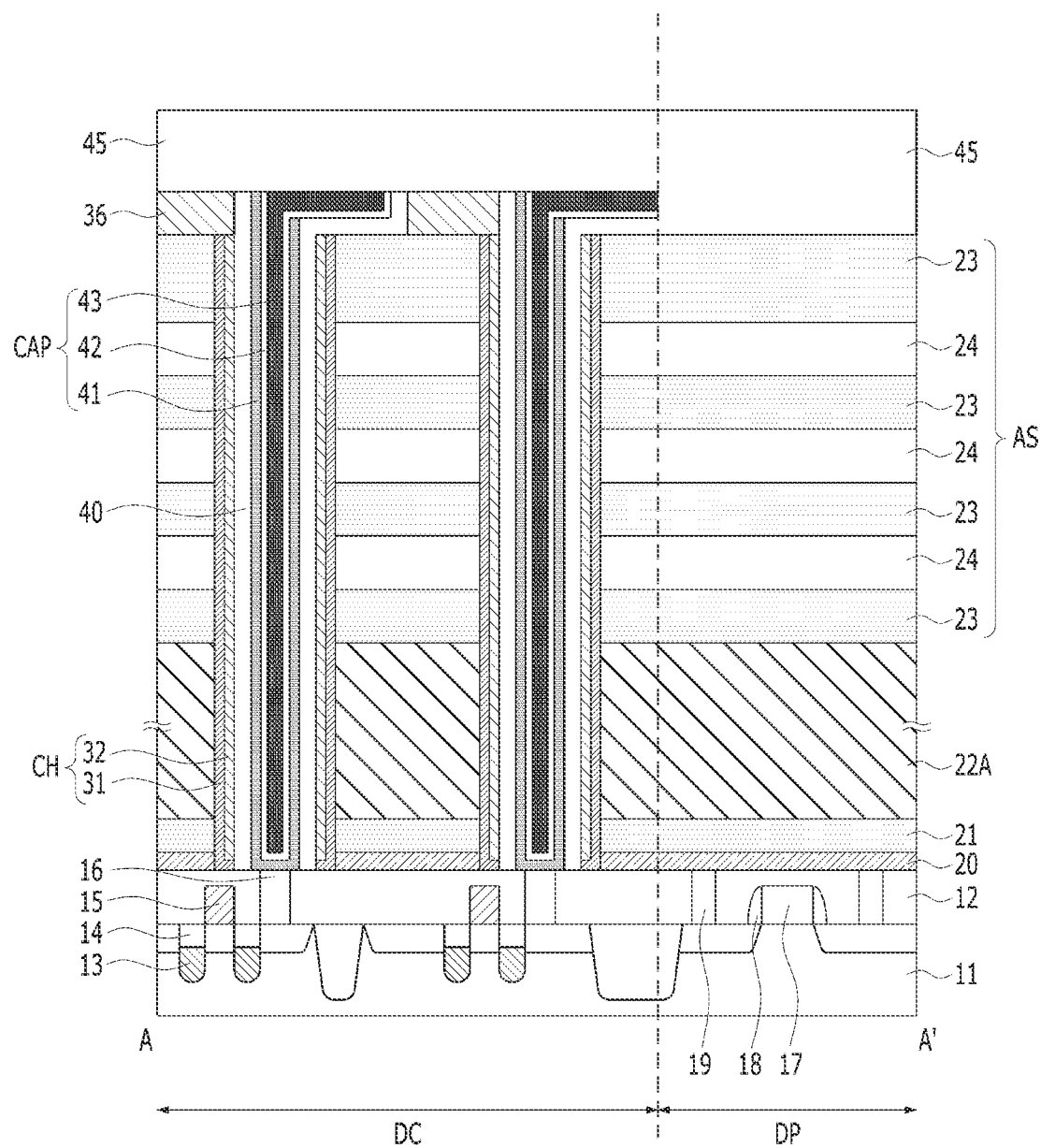
Figure 23B:
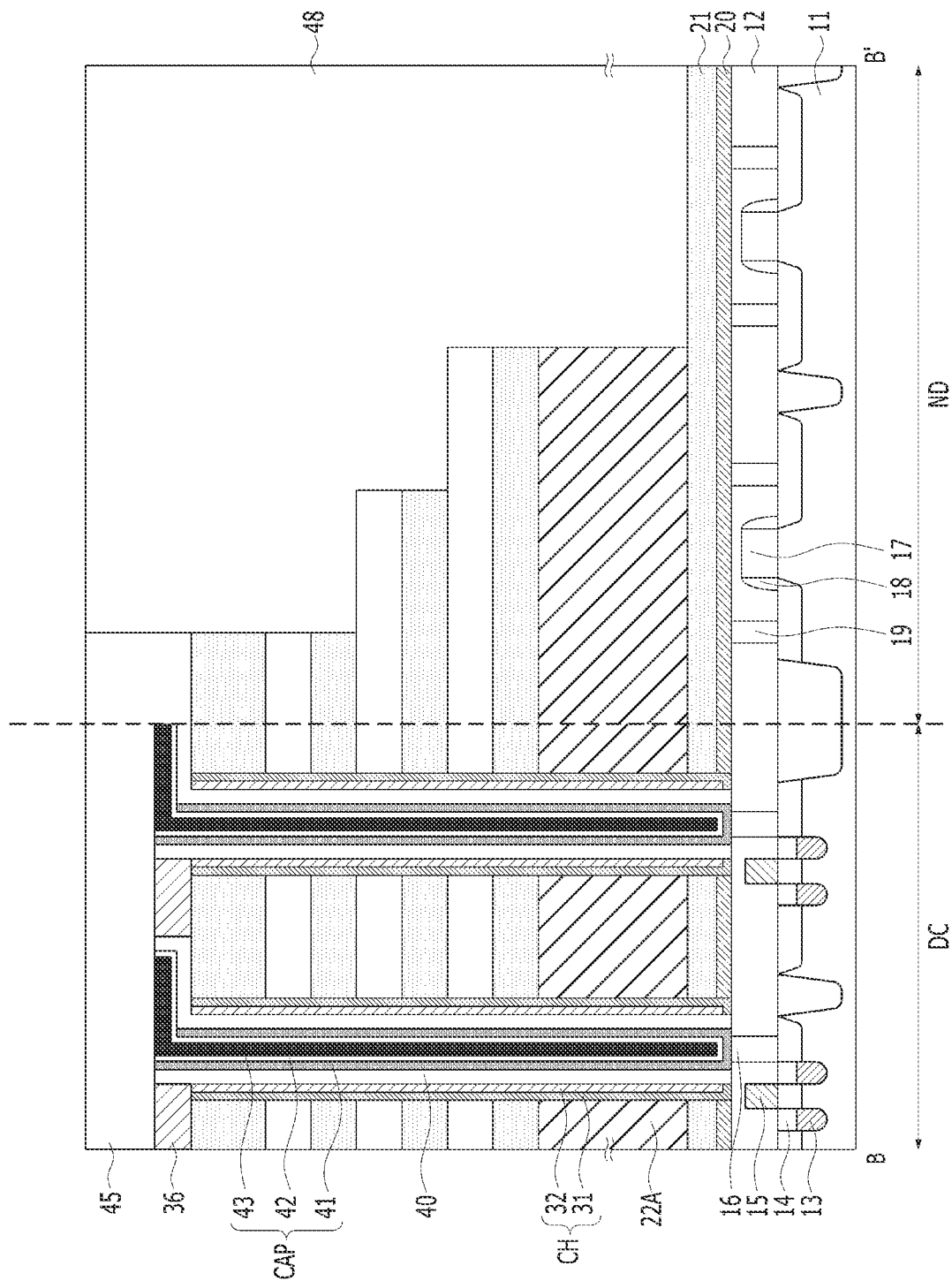

As shown in FIGS. 23A and 23B, a fourth capping layer 48 filling the third opening 37 in the deck region ND may be formed. After forming a capping material to form the fourth capping layer 48, a planarization process may be performed. An upper surface of the fourth capping layer 48 may be at the same level as an upper surface of the second capping layer 45. A thickness of the fourth capping layer 48 may be larger than that of the second capping layer 45. The fourth capping layer 48 may include oxide, nitride, or a combination thereof. The fourth capping layer 48 may include silicon oxide, silicon nitride, silicon oxynitride, or a combination thereof. In the embodiment of the present invention, the fourth capping layer 48 may include silicon oxide.

Figure 24A:
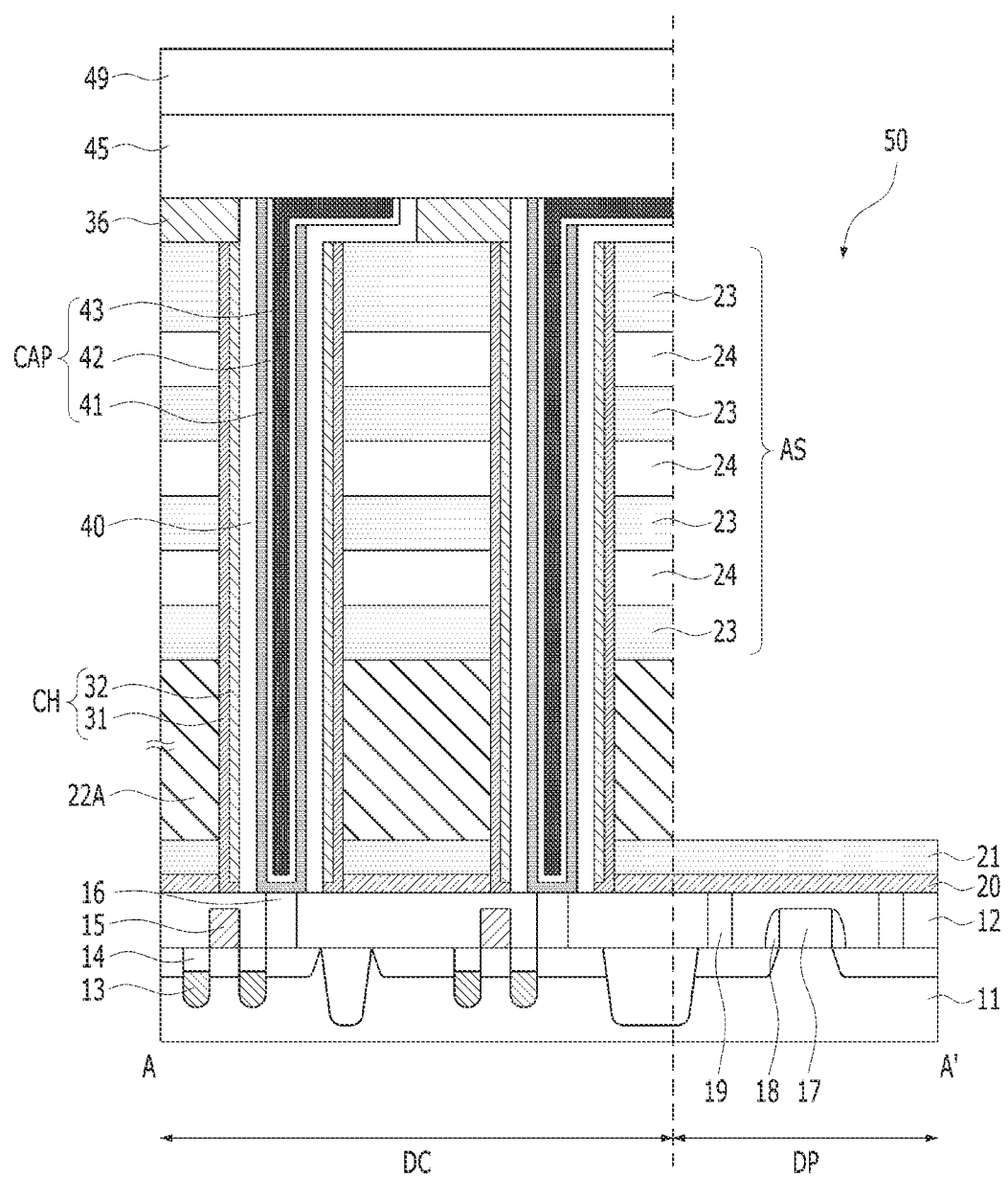
Figure 24B:
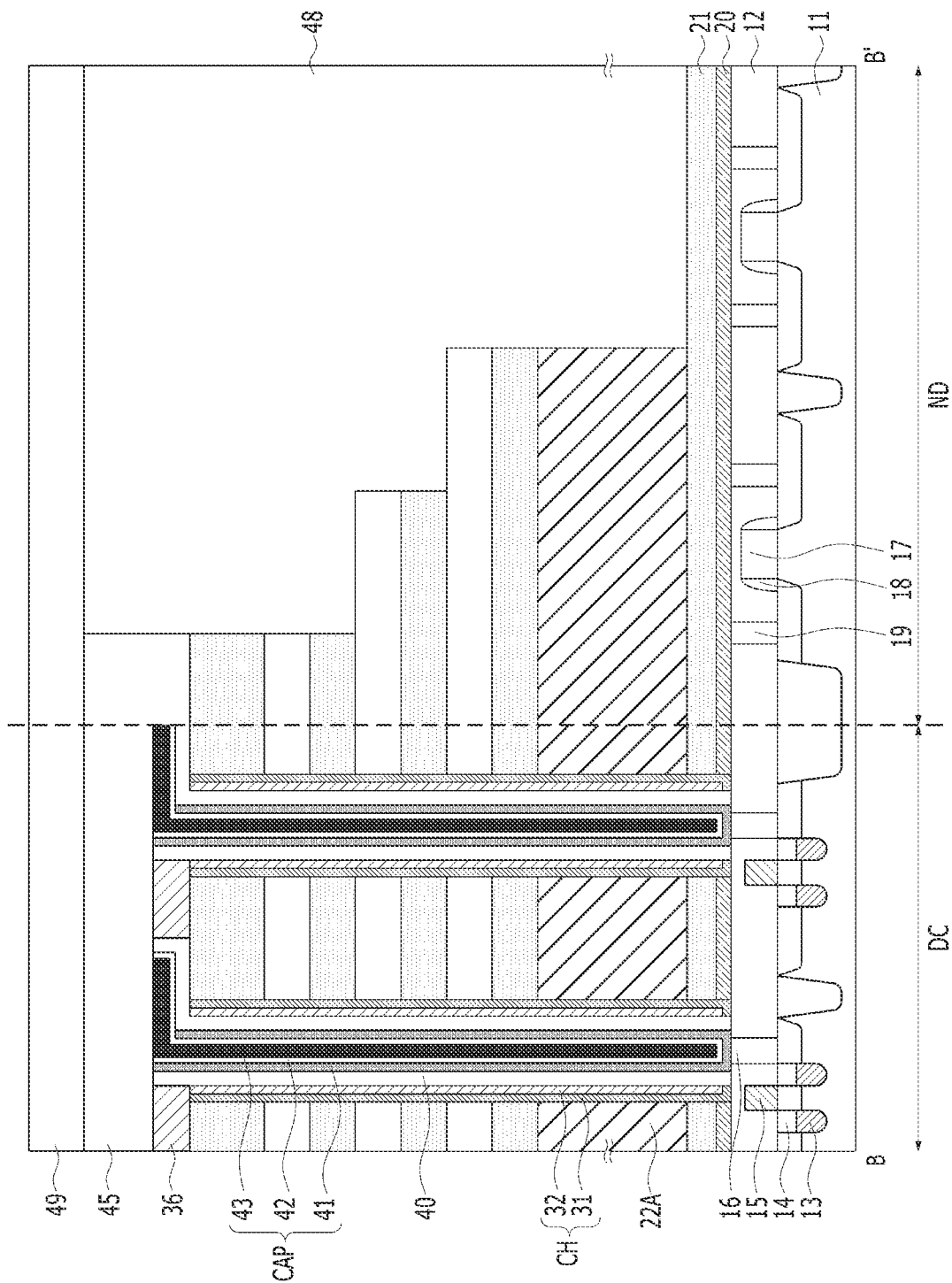

As shown in FIGS. 24A and 24B, a fourth mask 49 may be formed to cover the cell region DC and the deck region ND. The fourth mask 49 may expose the peripheral circuit region DP. The fourth mask 49 may include a photoresist. The second capping layer 45, the alternating stack AS, and the preliminary source layer 22A in the peripheral circuit region DP may be removed by using the fourth mask 49 as an etching mask. Accordingly, the first capping layer 21 in the peripheral circuit region DP may be exposed. A fourth opening 50 exposing the first capping layer 21 may be formed in the peripheral circuit region DP. The fourth mask 49 may be removed after the fourth opening 50 is formed.

Figure 25A:
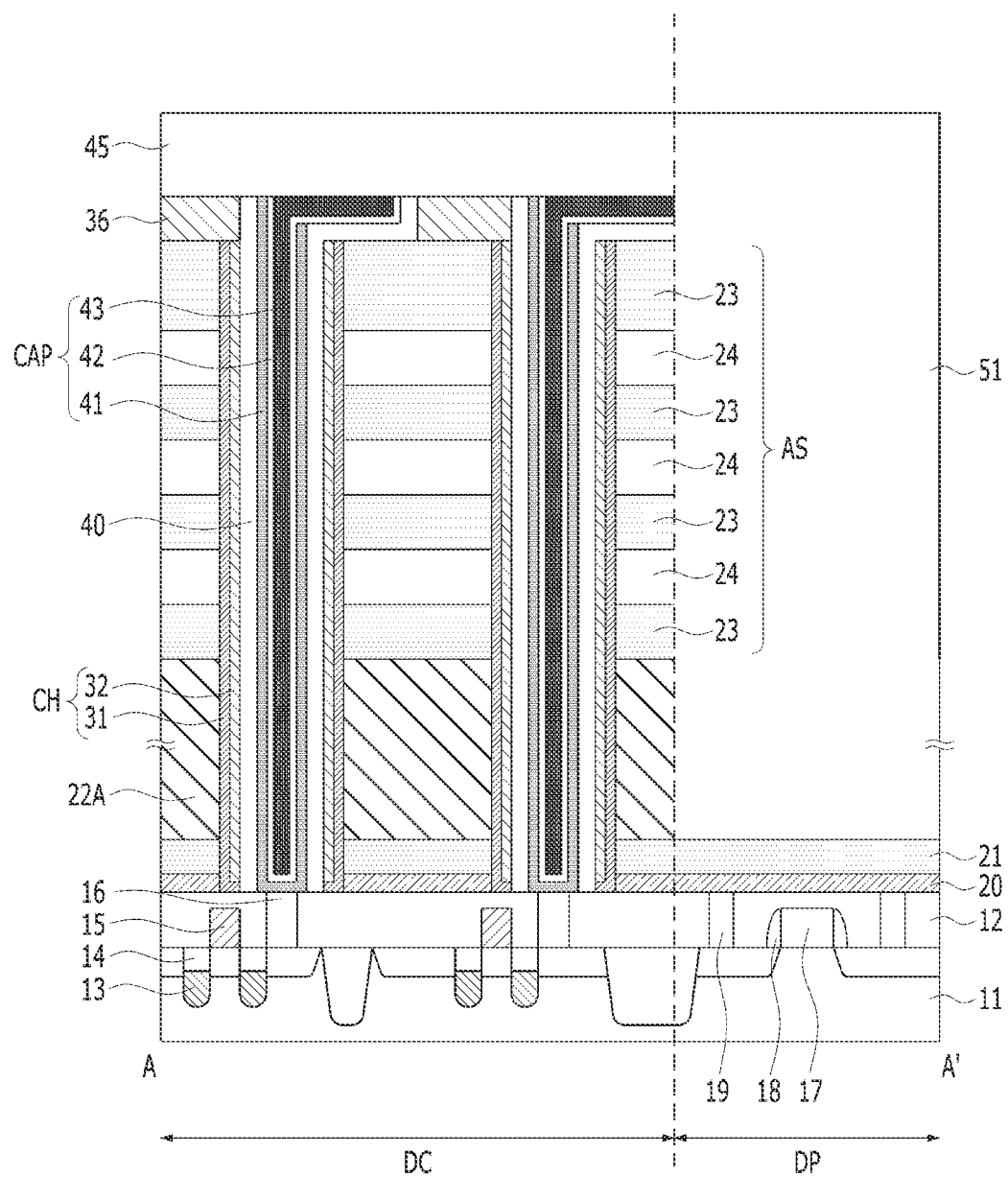

As shown in FIGS. 25A and 25B, a third capping layer 51 filling the fourth opening 50 in the peripheral circuit region DP may be formed. After forming a capping material to form the third capping layer 51, a planarization process may be performed, An upper surface of the third capping layer 51 may be at the same level as an upper surface of the second capping layer 45. A thickness of the third capping layer 51 may be larger than that of the second capping layer 45. The third capping layer 51 may include oxide, nitride, or a combination thereof. The third capping layer 51 may include silicon oxide, silicon nitride, silicon oxynitride, or a combination thereof. In the embodiment of the present invention, the third capping layer 51 may include silicon oxide.

Figure 26A:
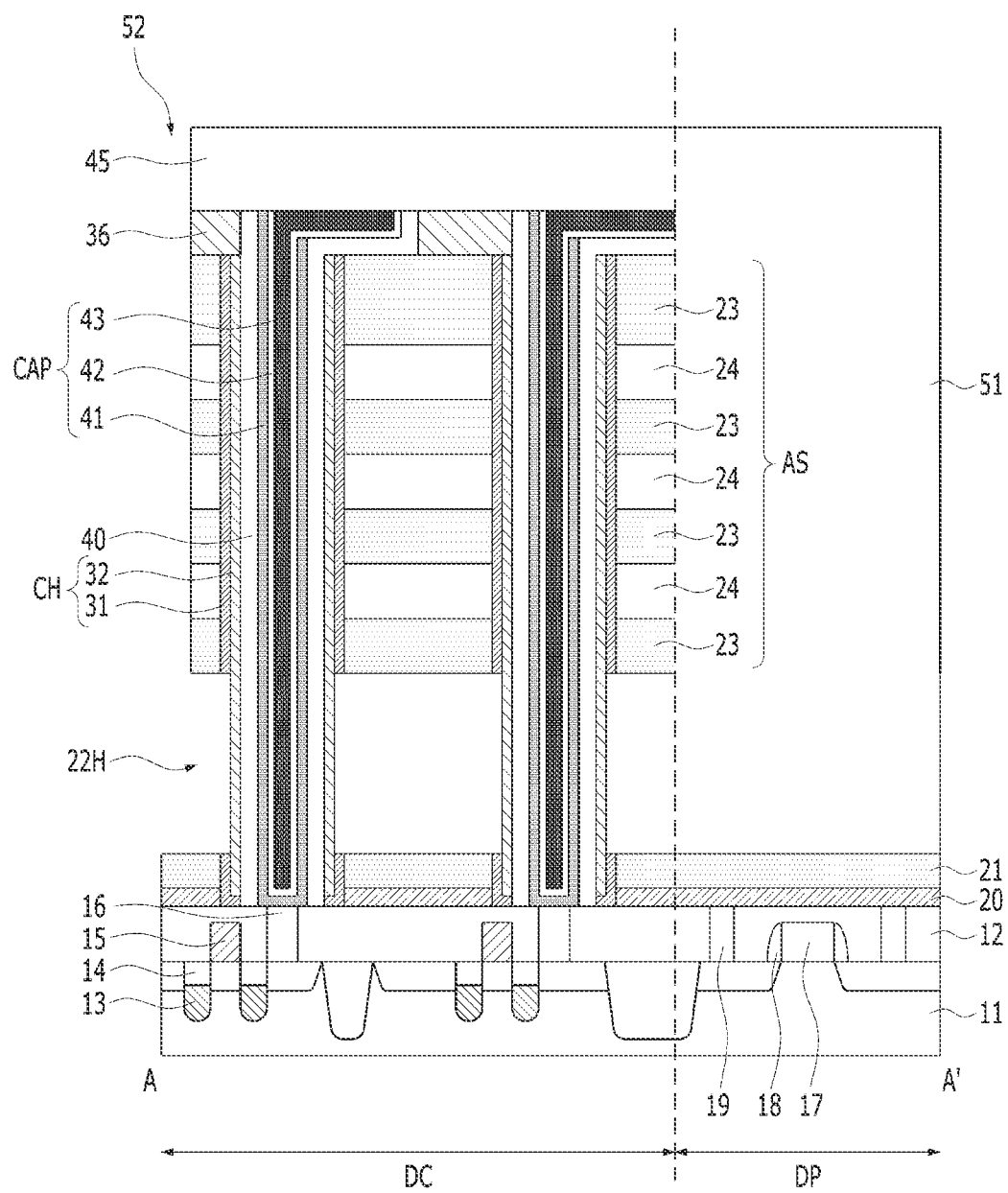
Figure 26B:
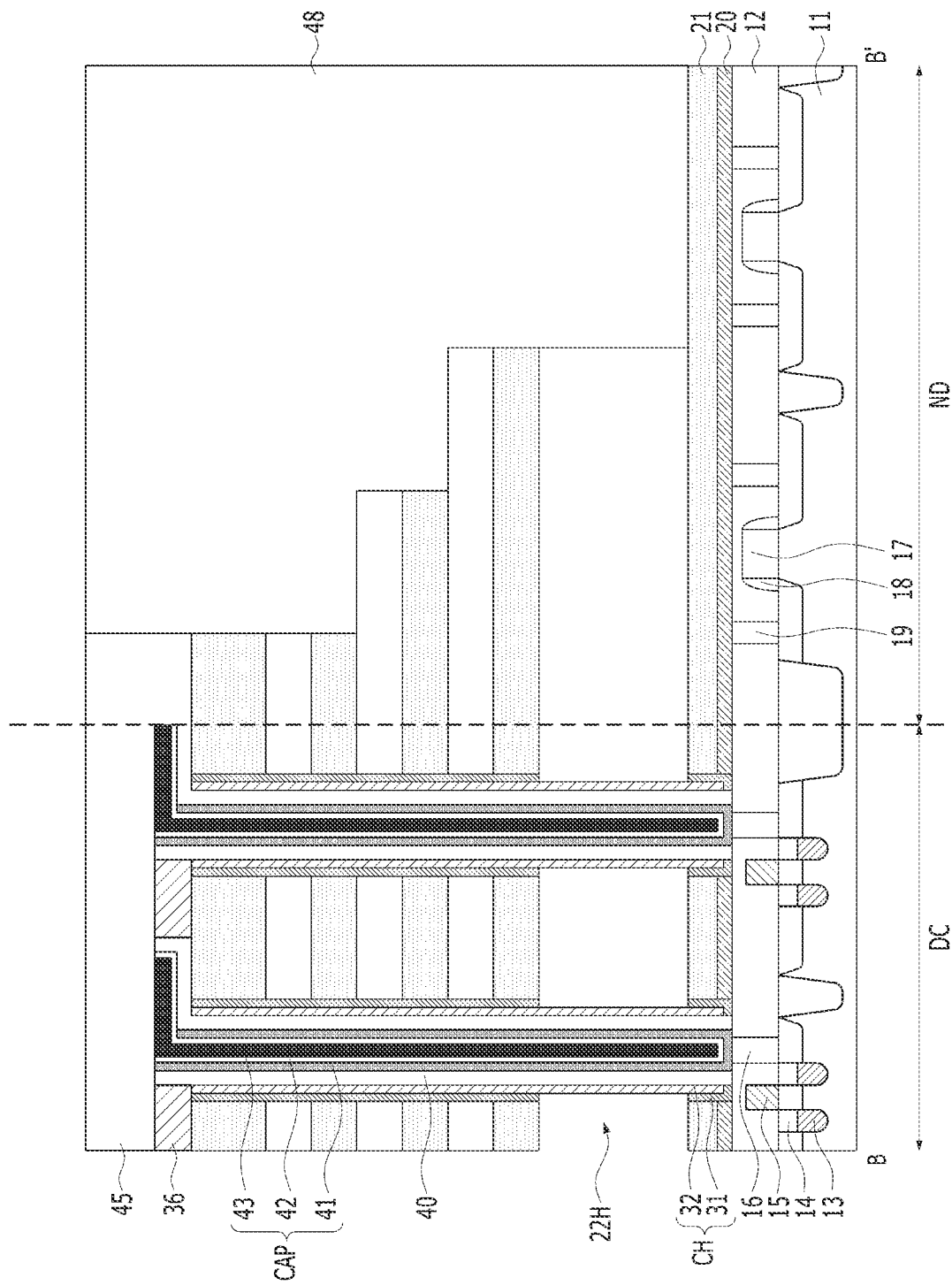

As shown in FIGS. 26A and 26B, a slit 52 may be formed spaced apart from the channel structure CH in the cell region DC. The slit 52 may include a component corresponding to the slit SLIT of FIG. 1. The slit 52 may have a line shape as shown in FIG. 1. A fifth mask (not shown) may be used to form the slit 52. The second capping layer 45 and the alternating stack AS in the cell region DC may be etched using the fifth mask (not shown) as an etching mask. The fifth mask (not shown) may be removed after forming the slit 52. As the slit 52 is formed, a sidewall of the alternating stack AS in the cell region DC may be exposed.

Subsequently, the preliminary source layer 22A in the cell region DC and the deck region ND may be removed. As the preliminary source layer 22A is removed, a sidewall of the memory layer 31 may be partially exposed. Subsequently, the memory layer 31 exposed by the preliminary source layer 22A may be removed. A source opening 22H may be formed in a region in which a part of the memory layer 31 and the preliminary source layer 22A are removed. A sidewall of the channel layer 32 may be partially exposed by the source opening 22H. An upper surface of the first capping layer 21 may be exposed by the source opening 22H. A bottom surface of the insulation layers 23 at the lowest level may be exposed by the source opening 22H.

Figure 27A:
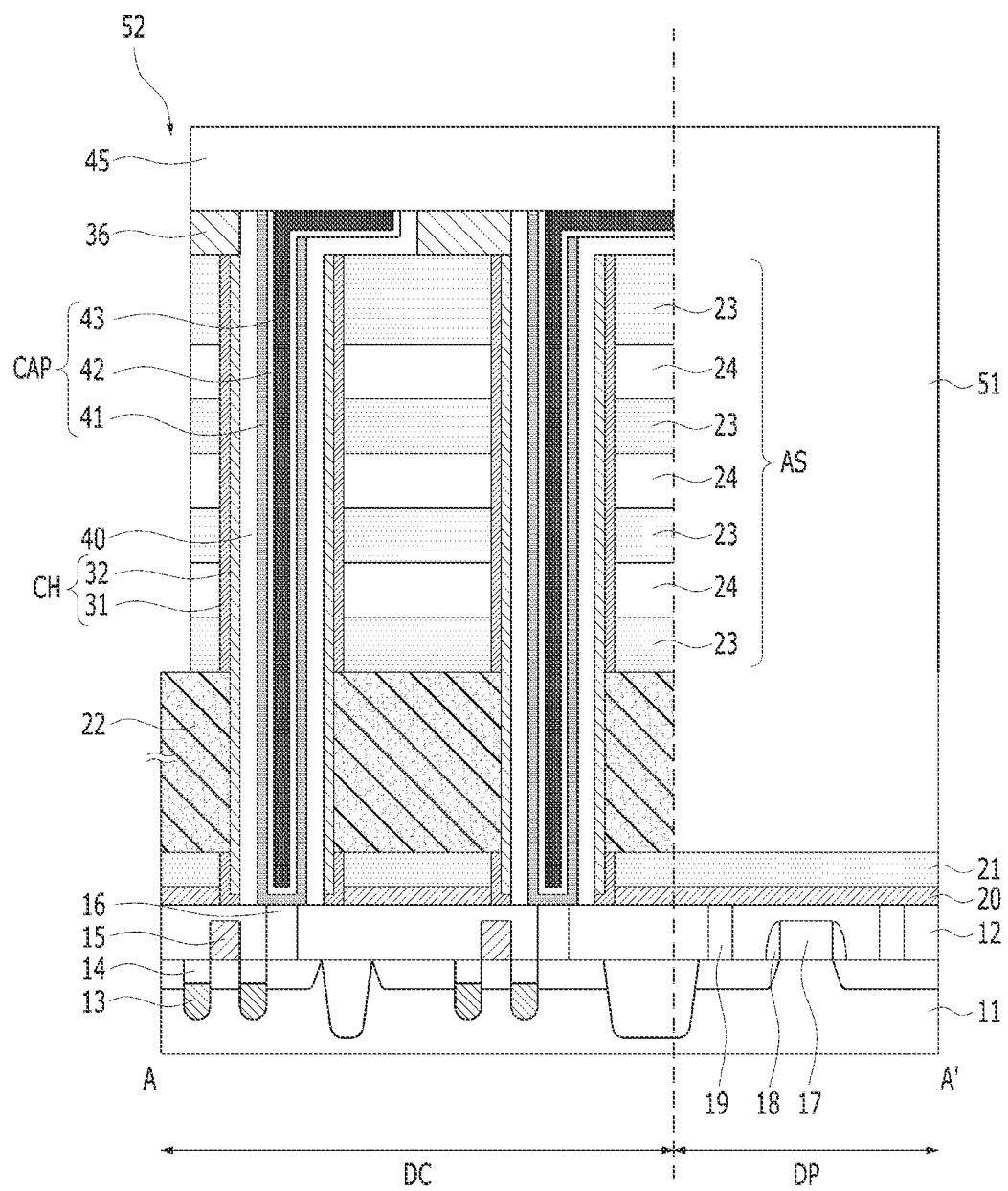
Figure 27B:
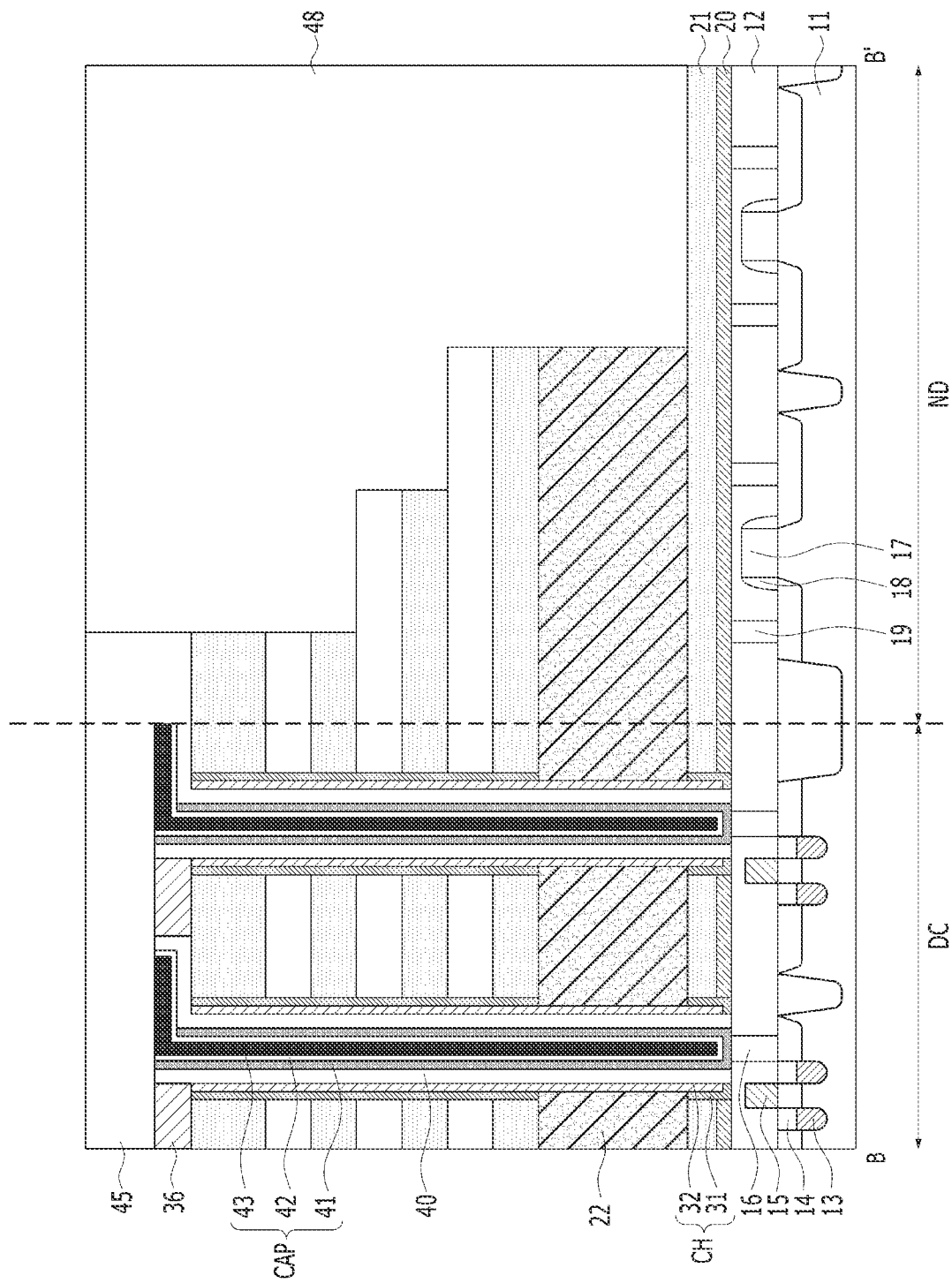

As shown in FIGS. 27A and 27B, the source opening 22H may be filled with the source layer 22. The source layer 22 may be filled by the slit 52. As the source layer 22 is formed, the channel layer 32 exposed by the source opening 22H may be covered. The source layer 22 may include a silicon-containing material. The source layer 22 may include polysilicon. The source layer 22 may include polysilicon doped with impurities.

Figure 28A:
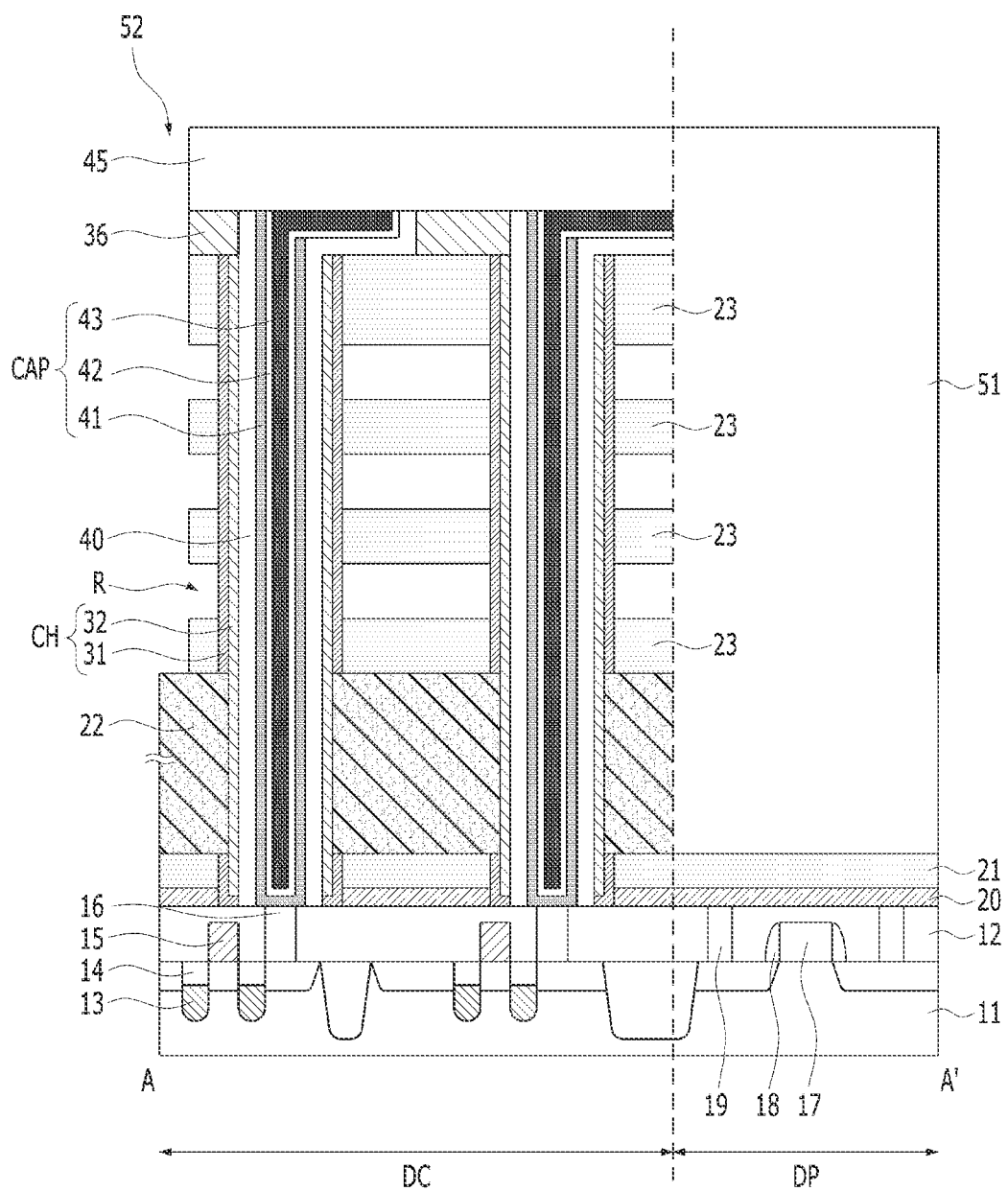
Figure 28B:
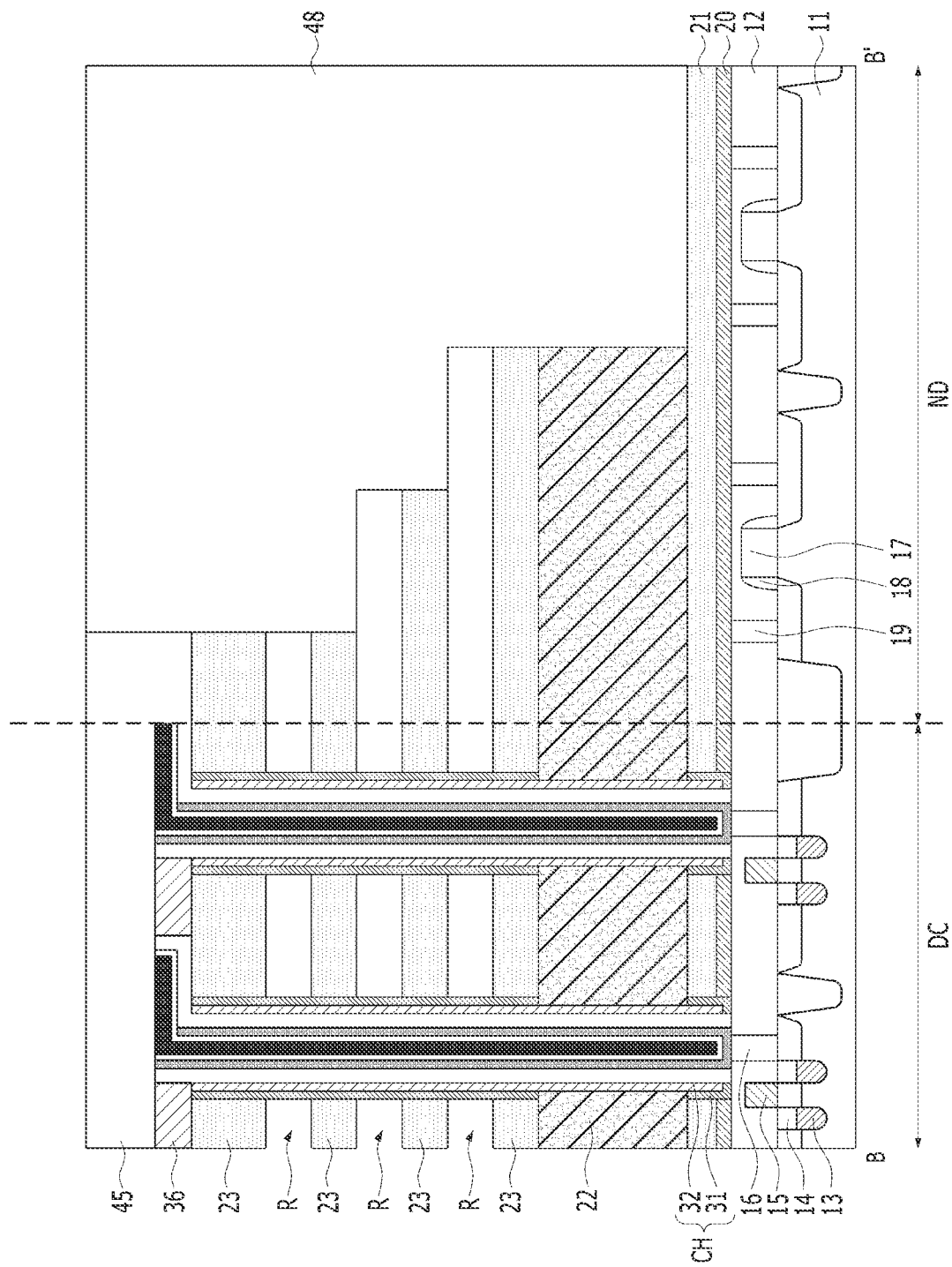

As shown in FIGS. 28A and 28B, the sacrificial layers 24 may be removed from the alternating stack AS exposed through the slit 52. In this case, only the sacrificial layers 24 may be selectively removed using etch selectivities of the sacrificial layers 24 and the insulation layers 23. Accordingly, a plurality of recesses R may be formed between the insulation layers 23. Wet etching may be used to form the recesses R.

Figure 29A:
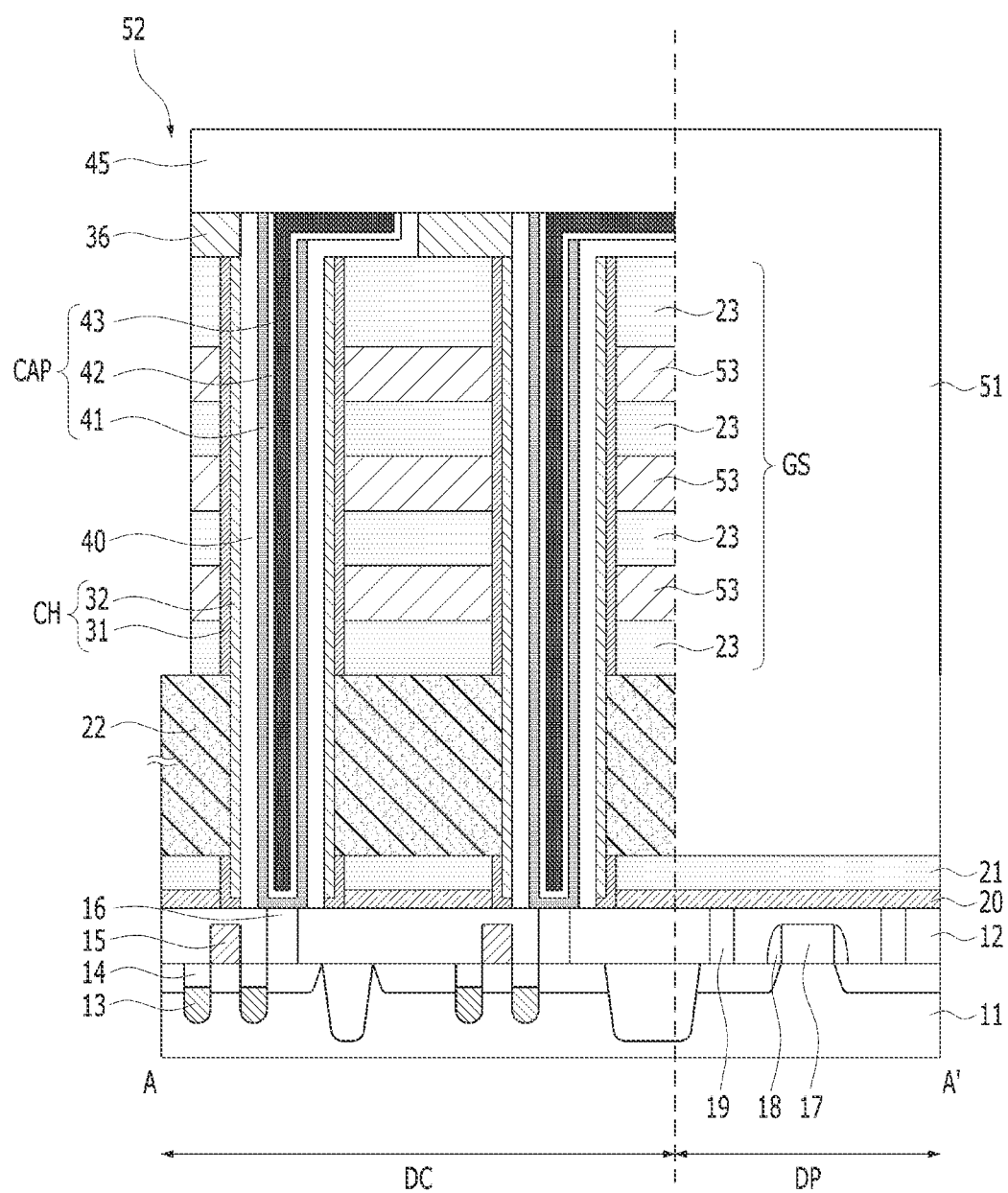
Figure 29B:
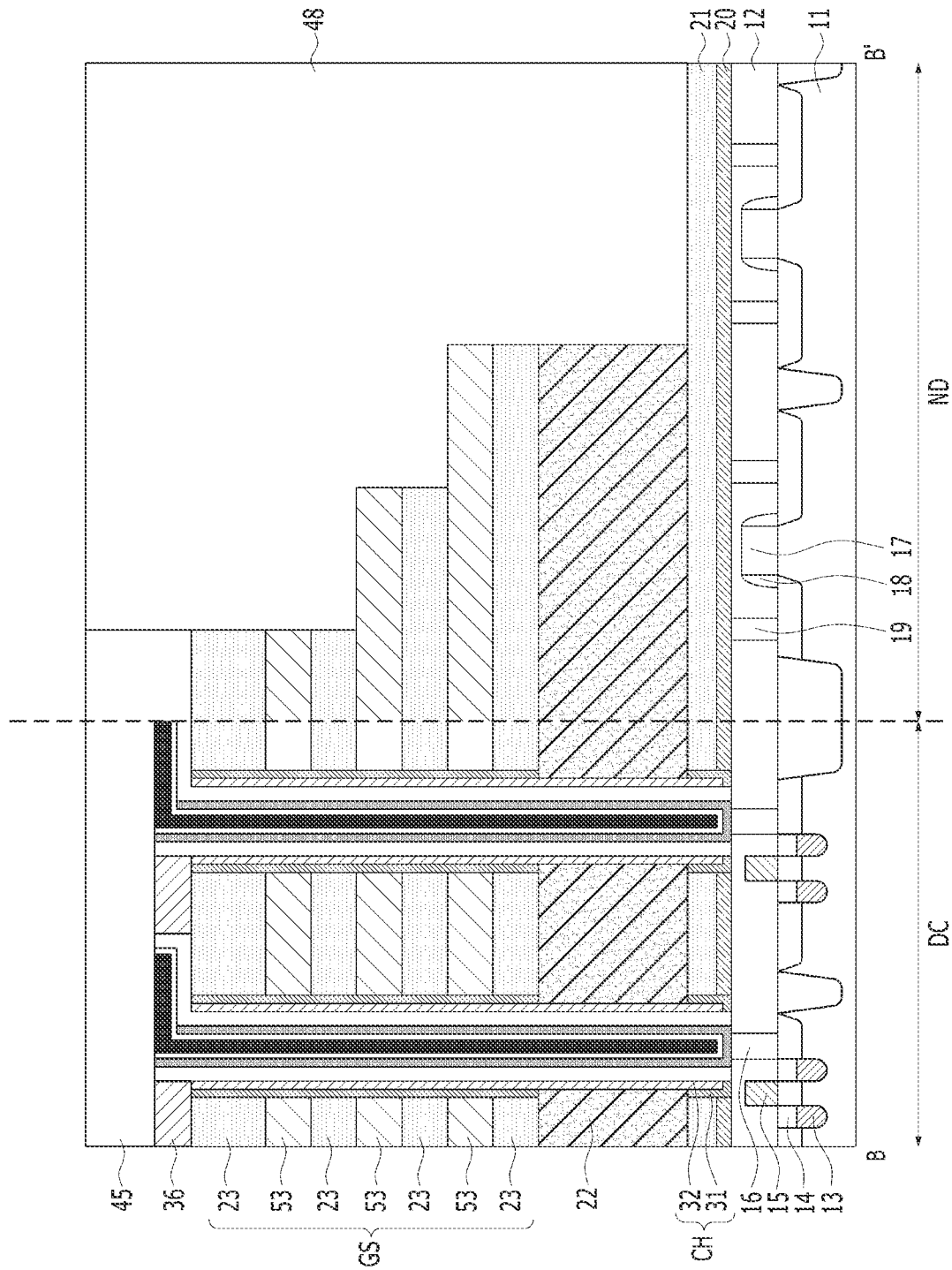

As shown in FIGS. 29A and 29B, the recesses R may be filled with horizontal word lines 53. Each of the insulation layers 23 and each of the horizontal word lines 53 may be alternately stacked. Accordingly, IS the horizontal gate structure GS may be formed. Each of the insulation layers 23 and each of the horizontal word lines 53 may be stacked multiple times. The insulation layers 23 and the horizontal word lines 53 may be vertically arranged on the substrate 11. In the horizontal gate structure GS, each of the insulation layers 23 and each of the horizontal word lines 53 may be alternately stacked at least three times or more. Each of the insulation layers 23 may electrically insulate each of the horizontal word lines 53.

The horizontal word lines 53 may include a metal, metal nitride, metal carbide, metal silicide, or a combination thereof. The horizontal word lines 53 may include tungsten (W), titanium (Ti), copper (Cu), tungsten nitride, titanium nitride, tantalum nitride, tungsten carbide, titanium carbide, tungsten silicide, titanium silicide, tantalum silicide, or a combination thereof.

In another embodiment of the present invention, a barrier layer may be further formed along an inner wall of the recesses R before filling the horizontal word lines 53 in the recesses R. The barrier layer may be conformally formed on the inner wall exposed by each recess R. The barrier layer may include a metal or a metal compound. The barrier layer may include titanium nitride (TiN). Interfacial characteristics may be improved by forming the barrier layer.

Figure 30A:
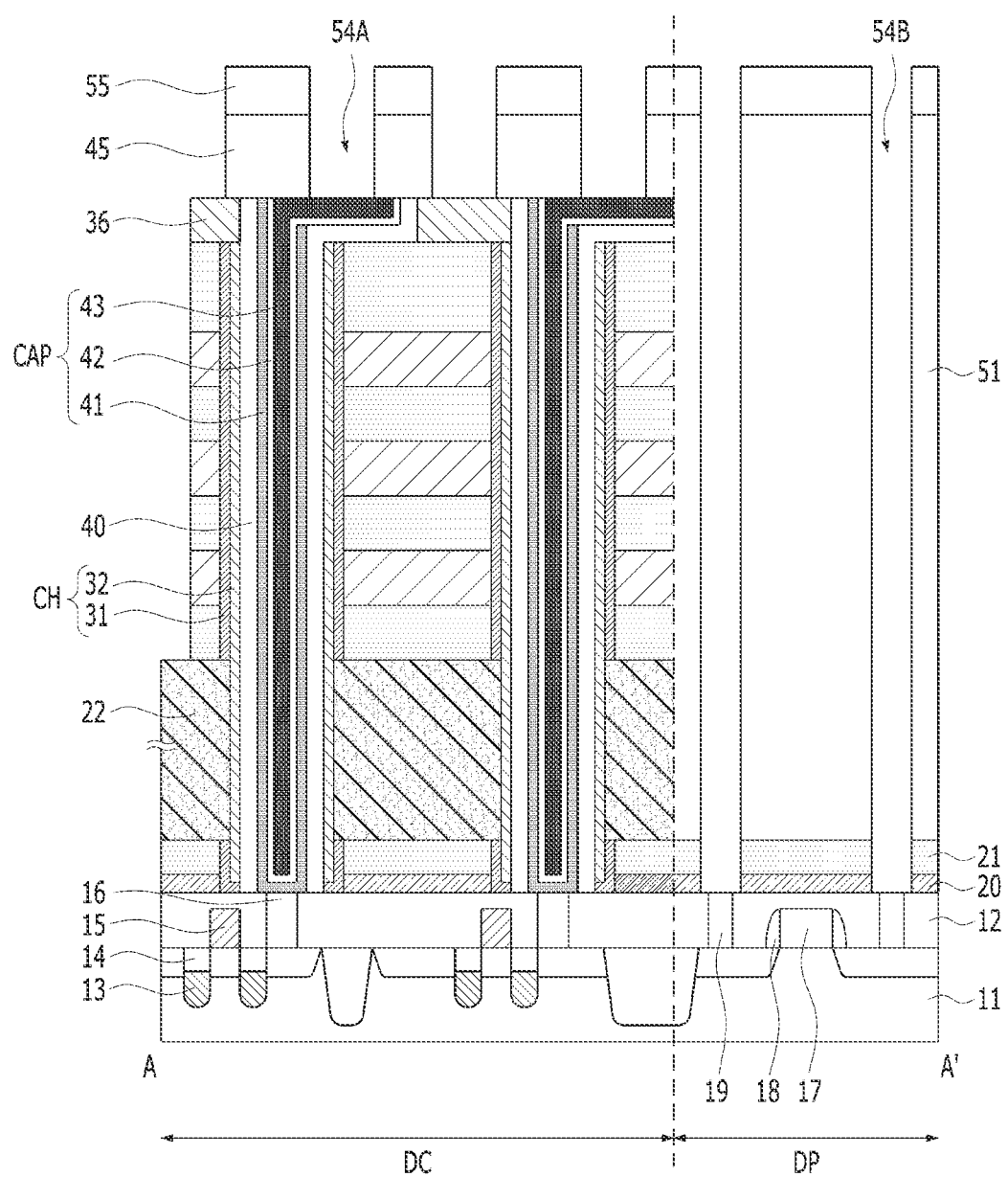
Figure 30B:
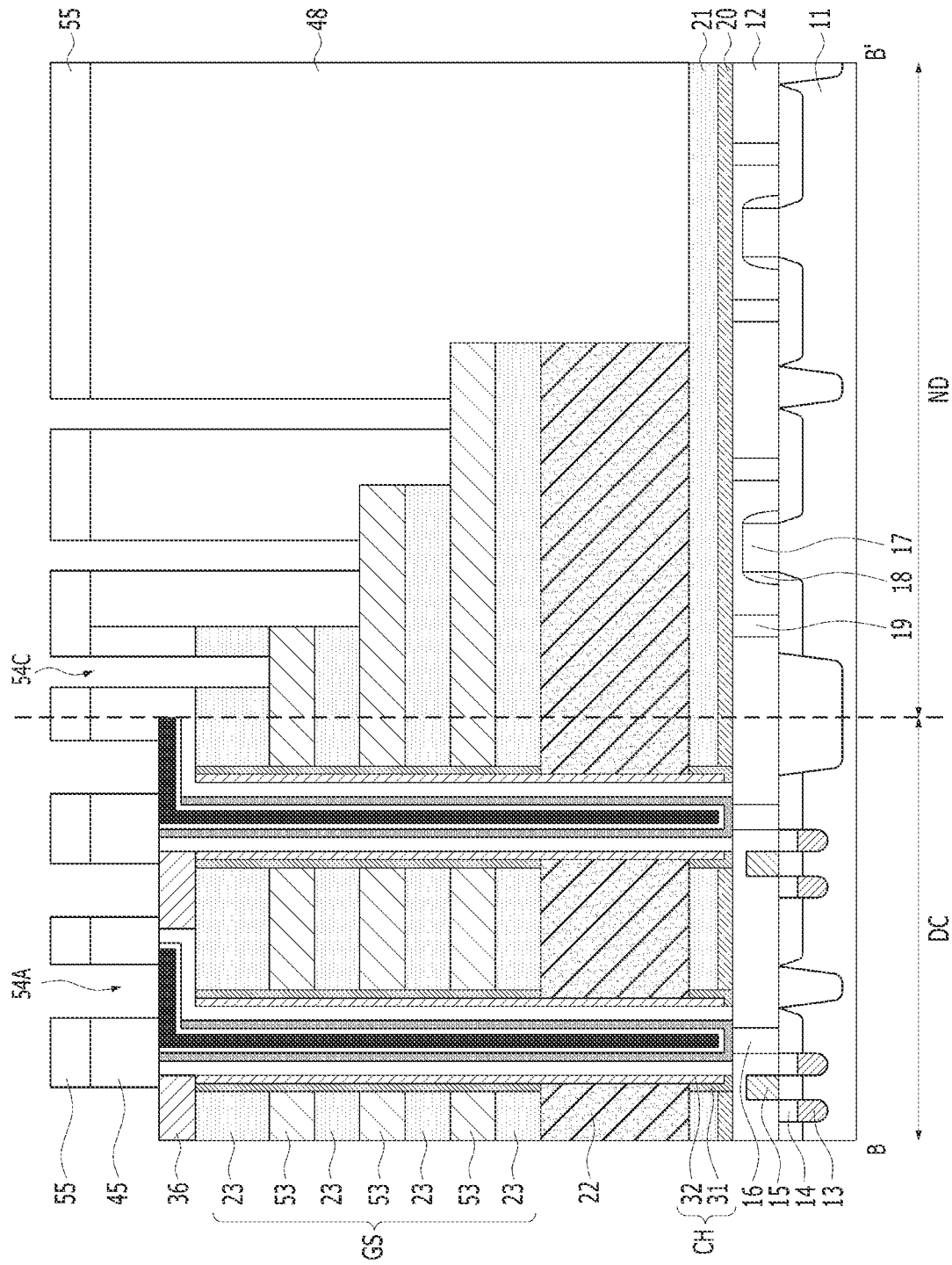

As shown in FIGS. 30A and 30B, the second capping layer 45, the third capping layer 51, and the fourth capping layer 48 may be etched using a sixth mask 55 as an etching mask. Accordingly, a fifth opening 54A penetrating through the second capping layer 45 may be formed. A sixth opening 546 penetrating through the third capping layer 51 may be formed. A seventh opening 54C penetrating through the fourth capping layer 48 may be formed. Each of the fifth opening 54A, the sixth opening 546, and the seventh opening 54C may be formed separately. In another embodiment of the present invention, the fifth opening 54A, the sixth opening 546, and the seventh opening 54C may be formed simultaneously.

Upper surfaces of the semiconductor layer 36 and the plate node 43 in the cell region DC may be exposed by the fifth opening 54A. The contact plug 19 in the peripheral circuit region DP may be exposed by the sixth opening 54B. An upper surface of the horizontal word lines 53 may be partially exposed by the seventh opening 54C.

The sixth mask 55 may be removed after forming the fifth opening 54A, the sixth opening 54B, and the seventh opening 54C.

Figure 31A:
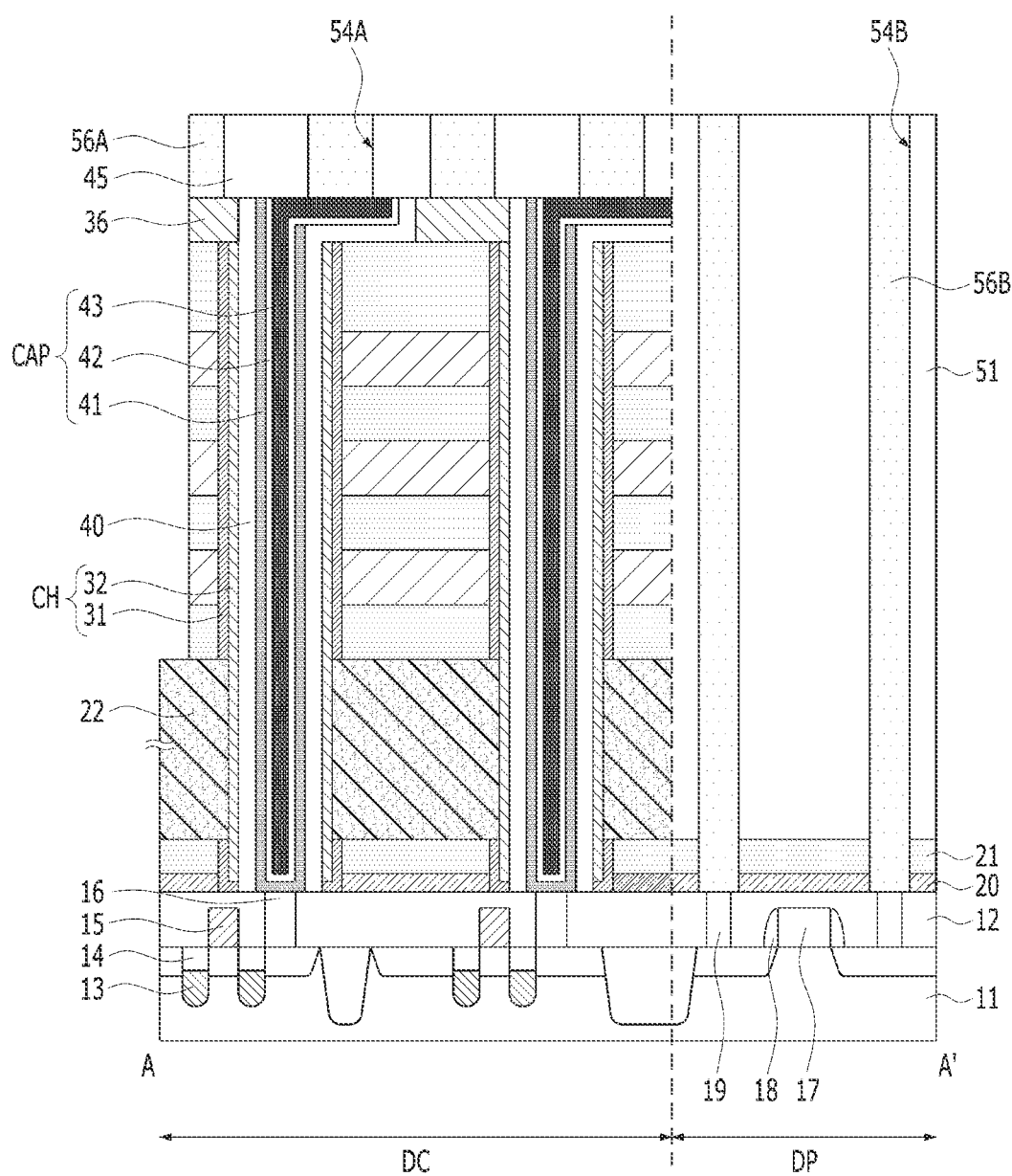
Figure 31B:
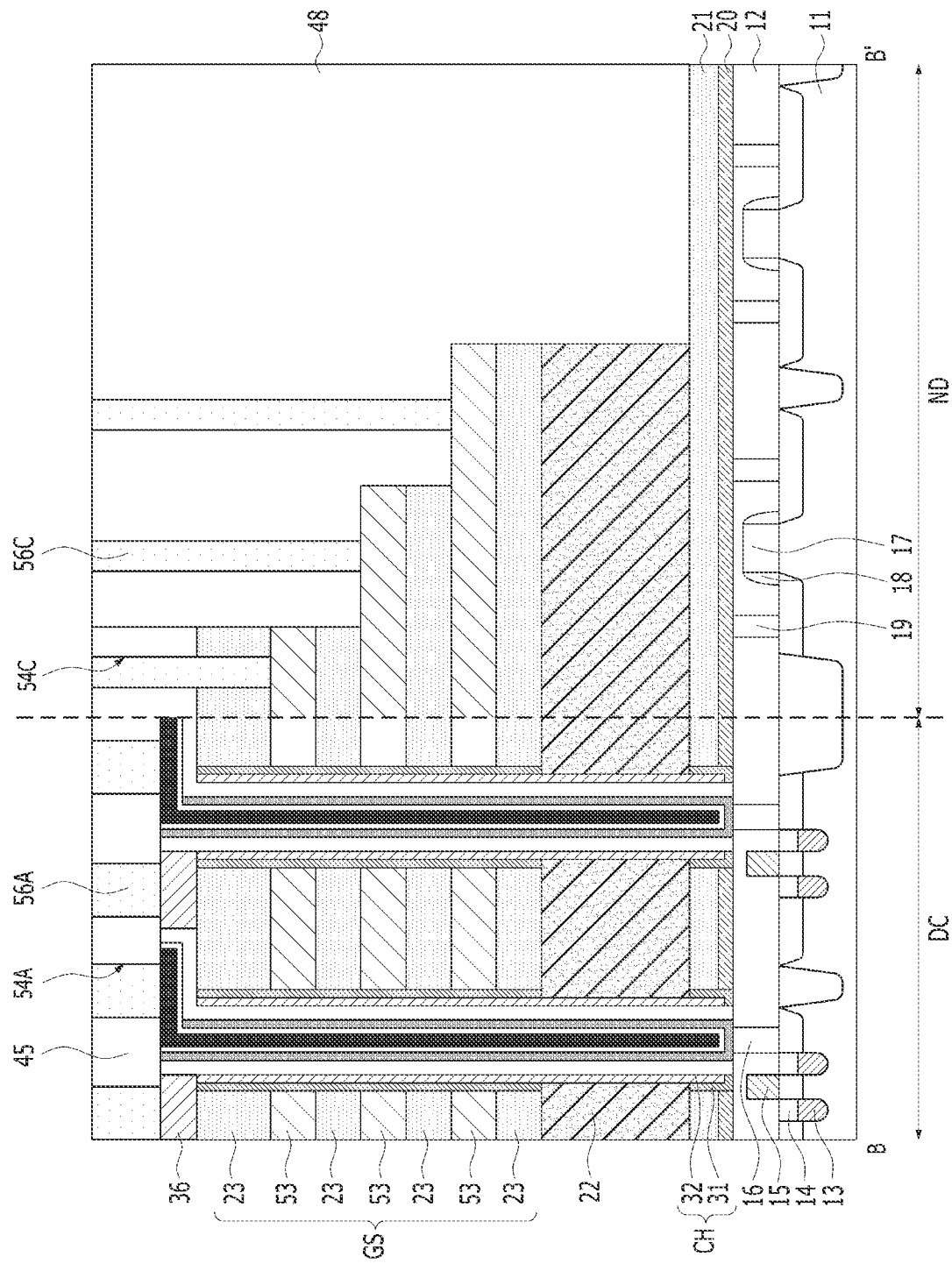

Referring to FIGS. 31A and 31B, the fifth opening 54A, the sixth opening 5413, and the seventh opening 54C may be filled with a metal material, Accordingly, a first metal plug 56A filling the fifth opening 54A, a second metal plug 5613 filling the sixth opening 54B, and a third metal plug 56C filling the seventh opening 54C may be formed. Each of the first metal plug 56A, the second metal plug 56B, and the third metal plug 56C may be formed separately. In another embodiment of the present invention, the first metal plug 56A, the second metal plug 56B, and the third metal plug 56C may be formed simultaneously.

Upper surfaces of the first metal plug 56A, the second metal plug 56B, and the third metal plug 56C may be at the same level. An upper surface of the first metal plug 56A may be at the same level as an upper surface of the second capping layer 45. An upper surface of the second metal plug 56B may be at the same level as an upper surface of the third capping layer 51. An upper surface of the third metal plug 56C may be at the same level as an upper surface of the fourth capping layer 48.

The first metal plug 56A, the second metal plug 56B, and the third metal plug 56C may include the same material. The first metal plug 56A, the second metal plug 56B, and the third metal plug 56C may include a metal material or a metal compound, The first metal plug 56A, the second metal plug 56B, and the third metal plug 56C may include a tungsten-containing material, The first metal plug 56A, the second metal plug 56B, and the third metal plug 56C may include tungsten or a tungsten compound. The first metal plug 56A, the second metal plug 56B, and the third metal plug 56C may be formed by various methods such as chemical vapor deposition (CVD), physical vapor deposition (PVD), atomic layer deposition (ALD), plasma enhanced CVD (PECVD), or plasma enhanced ALD (PEALD).

An embodiment of the present invention may include a hybrid memory including both a volatile memory and a non-volatile memory. That is, the hybrid memory cell in which a non-volatile memory and a volatile memory are combined may be formed on a single substrate 11. A volatile memory may include the substrate 11, the interlayer insulation layer 12, and the capacitor CAP in the cell region DC and the peripheral circuit region DR The non-volatile memory may include the source layer 22, the horizontal gate structure GS, and the channel structure CH. Accordingly, the hybrid memory cell in which the volatile memory is embedded in the non-volatile memory may be formed on the substrate 11.

According to an embodiment of the present invention, a width and a height of the first opening 30 may be secured to be large by forming the first opening 30 penetrating through the alternating stack AS after forming the alternating stack AS in which the insulation layers 23 and the sacrificial layers 24 are stacked multiple times on a substrate on which the contact plug 16 is formed.

As a width of the first opening 30 is secured, the channel structure CH surrounding an inner-sidewall of the first opening 30 may be formed to provide a non-volatile memory. At the same time, a volatile memory may be provided by forming the capacitor CAP filling the first opening 30 on a sidewall of the channel structure CH. Since the capacitor CAP surrounded by the channel structure CH of the volatile memory is formed, a separate space for forming the capacitor CAP may be omitted. Accordingly, manufacturing cost of the semiconductor device may be reduced, and resistance of the semiconductor device may be reduced, thereby improving operation speed.

In addition, as a height of the first opening 30 is secured, a capacitor having a high aspect ratio may be provided. Accordingly, a sensing margin of a non-volatile memory may be secured.

The above-described invention is not limited by the embodiments described or figures included herein. In view of the present invention, other additions, subtractions, or modifications are apparent to a person of ordinary skill in the art and are intended to fall within the scope of the appended claims.

What is claimed is:

1. A hybrid memory, comprising:
a substrate;
a non-volatile memory including a source line over the substrate and an alternating stack in which a plurality of insulation layers and a plurality of horizontal word lines are alternately stacked over the source line;
an opening penetrating through the alternating stack and the source line;
a volatile memory including a capacitor, the capacitor penetrating through the alternating stack,
wherein the volatile memory further includes a buried word line formed inside the substrate, a bit line disposed on the substrate,
wherein the buried word line and the bit line disposed at a lower level than the capacitor,
wherein the non-volatile memory further including a vertical channel structure penetrating through the alternating stack and the source line,
wherein the vertical channel structure comprises a channel layer penetrating through the alternating stack and the source line, and a portion of the channel layer is surrounded by the source line,
wherein the capacitor and the vertical channel structure are disposed within the opening,
wherein an outer wall of the capacitor is spaced apart from an inner wall of the opening, and
wherein the vertical channel structure covers a portion of a bottom surface of the opening.

2. The hybrid memory of claim 1,
wherein the capacitor is surrounded by the vertical channel structure.

3. The hybrid memory of claim 1, wherein the vertical channel structure further includes a memory layer surrounding the channel layer.

4. The hybrid memory of claim 1, wherein the capacitor includes a storage node penetrating the alternating stack, a dielectric layer on the storage node, and a plate node on the dielectric layer.

5. The hybrid memory of claim 1,
wherein the volatile memory further includes a storage node contact plug connected to the substrate, and
wherein the capacitor is electrically connected to the storage node contact plug.

6. The hybrid memory of claim 1, further comprising a separation layer disposed between the non-volatile memory and the volatile memory.

7. A hybrid memory comprising:
a substrate including a cell region and a peripheral circuit region;
a NAND memory cell string including a source line over the substrate in the cell region, a plurality of horizontal word lines arranged vertically over the source line and a vertical channel structure penetrating through the source line and the plurality of horizontal word lines;
an opening penetrating through the source line and the plurality of horizontal word lines;
a DRAM memory cell including a capacitor penetrating through an inside of the vertical channel structure,
wherein the DRAM memory further includes a buried word line formed inside the substrate, a bit line disposed on the substrate, and
wherein the buried word line and the bit line disposed at a lower level than the capacitor,
wherein the vertical channel structure comprises a channel layer penetrating through the alternating stack and the source line, and a portion of the channel layer is surrounded by the source line,
wherein the capacitor and the vertical channel structure are disposed within the opening,
wherein an outer wall of the capacitor is spaced apart from an inner wall of the opening, and
wherein the vertical channel structure covers a portion of a bottom surface of the opening.

8. The hybrid memory of claim 7, wherein the capacitor includes a storage node covering the vertical channel structure, a dielectric layer on the storage node, and a plate node on the dielectric layer.

9. The hybrid memory of claim 8, wherein each of the storage node and the plate node includes cobalt (Co), titanium (Ti), nickel (Ni), tungsten (W), molybdenum (Mo), platinum (Pt), ruthenium (Ru), Iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN), or a combination thereof.

10. The hybrid memory of claim 8, wherein the dielectric layer includes zirconium oxide, aluminum oxide, hafnium oxide, or a combination thereof.

11. The hybrid memory of claim 7, wherein the horizontal word lines include titanium nitride (TiN), tungsten (W), or a combination thereof.

12. The hybrid memory of claim 7, wherein the vertical channel structure includes the channel layer surrounding the capacitor and a memory layer surrounding the channel layer.

13. The hybrid memory of claim 12, wherein the memory layer includes a multilayer structure, each layer of the memory layer formed of a different material.

14. The hybrid memory of claim 12, wherein the memory layer is formed of an oxide-nitride-oxide (ONO structure).

15. The hybrid memory of claim 12, wherein the channel layer includes a silicon containing material.

16. The hybrid memory of claim 7, further comprising a separation layer disposed between the vertical channel structure and the capacitor.

17. The hybrid memory of claim 16, wherein the separation layer includes oxide.

18. The hybrid memory of claim 7, wherein the cell region further comprises an alternating stack in which a plurality of slits and a plurality of insulation layers are alternately arranged.

19. The hybrid memory of claim 18,
wherein the peripheral circuit region includes a first control circuit including a decoder and a page buffer for controlling the NAND memory cell string and a second control circuit including a sense amplifier, a sub word line driver, and a sub hole circuit for controlling the DRAM memory cell, and
wherein the sense amplifier and the sub hole circuit are disposed below the slits and the sub word line driver is disposed below the alternating stack.

20. A method for fabricating a hybrid memory, the method comprising:
forming a source line over a substrate including a lower structure;
forming an alternating stack including a plurality of oxide layers and a plurality of nitride layers alternately stacked over the source line;
forming an opening penetrating through the alternating stack and the source line to expose the substrate;
forming a channel structure surrounding an inner-sidewall of the opening;
forming a capacitor surrounded by the channel structure,
wherein the lower structure further includes a buried word line formed inside the substrate, a bit line disposed on the substrate, and
wherein the buried word line and the bit line disposed at a lower level than the capacitor,
wherein the channel structure comprises a channel layer penetrating through the alternating stack and the source line, and a portion of the channel layer is surrounded by the source line,
wherein the capacitor and the vertical channel structure are disposed within the opening,
wherein an outer wall of the capacitor is spaced apart from an inner wall of the opening, and
wherein the vertical channel structure covers a portion of a bottom surface of the opening.

21. The method according to claim 20, wherein the forming of the capacitor includes:
forming a storage node covering a sidewall of the channel structure and an exposed portion of the lower structure in the opening;
forming a dielectric layer on the storage node; and
forming a plate node on the dielectric layer to fill the opening.

22. The method according to claim 20, wherein the forming of the channel structure includes:
forming a memory layer on a sidewall and a bottom surface of the opening;
forming the channel layer on the memory layer;
forming a channel sacrificial layer on the channel layer, the channel sacrificial layer filling the opening;
exposing the lower structure by removing the channel sacrificial layer and by removing bottom surfaces of the memory layer and the channel layer.

23. The method according to claim 22, wherein the memory layer includes a multilayer, each layer of the multilayer formed of a different material.

24. The method according to claim 22, wherein the memory layer includes a three-layer structure of an oxide-nitride-oxide (ONO structure).

25. The method according to claim 22, wherein the channel layer includes a silicon-containing material.

26. The method according to claim 20, further comprising before the forming the capacitor, forming a separation layer that is surrounded by the channel structure, the separation layer not covering the lower structure.

27. The method according to claim 26, wherein the separation layer includes oxide.

* * * * *